United States Patent [19]
Prokin

[11] Patent Number: 5,198,750
[45] Date of Patent: Mar. 30, 1993

[54] EXTREMELY WIDE RANGE FREQUENCY MEASUREMENT METHOD

[76] Inventor: Milan Prokin, Dr. Agostina Neta 76/64, 11070 Belgrade, Yugoslavia

[21] Appl. No.: 875,972

[22] Filed: Apr. 29, 1992

Related U.S. Application Data

[63] Continuation-in-part of Ser. No. 654,224, Feb. 12, 1991, abandoned.

[30] Foreign Application Priority Data

Feb. 12, 1990 [YU] Yugoslavia ............................ 269/90

[51] Int. Cl.$^5$ ............................................ G01R 23/02
[52] U.S. Cl. ............................ 324/76.47; 324/76.55; 324/76.42; 324/76.48; 364/569; 364/484
[58] Field of Search ................ 395/550; 364/484, 486, 364/569; 324/78 D, 79 D, 166; 377/39, 19, 52

[56] References Cited

U.S. PATENT DOCUMENTS

| | | | |
|---|---|---|---|
| 4,939,659 | 7/1990 | Moran | 364/569 |
| 4,977,525 | 12/1990 | Blackwell | 364/569 |
| 4,982,350 | 1/1991 | Perna | 364/569 |
| 5,012,435 | 4/1991 | Bailey | 364/569 |
| 5,075,878 | 12/1991 | Ohtomo | 364/569 |
| 5,081,297 | 1/1992 | Lebel | 364/569 |
| 5,107,439 | 4/1992 | Clark | 364/569 |

Primary Examiner—Kenneth A. Wieder
Assistant Examiner—Jose M. Solis
Attorney, Agent, or Firm—Abelman Frayne & Schwab

[57] ABSTRACT

This invention discloses a digital frequency measurement system, providing high accuracy and a fast dynamic response over an extremely wide frequency range. This measurement system provides for double buffering of pulse count and pulse period, so that data information change during transfer of this information to the software interrupt routine cannot happen. At each rising and/or falling edge of the measured signal a content of the interval timer is stored into the timer storage device and a content of the pulse counter is changed (incremented or decremented). Each time an interrupt request is generated, a content of the timer storage device is stored into the additional storage device, and a content of the pulse counter is stored into the counter storage device. On the basis of the difference between contents of the additional storage device in the current and the previous interrupt routine, and on the basis of the difference between contents of the counter storag device in the current and the previous interrupt routine, a measured frequency is calculated.

16 Claims, 46 Drawing Sheets

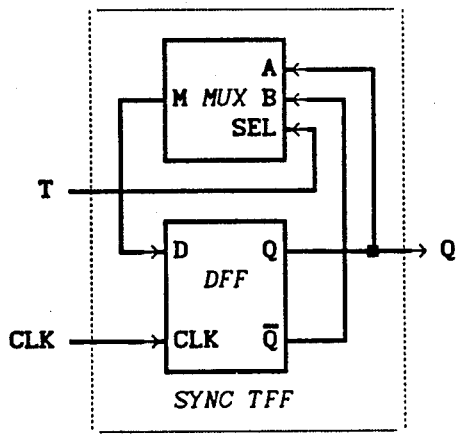
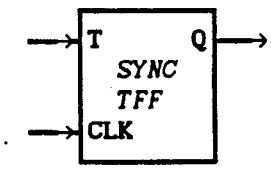
FIG.13A  FIG.13B
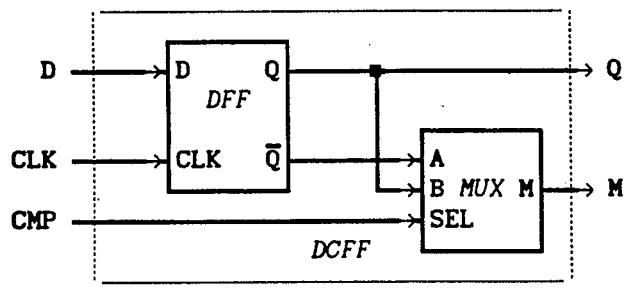
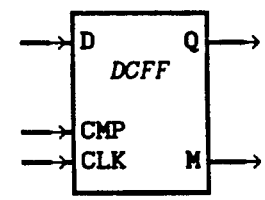
FIG.14A  FIG.14B
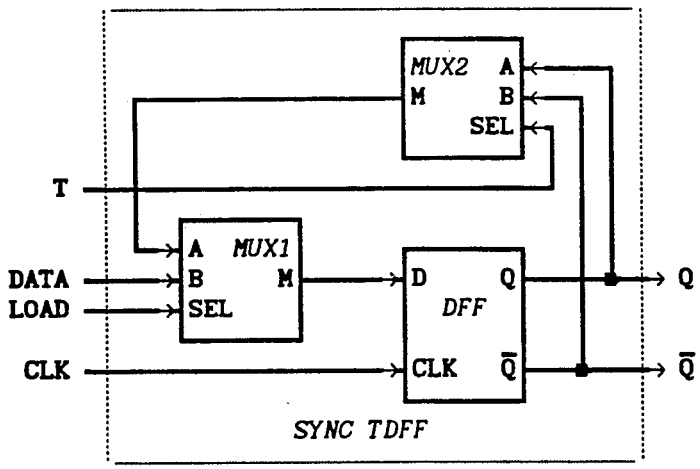
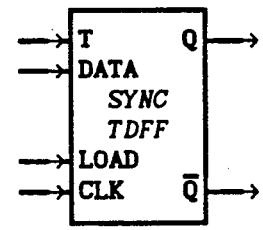
FIG.15A  FIG.15B

| STATE | INPUTS | | | | SIGNAL DECODER MODE | | | | | | | |
|---|---|---|---|---|---|---|---|---|---|---|---|---|
| | | | | | I | | II | | III | | IV | |
| | DA | QA | DB | QB | ENP | U/$\overline{D}$ | ENP | U/$\overline{D}$ | ENP | U/$\overline{D}$ | ENP | U/$\overline{D}$ |
| 0 | 0 | 0 | 0 | 0 | 0 | 0 | 0 | 0 | 0 | 0 | 0 | 0 |
| 1 | 0 | 0 | 0 | 1 | 0 | 0 | 0 | 0 | MULT | 0 | MULT | 1 |
| 2 | 0 | 0 | 1 | 0 | 0 | 0 | 0 | 1 | 1 | 0 | 1 | 0 |
| 3 | 0 | 0 | 1 | 1 | 0 | 0 | 0 | 1 | 0 | 0 | 0 | 1 |
| 4 | 0 | 1 | 0 | 0 | MULT | 0 | MULT | 0 | MULT | 1 | MULT | 0 |
| 5 | 0 | 1 | 0 | 1 | 0 | 0 | 0 | 0 | 0 | 1 | 0 | 1 |
| 6 | 0 | 1 | 1 | 0 | 0 | 0 | 0 | 1 | 0 | 1 | 0 | 0 |
| 7 | 0 | 1 | 1 | 1 | MULT | 0 | MULT | 1 | MULT | 1 | MULT | 1 |
| 8 | 1 | 0 | 0 | 0 | 1 | 0 | 1 | 0 | 1 | 1 | 1 | 1 |
| 9 | 1 | 0 | 0 | 1 | 0 | 0 | 0 | 0 | 0 | 1 | 0 | 0 |
| 10 | 1 | 0 | 1 | 0 | 0 | 0 | 0 | 1 | 0 | 1 | 0 | 1 |
| 11 | 1 | 0 | 1 | 1 | 1 | 0 | 1 | 1 | 1 | 1 | 1 | 0 |
| 12 | 1 | 1 | 0 | 0 | 0 | 0 | 0 | 0 | 0 | 0 | 0 | 1 |
| 13 | 1 | 1 | 0 | 1 | 0 | 0 | 0 | 0 | MULT | 0 | MULT | 0 |
| 14 | 1 | 1 | 1 | 0 | 0 | 0 | 0 | 1 | 1 | 0 | 1 | 1 |
| 15 | 1 | 1 | 1 | 1 | 0 | 0 | 0 | 1 | 0 | 0 | 0 | 0 |

FIG.26

| SIGNAL DECODER MODE | | | INPUTS | |
|---|---|---|---|---|
| MODE | DUAL | CTRL | A | B |
| I | 0 | 0 | DOWN CLOCK | UNUSED |
| II | 0 | 1 | CLOCK | UP / $\overline{DOWN}$ |
| III | 1 | 0 | UP CLOCK | DOWN CLOCK |
| IV | 1 | 1 | ENCODER A | ENCODER B |

FIG.27

| NO. ON FIG.1 | DEVICE | PREFERRED EMBODIMENTS | |
|---|---|---|---|
| 1 | MODULUS STORAGE DEVICE | M-BIT DFF | M-BIT LATCH |
| 2 | INTERVAL TIMER | M-BIT LOADABLE SYNC COUNTER | |
| 3 | TIMER STORAGE DEVICE | M-BIT DFF<br>M-BIT SYNC DFF | M-BIT LATCH<br>M-BIT SYNC LATCH |
| 4 | ADDITIONAL STORAGE DEVICE | M-BIT DFF<br>M-BIT SYNC DFF | M-BIT LATCH<br>M-BIT SYNC LATCH |
| 5 | CONTROL STORAGE DEVICE | K-BIT DFF | K-BIT LATCH |
| 6 | LOGIC | LOGIC | |
| 7 | SYNCHRONIZER & SIGNAL DECODER | SYNCHRONIZER AND SIGNAL DECODER | |
| 8 | PULSE COUNTER | P-BIT UP/DOWN SYNC COUNTER | |
| 9 | COUNTER STORAGE DEVICE | P-BIT DFF<br>P-BIT SYNC DFF | P-BIT LATCH<br>P-BIT SYNC LATCH |

FIG.34

| NO. IN FIG.1 | DEVICE | PREFERRED EMBODIMENTS | | | | |
|---|---|---|---|---|---|---|
| | | FIG.36 | FIG.38 | FIG.40 | FIG.42 | FIG.44 |
| 5 | CONTROL STORAGE DEVICE | K-BIT DFF | K-BIT LATCH | K-BIT DFF | K-BIT LATCH | K-BIT LATCH |
| 1 | MODULUS STORAGE DEVICE | M-BIT DFF | M-BIT LATCH | M-BIT DFF | M-BIT LATCH | M-BIT LATCH |
| 3 | TIMER STORAGE DEVICE | M-BIT SYNC DFF | M-BIT SYNC DFF | M-BIT DFF | M-BIT DFF | M-BIT LATCH |
| 4 | ADDITIONAL STORAGE DEVICE | M-BIT SYNC DFF | M-BIT SYNC LATCH | M-BIT DFF | M-BIT LATCH | M-BIT LATCH |
| 9 | COUNTER STORAGE DEVICE | P-BIT SYNC DFF | P-BIT SYNC LATCH | P-BIT DFF | P-BIT LATCH | P-BIT LATCH |

FIG.35

| CASE | COUNTING DIRECTION | OVERFLOW/ UNDERFLOW | $\|N_p\|$ | $\|N_p\|$ | $N_p$ | CONDITION |
|---|---|---|---|---|---|---|
| (A) | UP | - | C - B | C - B | -(C-B) | C-B < 8000H THAT IS B-C ≥ 8000H |
| (B) | | OVERFLOW | C+1 + FFFFH-B | | | |
| (C) | DOWN | - | B - C | B - C | B - C | B-C < 8000H |
| (D) | | UNDERFLOW | B+1 + FFFFH-C | | | |

| INT NO. | $N_P$ | $N_T$ BEFORE $f_M$ CALCULATION | $f_M$ | $N_T$ AFTER $f_M$ CALCULATION | B | COMMENT |
|---|---|---|---|---|---|---|
| 0 | $B - C_0$ | $A + 1 + N_C - A_0$ | $f_0 = f_C N_{P0} / N_{T0}$ | $A_0 + 1$ | $C_0$ | ERROR $f_0$ |
| 1 | $C_0 - C_1$ | $A_0 + 1 + N_C - A_1$ | $f_1 = f_C N_{P1} / N_{T1}$ | $A_1 + 1$ | $C_1$ | OK |
| 2 | $C_1 - C_2$ | $A_1 + 1 + N_C - A_2$ | $f_2 = f_C N_{P2} / N_{T2}$ | $A_2 + 1$ | $C_2$ | OK |
| 3 | 0 | $N_C + 1$ | 0 | $A_2 + 1$ | $C_2$ | OK |
| 4 | $C_2 - C_4$ | $A_2 + 1 + N_C - A_4$ | $f_4 = f_C N_{P4} / N_{T4}$ | $A_4 + 1$ | $C_4$ | ERROR $f_4$ |
| 5 | $C_4 - C_5$ | $A_4 + 1 + N_C - A_5$ | $f_5 = f_C N_{P5} / N_{T5}$ | $A_5 + 1$ | $C_5$ | OK |
| 6 | $C_5 - C_6$ | $A_5 + 1 + N_C - A_6$ | $f_6 = f_C N_{P6} / N_{T6}$ | $A_6 + 1$ | $C_6$ | OK |

| METHOD INPUTS | NUMBER OF COMPONENTS | COMBINED METHOD | G.P.CET METHOD | DB METHOD | APPLICATION EXAMPLES |
|---|---|---|---|---|---|
| 1 | COUNTERS | 3 | 3 | 2 | MEASUREMENT INSTRUMENTS AC & DC MOTOR CONTROL DIGITAL TACHOMETERS |
| | REGISTERS | - | 2 | 4 | |
| 2 | COUNTERS | 6 | 5 | 3 | AUTOMATIC TRANSMISSION (CAR) MOTOR-LOAD TRANSIENT RECORDER 2-WHEEL SPEEDOMETER (CAR) |
| | REGISTERS | - | 4 | 7 | |
| 3 | COUNTERS | 9 | 7 | 4 | ARM CONTROL IN ROBOTICS XYZ MOVEMENT CONTROL CNC MACHINES |
| | REGISTERS | - | 6 | 10 | |
| 4 | COUNTERS | 12 | 9 | 5 | ANTI-BLOCK SYSTEM (CAR) ANTI-SKID SYSTEM (CAR) COMPLEX MOTOR CONTROL |
| | REGISTERS | - | 8 | 13 | |
| N | COUNTERS | 3N | 2N + 1 | N + 1 | GENERAL |
| | REGISTERS | - | 2N | 3N + 1 | |

FIG.62

| EXPERIMENTAL SETUP | MULTIPLICATION FACTOR | | H | | |
|---|---|---|---|---|---|
| | VALUE | DIMENSION | 1 | 2 | 4 |
| PC/AT COMPUTER | MAX $f$ | HZ | $7 \cdot 10^6$ | $7 \cdot 10^6$ | $3.5 \cdot 10^6$ |
| | MIN $f$ | HZ | $3.33 \cdot 10^{-3}$ | $1.66 \cdot 10^{-3}$ | $0.83 \cdot 10^{-3}$ |
| 14.31818 MHZ REFERENCE PC/AT CLOCK | $\dfrac{\text{MAX } f}{\text{MIN } f}$ | – | $2.1 \cdot 10^9$ | $4.2 \cdot 10^9$ | $4.2 \cdot 10^9$ |
| 3-PHASE AC 1.4 KW MOTOR NOM 1500 RPM, E= 4096 $\dfrac{\text{MARKS}}{\text{TURN}}$ | MAX $N$ | RPM | $1 \cdot 10^5$ | $1 \cdot 10^5$ | $0.5 \cdot 10^5$ |
| | MIN $N$ | RPM | $4.88 \cdot 10^{-5}$ | $2.44 \cdot 10^{-5}$ | $1.22 \cdot 10^{-5}$ |
| | | REV. PER MONTH | 2.1 | 1.05 | 0.527 |
| 4.5 V DC 1 W MOTOR NOM 4500 RPM, E = 500 $\dfrac{\text{MARKS}}{\text{TURN}}$ | MAX $N$ | RPM | $8.4 \cdot 10^5$ | $8.4 \cdot 10^5$ | $4.2 \cdot 10^5$ |
| | MIN $N$ | RPM | $4 \cdot 10^{-4}$ | $2 \cdot 10^{-4}$ | $1 \cdot 10^{-4}$ |
| | | REV. PER MONTH | 17.3 | 8.64 | 4.32 |

FIG.65

EXTREMELY WIDE RANGE FREQUENCY MEASUREMENT METHOD

This is a continuation-in-part of application Ser. No. 07/654,224, filed Feb. 12, 1991, now abandoned.

FIELD OF THE INVENTION

This invention relates to a wide range frequency measurement method using a microcomputer and the apparatus to be used for that method.

BACKGROUND OF THE INVENTION

Several methods are available for the frequency measurement:

1) pulse counting within the prescribed time, described in papers [1, 2, 3, 4]:
   [1] T. J. Maloney and F. L. Alvarado, "A digital method for DC motor speed control," *IEEE Trans. Ind. Electron. Contr. Instrum.*, IECI-23, No. 1, pp. 44-46, February 1976.
   [2] S. C. Lin and S. J. Tsai, "A microprocessor-based incremental servo system with variable structure," *IEEE Trans. Ind. Electr.*, IE-31, No. 4, pp. 313-316, November 1984.
   [3] K. Ohishi, M. Nakao, K. Ohnishi, and K. Miyachi, "Microprocessor-controlled DC motor for load-insensitive position servo system," *IEEE Trans. Ind. Electr.*, IE-34, No. 1, pp. 44-49, February 1987.
   [4] K. Kuboki and M. Ohtsu, "An Allan variance real-time processing system for frequency stability measurements of semiconductor lasers," *IEEE Trans. Instrum. Measur.*, IM-39, No. 4, pp. 637-641, August 1990.

2) period measurement based on the elapsed time between pulses, described in papers [5, 6, 7, 8, 9]:
   [5] B. Szabados, N. K. Sinha, and C. D. diCenzo, "High-resolution precision digital tachometer," *IEEE Trans. Instrum. Meas.*, IM-21, No. 2, pp. 144-148, May 1972.
   [6] C. D. diCenzo, B. Szabados, and N. K. Sinha, "Digital measurement of angular velocity for instrumentation and control," *IEEE Trans. Ind. Electron. Contr. Instrum.*, IECI-23, No. 1, pp. 83-86, February 1976.
   [7] E. E. Wallingford and J. D. Wilson, "High-resolution shaft speed measurements using a microcomputer," *IEEE Trans. Instrum. Meas.*, IM-26, No. 2, pp. 113-116, June 1977.
   [8] B. Nabibullah, H. Singh, K. L. Soo, and L. C. Ong, "A new digital speed transducer," *IEEE Trans. Ind. Electron. Contr. Instrum.*, IECI-25, No. 4, pp. 339-342, November 1978.
   [9] E. P. McCarthy, "A digital instantaneous frequency meter," *IEEE Trans. Instrum. Meas.*, Vol. IM-28, No. 3, pp. 224-226, September 1979.

3) measurement of time duration of variable number of pulses, described in U.S. patents [10, 11, 12]:
   [10] J. Valis, "Means for Frequency/Digital Conversion," U.S. Pat. No. 3,928,798.
   [11] J. Takahashi, T. Shibata, S. Naito, and K. Tokuyama, "Skid control method," Hitachi, Ltd., U.S. Pat. No. 4,398,260.
   [12] G. F. Pierce, "Frequency determining apparatus," Canadian General Electric Company, Canadian Patent 1,144,986; U.S. Pat. No. 4,420,809.

4) combined pulse counting and time measurement, using the start and stop of measurement synchronized with measured frequency, described in [13, 14, 15]:
   [13] T. Ohmae, T. Matsuda, K. Kamiyama, and M. Tachikawa, "A microprocessor controlled high-accuracy wide-range speed regulator for motor drives," *IEEE Trans. Ind. Electr.*, IE-29, No. 3, pp. 207-211, August 1982.
   [14] T. Matsuda, M. Kanno, K. Saito, and T. Sukegawa, "A Microprocessor-based motor speed regulator using fast response state observer for reduction of torsional vibration," *IEEE Trans. Ind. Appl.*, vol. IA-23, No. 5, pp. 863-781, September 1987.
   [15] J.-P. Fauvet, J. Parisel, "Speed determining process and a device for implementing same," La Telemecanique Electrique, U.S. Pat. No. 4,683,545.

5) constant elapsed time (CET) measurement of time and pulse counting, using a capture register operation synchronized with measured frequency, described in papers [16, 17]:
   [16] R. Bonert, "Digital tachometer with fast dynamic response implemented by a microprocessor," *IEEE Trans. Ind. Appl.*, vol. IA-19, No. 6, pp, 1052-1056, December 1983.
   [17] R. Bonert, "Design of a high performance digital tachometer with a microcontroller," *IEEE Trans. Instrum. Meas.*, vol. IM-38, No. 6, pp. 1104-1108, December 1989.

6) double buffered (DB) time measurement and pulse counting using constant sampling time, described in papers [18, 19, 20, 21]:
   [18] M. Prokin, "Double buffered wide-range frequency measurement method for digital tachometers," *IEEE Trans. Instrum. Meas.*, vol. IM-40, No. 3, pp. 606-610 June 1991.
   [19] M. Prokin, "Speed measurement using the improved DMA transfer method," *IEEE Trans. Ind. Electr.*, vol. IE-38, No. 6, December 1991.
   [20] M. Prokin, "Dynamic response of a frequency measuring system," *IEEE Trans. Instrum. Meas.*, vol. IM-41, No. 3, June 1992. (accepted)
   [21] M. Prokin, "Dynamic response of the double-buffered frequency measurement method," *IMTC/92 Conference Record*, Secaucus, N.J., May 12-14, 1992. (accepted)

The error in 1) increases for low frequencies. The error in 2) increases for high frequencies. The method 3) requires prior information pertaining to the actual frequency range. The methods 4), 5) and 6) provide less error than the methods 1), 2) and 3). The sampling period in the methods 2), 3), 4) and 5) is variable and depends on measured frequency. The variation in sampling time in 4) is less than 1:3 through the frequency range, while the duration of an input pulse period is less than the time interval determined by the interval timer. The similar variation is within 1:2 for the method 5). The repetitive start, stop and reinitialization of counters also reduces the sample rate in 4). The repetitive enabling and disabling of the capture register function limits the maximum measured frequency and the frequency range in 5), which is also limited by the number of bits inside the timer.

On the contrary, the DB method 6) provides a high accuracy and a fast dynamic response over an extremely wide range of frequencies using constant sampling period. The detailed comparison between the DB method 6) and other methods will be performed after the description of the embodiment of the DB method, as an object of this invention.

SUMMARY OF THE INVENTION

An object of this invention is to provide an extremely wide range frequency measurement with selected sampling time and minimum measurement error. According to the features of this invention, the sampling time is constant and independent on frequency of input pulses.

Other objects, features and advantages of this invention will be apparent to those skilled in the art when reading the following description of the embodiment of this invention with reference to the attached drawings.

BRIEF DESCRIPTION OF THE DRAWINGS

FIG. 3A shows the internal configuration of a N-BIT BUFFER (N-bit tri-state buffer), while

FIG. 4A shows the symbol for a DFF (D-type flip-flop) with direct output, while

FIG. 5A shows the internal configuration of a N-BIT DFF (N-bit register with DFF per bit), while

FIG. 7A shows the internal configuration of a N-BIT LATCH (N-bit register with LATCH per bit), while

FIG. 9A shows the internal configuration of a SYNC DFF (synchronous DFF), while

FIG. 10A shows the internal configuration of a N-BIT SYNC DFF (N-bit register with SYNC DFF per bit), while

FIG. 11A shows the internal configuration of a SYNC LATCH (synchronous LATCH), while

FIG. 12A shows the internal configuration of a N-BIT SYNC LATCH (N-bit register with SYNC LATCH per bit), while

FIG. 13A shows the internal configuration of a SYNC TFF (synchronous Toggle flip-flop), while FIG. 13B shows the appropriate symbol.

FIG. 14A shows the internal configuration of a DCFF (D-type flip-flop with compare output), while FIG. 14B shows the appropriate symbol.

FIG. 15 A shows the internal configuration of a SYNC TDFF (synchronous Toggle and D-type flip-flop), while FIG. 15B shows the appropriate symbol, which is used in schematic diagrams.

FIG. 16A shows the internal configuration of a N-BIT LOADABLE SYNC COUNTER (N-bit loadable synchronous down counter with SYNC TDFF per bit), while

FIG. 17A shows the internal configuration of a SYNC TCFF (synchronous Toggle flip-flop with compare output), while

FIG. 18A shows the internal configuration of a N-BIT UP/DOWN SYNC COUNTER (N-bit synchronous up/down counter with SYNC TCFF per bit), while

FIG. 21A shows the internal configuration of a DIG-FILT (digital filter), while

FIG. 26 is a table illustrating four different signal decoder modes of the operation, depending on the conditions of both inputs.

FIG. 27 is a table illustrating the functionality of both input signals in the different modes of the operation.

FIG. 28A shows the internal configuration of the preferred signal decoder, while

FIG. 29A shows the internal configuration of the preferred synchronizer and signal decoder, while

FIG. 32A shows the internal configuration of the logic, while

FIG. 34 is a table illustrating the preferred embodiments for the required devices.

FIG. 35 is a table describing types of the devices used in several embodiments presented in further figures.

FIG. 62 is a table illustrating the comparison between earlier methods and the double buffered method, considering the hardware requirements.

FIG. 65 is a table illustrating the performances of several experimental setups.

DETAILED DESCRIPTION OF THE INVENTION

Figure 1:
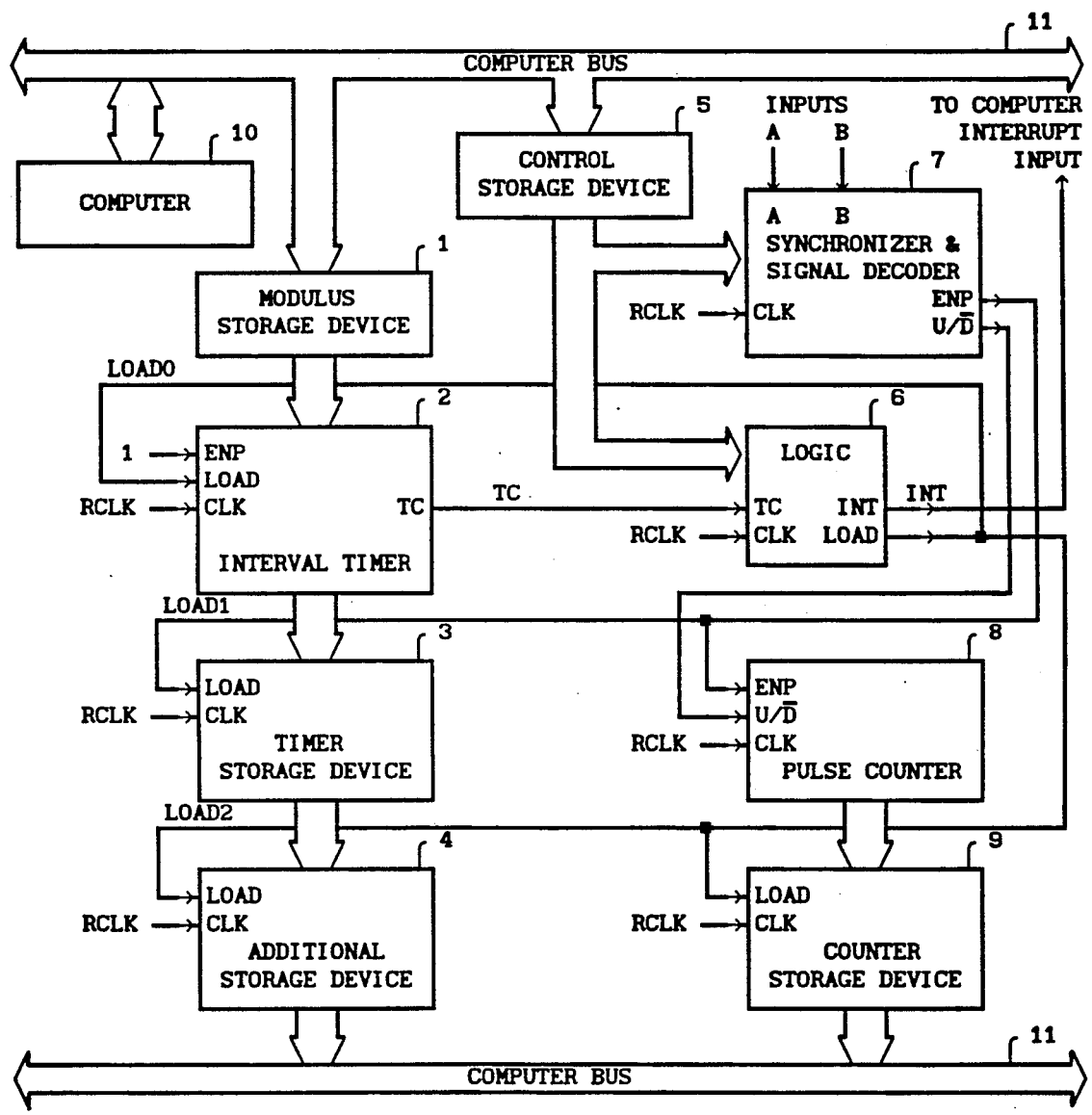
FIG. 1 schematically shows a block schematics of a double buffered (DB) frequency measurement system.

FIG. 1 schematically shows a block schematics of a double buffered (DB) frequency measurement system. The input signal pulses with an unknown frequency are generated by an external source (not shown). This source can be a rotary encoder, a signal generator, a resonant transducer, a magnetic pick-up, etc. Both input signals A and B are inputs of the synchronizer and signal decoder 7. For example, an incremental optical encoder produces two signals A and B, having a phase shift of 90°.

The computer 10 (microprocessor or microcontroller) is connected bidirectionally to the computer bus 11. The inputs of the modulus storage device 1 are connected to the computer bus 11. The outputs of the modulus storage device 1 are connected to the inputs of the internal timer 2. The outputs of the interval timer 2 are connected to the inputs of the timer storage device 3. The outputs of the timer storage device 3 are connected to the inputs of the additional storage device 4. The outputs of the additional storage device 4 are connected to the computer bus 11. The inputs of the control storage device 5 are connected to the computer bus 11. The outputs of the control storage device 5 are connected to the inputs of the logic 6 and the inputs of the synchronizer and signal decoder 7. The outputs of the pulse counter 8 are connected to the inputs of the counter storage device 9. The outputs of the counter storage device 9 are connected to the computer bus 11.

The measured clock LOAD1 is obtained on the output ENP of the synchronizer and signal decoder 7, which is connected to the enable counting control ENP of the pulse counter 8, and the load control LOAD of the timer storage device 3. The output U/$\overline{\text{D}}$ of the synchronizer and signal decoder 7 is connected to the up/-down control U/$\overline{\text{D}}$ of the pulse counter 8. The terminal count output TC of the interval timer 2 is connected to the input TC of the logic 6. The sampling clock LOAD0=LOAD2 is obtained on the output LOAD of the logic 6, which is connected to the load control LOAD of the interval timer 2, the load control LOAD of the additional storage device 4, and the load control LOAD of the counter storage device 9. The output INT of the logic 6 is connected to the computer 10 interrupt input.

Figure 2:
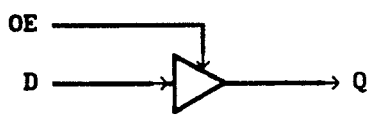
FIG. 2 shows the symbol for a BUFFER (tri-state buffer).

Before the explanation of preferred embodiments, a brief overview of used logic building blocks with their functions and symbols will be presented:

FIG. 2 shows the symbol for a BUFFER (tri-state buffer). The data input D is passed to the output Q through the BUFFER, while control input OE is high. The output Q is in a high-impedance state while OE is low.

Figure 3A:
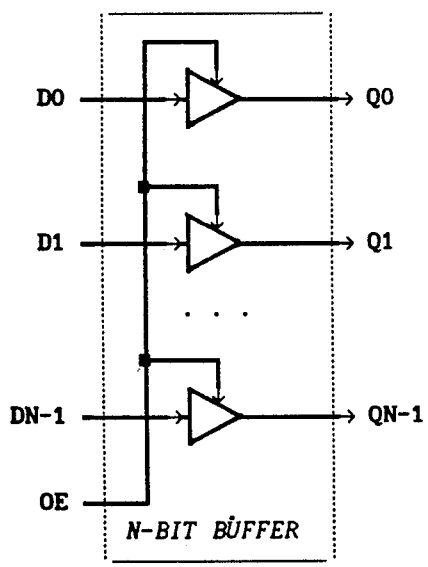
Figure 3B:
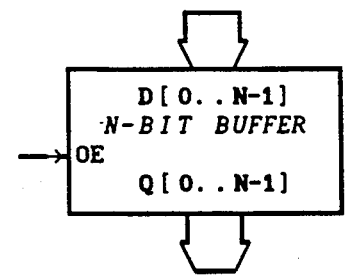
FIG. 3B shows the appropriate symbol.
Figure 3C:
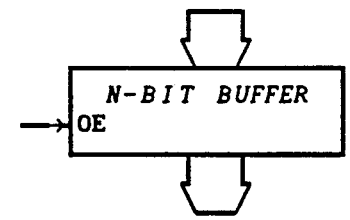
FIG. 3C shows the simplified symbol, which is used in schematic diagrams.

FIG. 3A shows the internal configuration of a N-BIT BUFFER (N-bit tri-state buffer), while FIG. 3B shows the appropriate symbol, and FIG. 3C shows the simplified symbol, which is used in schematic diagrams.

Figure 4A:
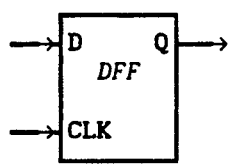
Figure 4B:
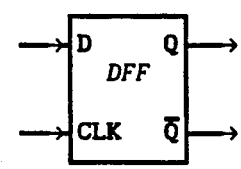
FIG. 4B shows the symbol for the DFF (D-type flip-flop) with direct and complementary outputs Q and $\bar{Q}$, respectively.

FIG. 4A shows the symbol for a DFF (D-type flip-flop) with direct output, while FIG. 4B shows the symbol for the DFF (D-type flip-flop) with direct and complementary outputs Q and $\overline{\text{Q}}$, respectively. The rising edge (low-to-high transition) on the clock input CLK causes the change of the output Q to the value present on the data input D. The output Q remains the same, while CLK is stable or performs high-to-low transition.

Figure 5A:
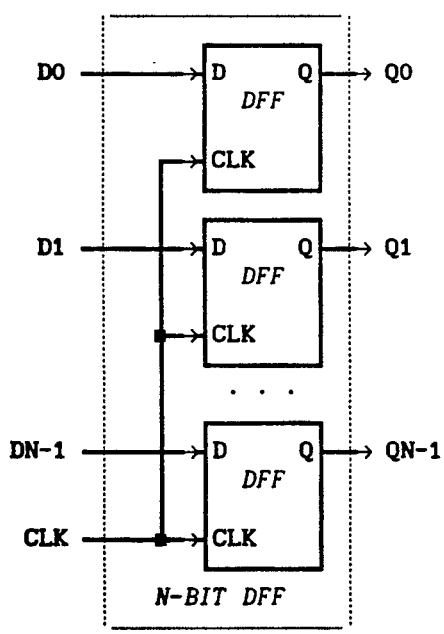
Figure 5B:
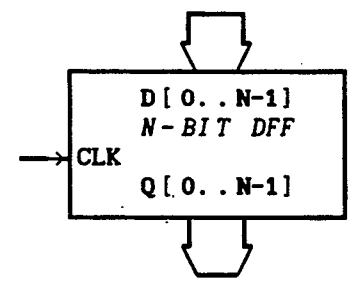
FIG. 5B shows the appropriate symbol.
Figure 5C:
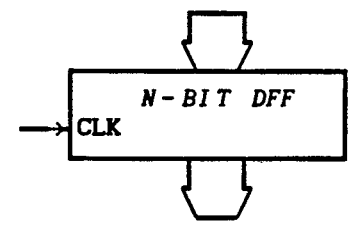
FIG. 5C shows the simplified symbol, which is used in schematic diagrams.

FIG. 5A shows the internal configuration of a N-BIT DFF (N-bit register with DFF per bit), while FIG. 5B shows the appropriate symbol, and FIG. 5C shows the simplified symbol, which is used in schematic diagrams.

Figure 6:
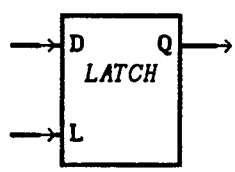
FIG. 6 shows the symbol for a LATCH (latch circuit) with single output.

FIG. 6 shows the symbol for a LATCH (latch circuit) with single output. The output Q follows the value present on the data input D, while the control input L is high. The output Q "latches" the value present on the data input D at falling edge (high-to-low transition) of L, and retains it, while L is low.

Figure 7A:
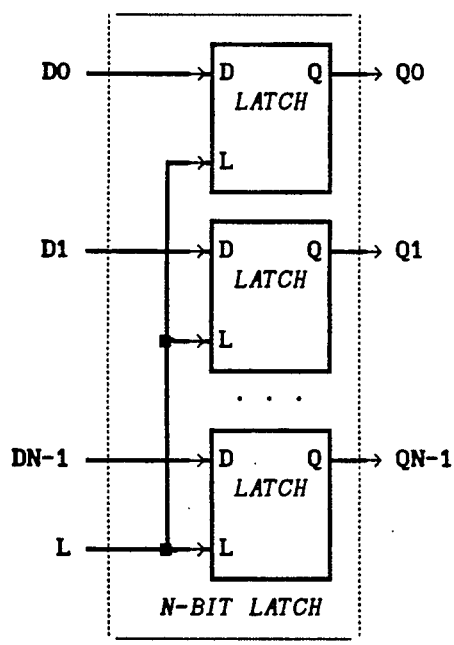
Figure 7B:
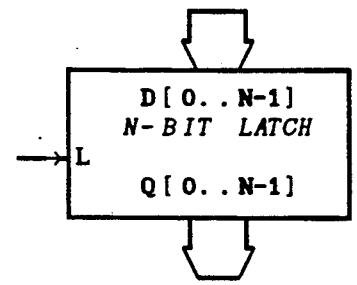
FIG. 7B shows the appropriate symbol.
Figure 7C:
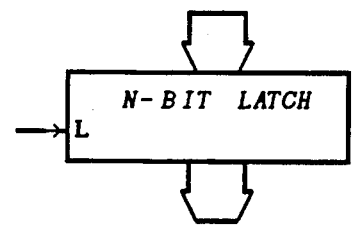
FIG. 7C shows the simplified symbol, which is used in schematic diagrams.

FIG. 7A shows the internal configuration of a N-BIT LATCH (N-bit register with LATCH per bit), while FIG. 7B shows the appropriate symbol, and FIG. 7C shows the simplified symbol, which is used in schematic diagrams.

Figure 8:
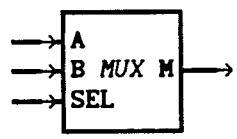
FIG. 8 shows the symbol for a MUX (2 inputs to 1 output multiplexer).

FIG. 8 shows the symbol for a MUX (2 inputs to 1 output multiplexer). The data input A is passed to the output M, while the control input SEL is low. The data input B is passed to the output M, while the control input SEL is high.

Figure 9A:
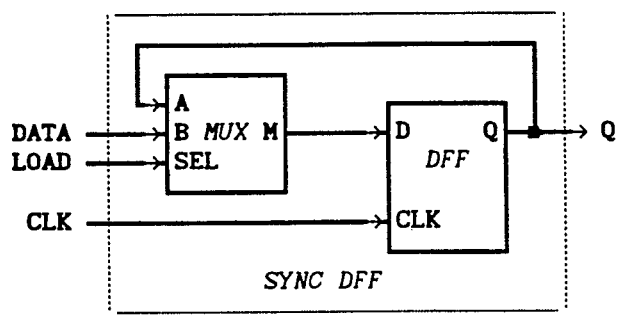
Figure 9B:
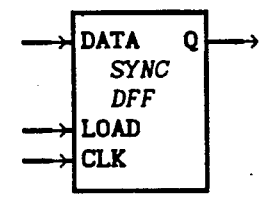
FIG. 9B shows the appropriate symbol, which is used in schematic diagrams.

FIG. 9A shows the internal configuration of a SYNC DFF (synchronous DFF), while FIG. 9B shows the appropriate symbol, which is used in schematic diagrams. The data input DATA is passed to the DFF through the MUX, while the control input LOAD is high. This will change the content of DFF at rising edge of CLK. Output Q is fed back to the DFF through the MUX, while LOAD is low. In this case, a content of the DFF remains the same, disregarding CLK.

Figure 10A:
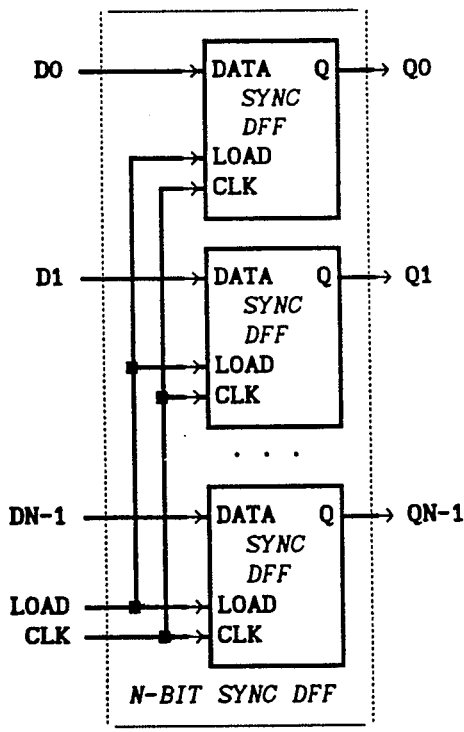
Figure 10B:
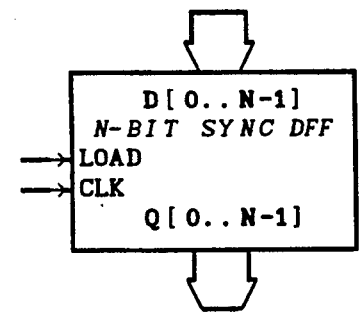
FIG. 10B shows the appropriate symbol.
Figure 10C:
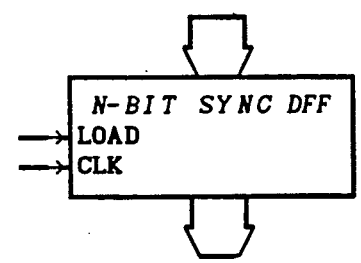
FIG. 10C shows the simplified symbol, which is used in schematic diagrams.

FIG. 10A shows the internal configuration of a N-BIT SYNC DFF (N-bit register with SYNC DFF per bit), while FIG. 10B shows the appropriate symbol, and FIG. 10C shows the simplified symbol, which is used in schematic diagrams.

Figure 11A:
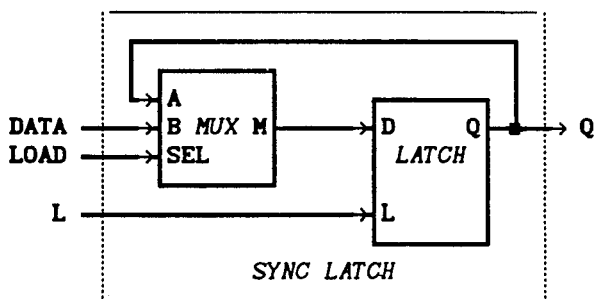
Figure 11B:
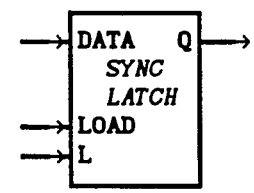
FIG. 11B shows the appropriate symbol, which is used in schematic diagrams.

FIG. 11A shows the internal configuration of a SYNC LATCH (synchronous LATCH), while FIG. 11B shows the appropriate symbol, which is used in schematic diagrams. The data input DATA is passed to the LATCH through the MUX, while the control input LOAD is high. This will change the content of the LATCH, only if the control input L is high, otherwise it remains unchanged. The output Q is fed back to the LATCH through the MUX, while LOAD is low. In this case, a content of the LATCH remains the same, disregarding L.

Figure 12A:
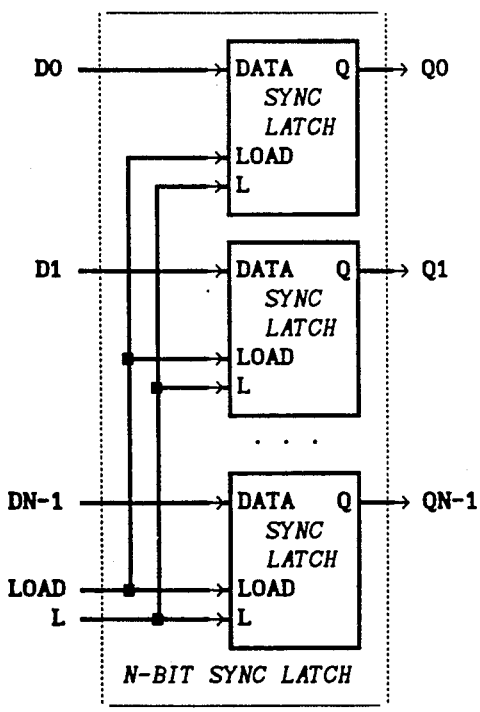
Figure 12B:
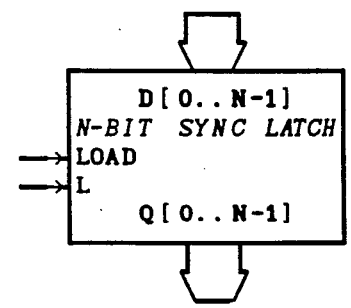
FIG. 12B shows the appropriate symbol.
Figure 12C:
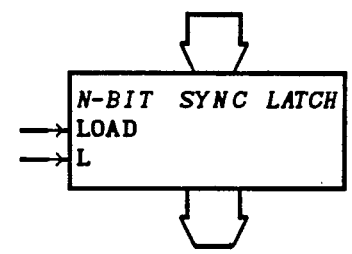
FIG. 12C shows the simplified symbol, which is used in schematic diagrams.

FIG. 12A shows the internal configuration of a N-BIT SYNC LATCH (N-bit register with SYNC LATCH per bit), while FIG. 12B shows the appropriate symbol, and FIG. 12C shows the simplified symbol, which is used in schematic diagrams.

FIG. 13A shows the internal configuration of a SYNC TFF (synchronous Toggle flip-flop), while FIG. 13B shows the appropriate symbol. The output Q is fed back to the DFF through the MUX, while the control input T is low. In this case, a content of the DFF remains the same, disregarding the clock input CLK. The output $\overline{\text{Q}}$ is fed back to the DFF through the MUX, while T is high. This will complement a content of the DFF at rising edge of CLK. The function of the SYNC TFF is presented only to simplify further explanation of more complex devices, because this symbol is not used in schematic diagrams.

FIG. 14A shows the internal configuration of the DCFF (D-type flip-flop with compare output), while FIG. 14B shows the appropriate symbol. The output Q is passed to the output M through the MUX, while the control input CMP is high. The output $\overline{\text{Q}}$ is passed to the output M through the MUX, while control input CMP is low. The function of the DCFF is presented only to simplify further explanation of more complex devices, because this symbol is not used in schematic diagrams.

FIG. 15A shows the internal configuration of the SYNC TDFF (synchronous Toggle and D-type flip-flop) while FIG. 15B shows the appropriate symbol, which is used in schematic diagrams. The output Q is fed back to the DFF through the MUX2 and MUX1, while both control inputs T and LOAD are low. In this case, a content of the DFF remains the same, disregarding the clock input CLK. The output $\overline{\text{Q}}$ is fed back to the DFF through the MUX2 and MUX1, while t is high and LOAD is low. This will complement a content of the DFF at rising edge of CLK. The data input DATA is passed to the DFF through the MUX1 while LOAD is high. This will change a content of the DFF at rising edge of CLK, disregarding T.

Figure 16A:
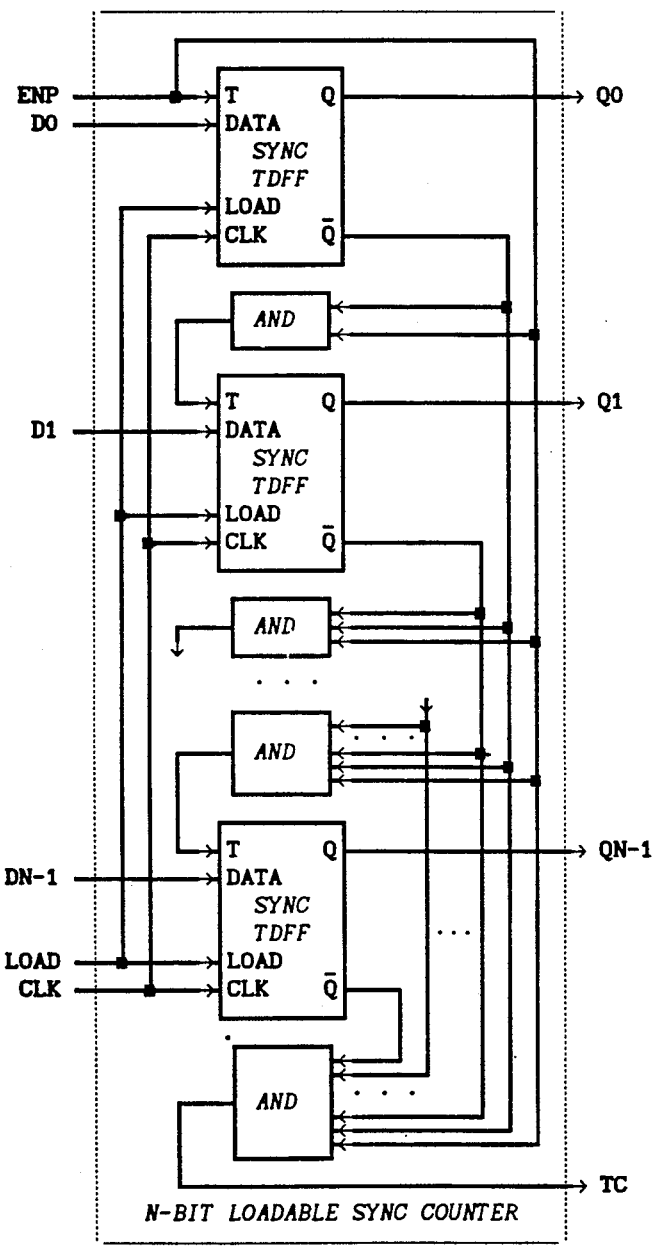
Figure 16B:
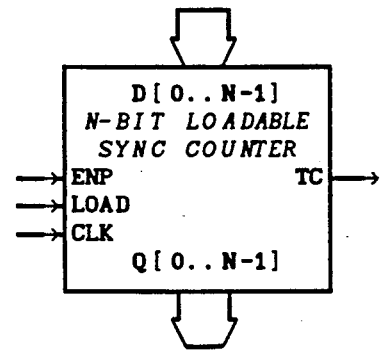
FIG. 16B shows the appropriate symbol.
Figure 16C:
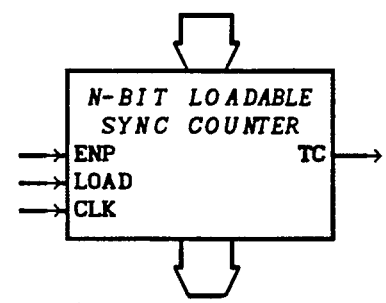
FIG. 16C shows the simplified symbol, which is used in schematic diagrams.

FIG. 16A shows the internal configuration of a N-BIT LOADABLE SYNC COUNTER (N-bit loadable synchronous down counter with SYNC TDFF per bit), while FIG. 16B shows the appropriate symbol, and FIG. 16C shows the simplified symbol, which is used in schematic diagrams. The counter consists of SYNC TDFF stages coupled with AND-gates for fast propagation of carry/borrow. The value present on the data inputs D0..DN−1 is loaded into the N-BIT LOADABLE SYNC COUNTER at rising edge of the clock input CLK while the control input LOAD is high, disregarding the control input ENP. Least significant SYNC TDFF with output Q0 is toggled at rising edge of CLK, while ENP is high and LOAD is low. Each consecutive SYNC TDFF is also toggled at rising edge of CLK, while ENP is high, LOAD is low and the outputs Qi of all low-order SYNC TDFFs are low (than the outputs $\overline{Qi}$ are high). Therefore, the N-BIT LOADABLE SYNC COUNTER counts down at each rising edge of CLK, while ENP is high and LOAD is low. The terminal count signal TC during down counting is generated if ENP is high and all outputs Qi are low (than all outputs $\overline{Qi}$ are high). The counter does not count while ENP is low, or in case that LOAD is high, disregarding ENP.

Figure 17A:
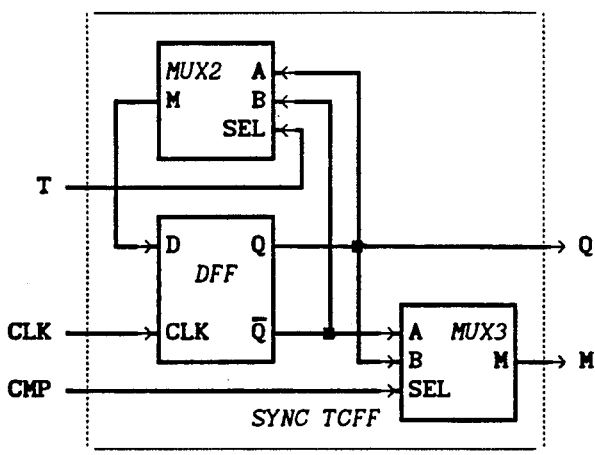
Figure 17B:
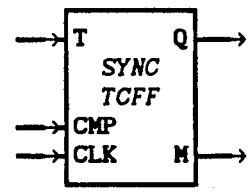
FIG. 17B shows the appropriate symbol, which is used in schematic diagrams.

FIG. 17A shows the internal configuration of the SYNC TCFF (synchronous Toggle flip-flop with compare output), while FIG. 17B shows the appropriate symbol, which is used in schematic diagrams. The output Q is fed back to the DFF through the MUX2, while the control input T is low. In this case, the content of the DFF remains the same, disregarding CLK. The output $\overline{Q}$ is fed back to the DFF through the MUX2, while T is high. This will complement a content of the DFF at rising edge of CLK. The output Q is passed to the output M through the MUX3, while control input CMP is high. The output $\overline{Q}$ is passed to the output M through the MUX3, while control input CMP is low.

Figure 18A:
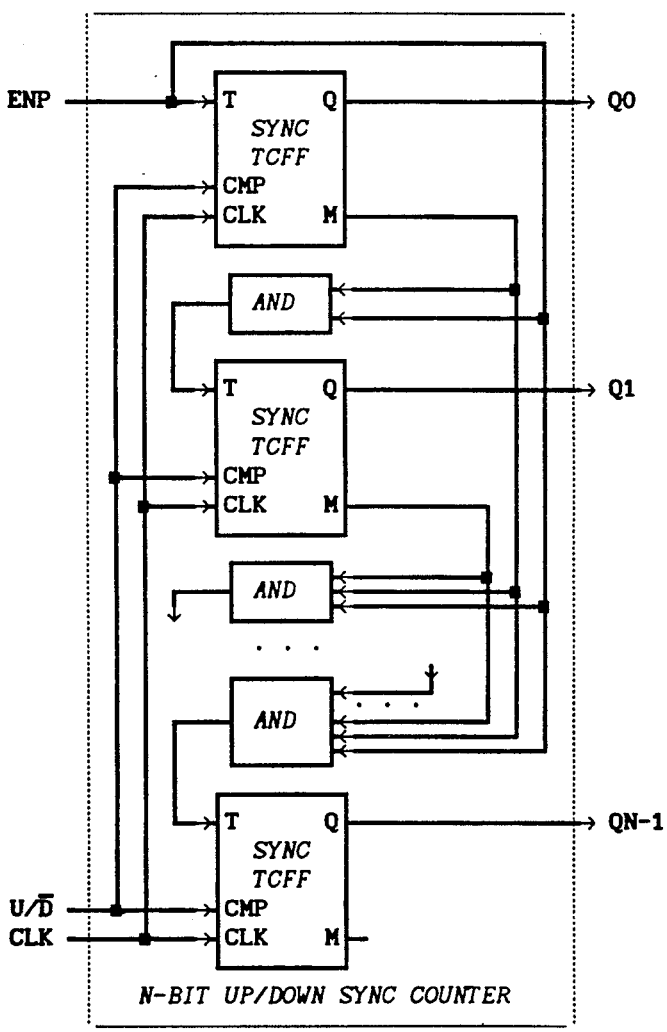
Figure 18B:
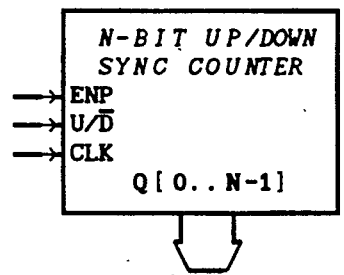
FIG. 18B shows the appropriate symbol.
Figure 18C:
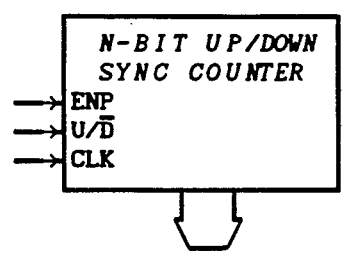
FIG. 18C shows the simplified symbol, which is used in schematic diagrams.

FIG. 18A shows the internal configuration of a N-BIT UP/DOWN SYNC COUNTER (N-bit synchronous up/down counter with SYNC TCFF per bit), while FIG. 18B shows the appropriate symbol, and FIG. 18C shows the simplified symbol, which is used in schematic diagrams. The counter consists of SYNC TCFF stages coupled with AND-gates for fast propagation of carry/borrow. Least significant SYNC TCFF with output Q0 is toggled at rising edge of the clock input CLK, while the control input ENP is high. Each consecutive SYNC TCFF is also toggled at rising edge of CLK, while ENP is high, the control input $U/\overline{D}$ is high, and the outputs Qi of all low-order SYNC TCFF are high (than the outputs Mi are also high). Therefore, the N-BIT UP/DOWN SYNC COUNTER counts up at each rising edge of CLK, while both ENP and $U/\overline{D}$ are high. Each consecutive SYNC TCFF can be also toggled at rising edge of CLK, while ENP is high, $U/\overline{D}$ is low, and the outputs Qi of all low-order SYNC TCFF are low (than the outputs Mi are high). Therefore, the N-BIT UP/DOWN SYNC COUNTER counts down at each rising edge of CLK, while ENP is high and $U/\overline{D}$ is low. The counter does not count while ENP is low.

Since preferred embodiment of this invention is based on synchronization of all signals with the reference clock RCLK, input signal(s) must be also synchronized with the same clock. The synchronizer requires the frequency f of an input signal to be less than half the frequency $f_c$ of the reference clock RCLK.

Figures 19, 20:
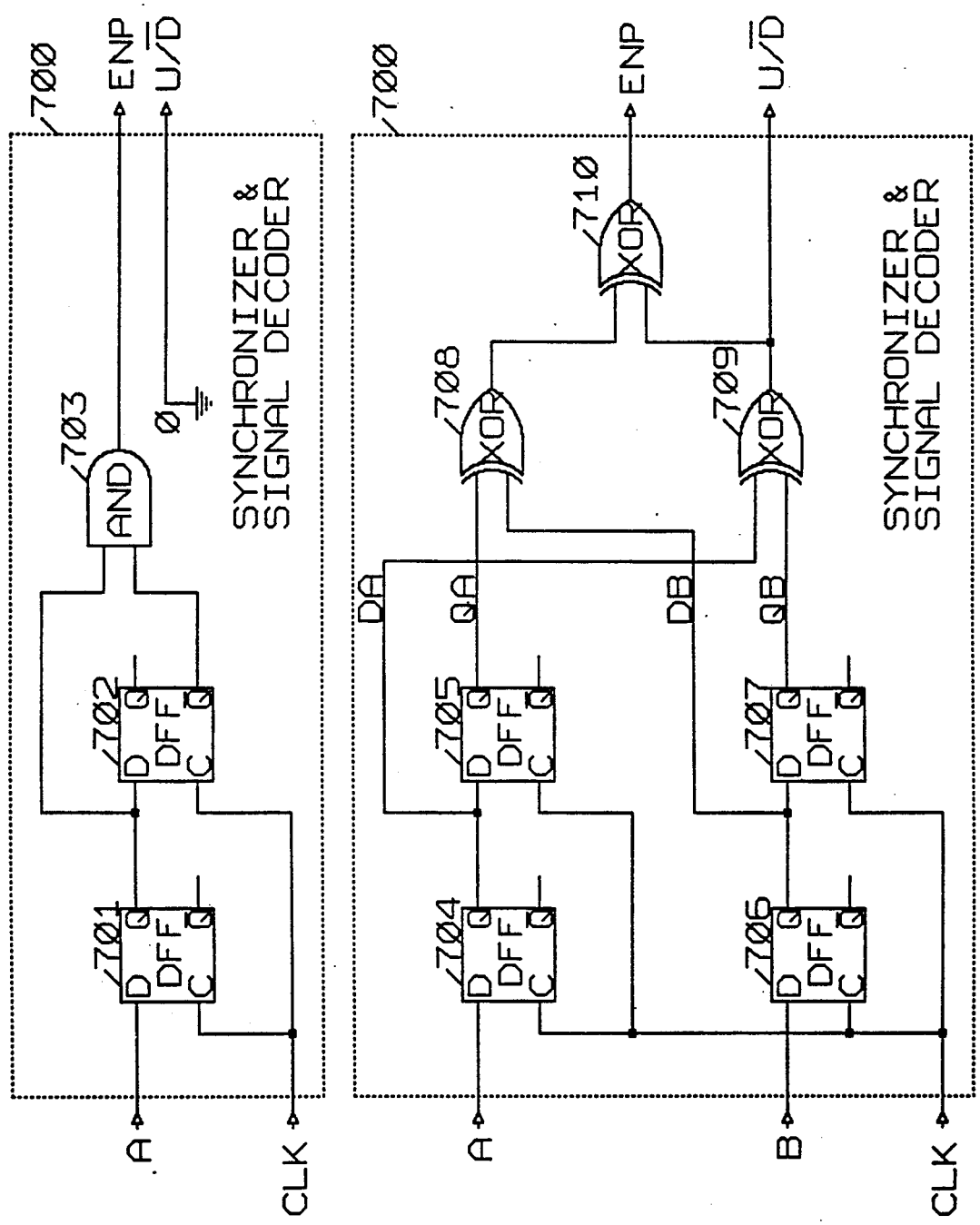
FIG. 19 shows the simplest synchronizer and signal decoder.
FIG. 20 shows the synchronizer and signal decoder of two input signals A and B, which is usually used as a standard interface between and up/down pulse counter and an encoder which produces signals A and B.

FIG. 19 shows the simplest synchronizer and signal decoder 700 consisting of two DFFs 701 and 702, and a logical AND-gate 703, which is well known and wide spread solution. Each rising edge of the input signal A, generates enable counting signal ENP, which duration is one period of the clock CLK, while an up/down direction of counting signal $U/\overline{D}$ is fixed (low level).

FIG. 20 shows the synchronizer and signal decoder 700 of two input signals A and B, which is usually used as a standard interface between an up/down pulse counter and an encoder which produces signals A and B. It consists of two DFFs 704 and 705 for the synchronization of the input A, two DFFs 706 and 707 for the synchronization of the input B and three exclusive OR (XOR) circuits 708, 709 and 710. Each rising and falling edge of either input A or the input B, generates enable counting signal ENP, which duration is one period of the clock CLK, while an up/down direction of counting signal $U/\overline{D}$ depends on phase shift between input signals A and B, according to relations (1). The up direction is defined by phase leading of the input A, while down direction is defined by phase leading of the input B. The frequency of ENP signal is quadrupled frequency of the input A.

$$ENP = DA \oplus QA \oplus DB \oplus QB$$

$$U/\overline{D} = DA \oplus QB \tag{1}$$

Any similar synchronization circuit can be used as synchronizer and signal decoder 7 for this invention. However, the preferred embodiment of this invention utilizes specially designed synchronizer and signal decoder 700, enabling 16 different modes of operation, including digital filtering, frequency multiplication and different functions of input signals.

Figure 21A:
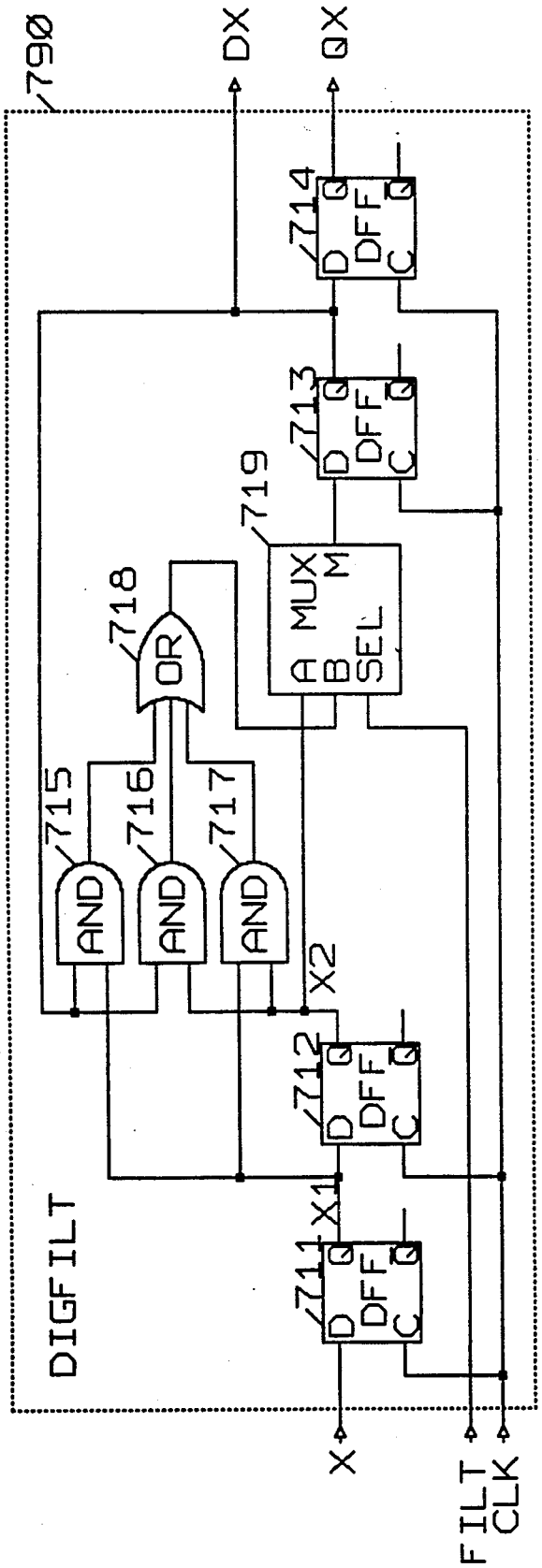
Figure 21B:
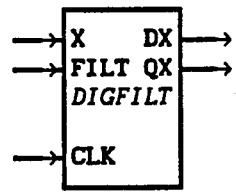
FIG. 21B shows the appropriate symbol, used in schematic diagrams.

FIG. 21A shows the internal configuration of a DIG-FILT (digital filter), while FIG. 21B shows the appropriate symbol, which is used in schematic diagrams. It consists of four DFFs 711, 712, 713 and 714, three AND-gates 715, 716 and 717, an OR-gate 718, and a multiplexer MUX 719. An input signal X is synchronized in DFF 711 with the clock CLK, providing an output X1, which is further delayed in DFF 712, providing an output X2. If the control input FILT is low (digital filter is off), the output X2 is passed to the DFF 713 through the MUX 719, providing an output DX. In this case, an input signal X is only delayed through DFFs 711, 712, 713 and 714. If the control input FILT is high (digital filter is on), a logic function provided by the AND-gates 715, 716 and 717, and OR-gate 718 is passed to the DFF 713 through the MUX 719, providing an output DX. In this case, the filtering of an input signal X enables transferring of the signal X to the output DX, only if the level of an input signal X is stable longer than two periods of the clock CLK. On the contrary, the output DX holds its level. Therefore, implemented digital filtering can be used to eliminate all pulses shorter than two periods of the clock CLK in order to improve reliability. However, this operation additionally twice decreases the maximum measured frequency. In both cases, the output DX is delayed in DFF 714, in order to provide an output QX.

On the basis of above explanation, the relations (2) can be derived, where function DFF ("data") means that "data" is present on data input D.

$$X1 = DFF(X)$$

$$X2 = DFF(X1)$$

$$DX = DFF(X2 \cdot \overline{FILT} + (X1 \cdot X2 + X2 \cdot DX + DX \cdot X1) \cdot FILT)$$

$$QX = DFF(DX) \tag{2}$$

Each input has own digital filter, so the output signals DA and QA of the digital filter for the input signal A=X, are DA=DX and QA=QX, and the output signals of the digital filter for the input signal B=X, are DB=DX and QB=QX.

A signal decoder improves universality of the encoder interface, providing different influence of input signals A and B on the pulse counter 800. The enable counting signal ENP and the control signal for the direction of counting $U/\overline{D}$ are obtained on the basis of signals DA, QA, DB, QB and the control input MULT, which controls the multiplication of frequency. The realized signal decoder comprises following modes:

| I | The decoder of an input clock, with unknown frequency: | |
|---|---|---|
| | A = input clock | B = unused |
| II | The decoder of an input clock and a direction of counting: | |
| | A = input clock | B = up/down direction of counting |
| III | The decoder of an up clock and a down clock: | |
| | A = up clock | B = down clock |
| IV | The decoder of two encoder signals: | |
| | A = first encoder channel | B = second encoder channel |

Figure 22:
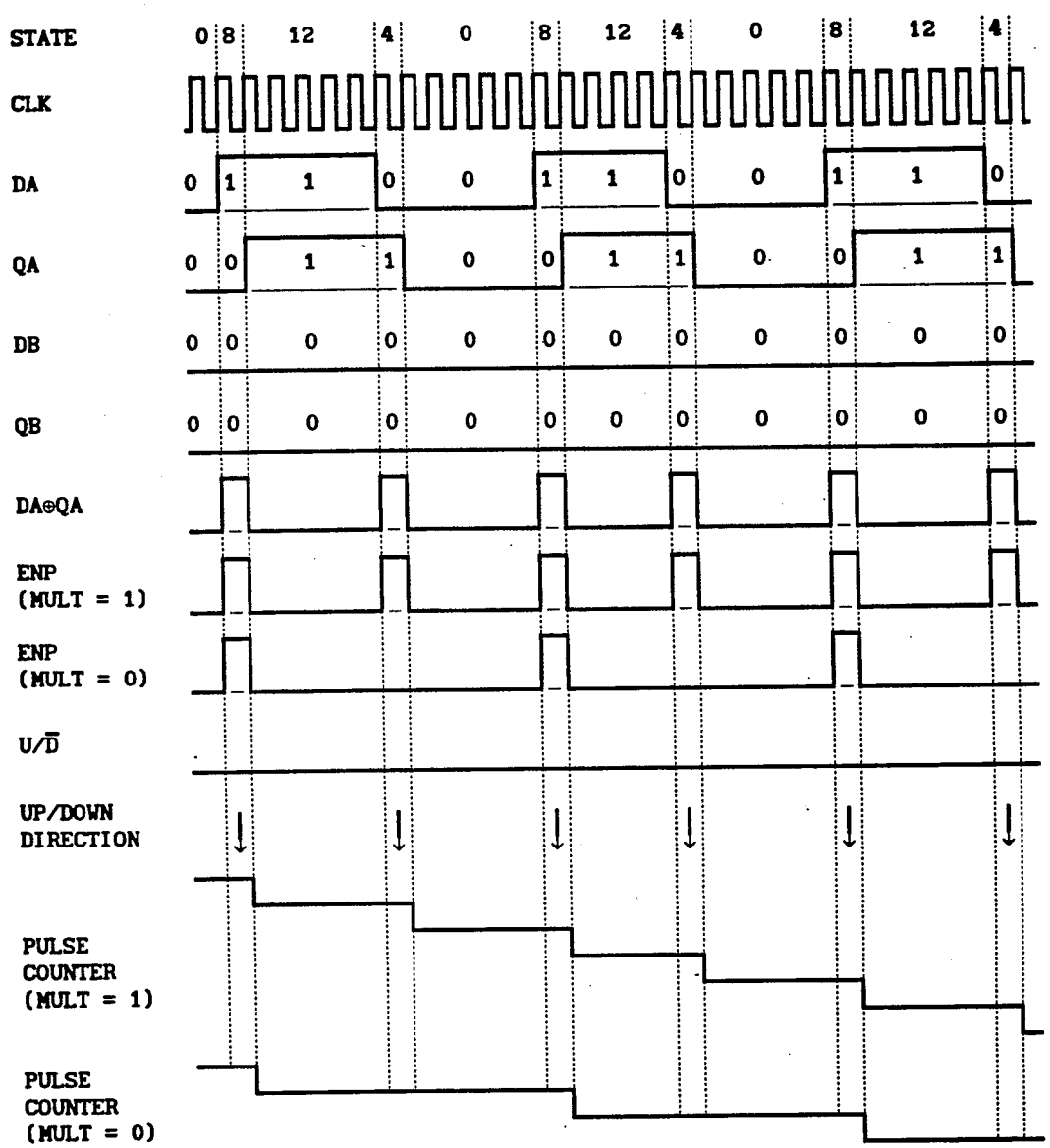
FIG. 22 shows the timing diagrams of a signal decoder mode I, where the input A is an input clock, which frequency is measured, while the input B is stable in either high or low level.

FIG. 22 shows the timing diagrams of a signal decoder mode I, where the input signal DA is a clock with unknown frequency, while the input signal DB is stable in either high or low level. If the control input MULT is low (multiplication is off), each rising edge of the input signal DA generates the high level of the output ENP, which duration is one period of the clock CLK. If the control input MULT is high (multiplication is on), each rising and falling edges of the input signal DA generates the high level of the output ENP, which duration is one period of the clock CLK. The relations (3) for the signal decoder mode I can be obtained from FIG. 26. The adopted direction of counting is down, so U/$\overline{D}$ is low.

$$ENP = DA \cdot \overline{QA} \cdot \overline{DB} \cdot \overline{QB} + \overline{DA} \cdot QA \cdot DB \cdot QB \cdot \quad (3)$$
$$\text{MULT} + DA \cdot \overline{QA} \cdot DB \cdot QB + \overline{DA} \cdot QA \cdot$$
$$\overline{DB} \cdot \overline{QB} \cdot \text{MULT}$$

$$U/\overline{D} = 0$$

Figure 23:
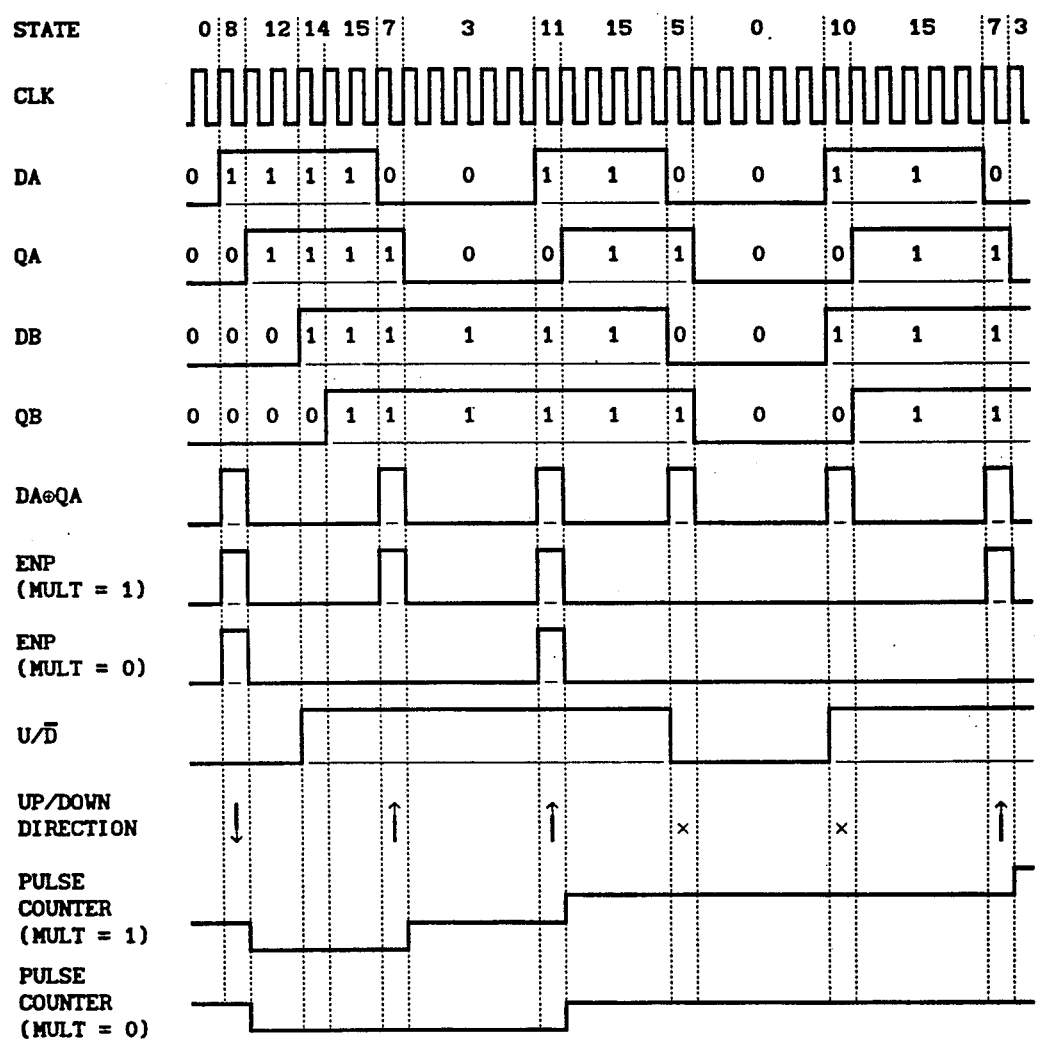
FIG. 23 shows the timing diagrams of a signal decoder mode II, where the input A is an input clock, which frequency is measured, while the input B determines and up/down direction of counting.

FIG. 23 shows the timing diagrams of a signal decoder mode II, where the input signal DA is a clock with unknown frequency, while the input signal DB determines an up/down direction of counting. If the control input MULT is low (multiplication is off), each rising edge of the input signal DA generates the high level of the output ENP, which duration is one period of the clock CLK. If the control input MULT is high (multiplication is on), each rising and falling edges of the input signal DA generates the high level of the output ENP, which duration is one period of the clock CLK. If DB is high, output signal U/$\overline{D}$ is high. If DB is low, output signal U/$\overline{D}$ is low. In case of a simultaneous change in both DA and DB signals, output ENP is low, so the content of the pulse counter 800 is unaffected, disregarding the output U/$\overline{D}$. Namely, because of the synchronization and digital filtering of input signals A and B, an information of the phase shift between signals DA and DB is not always appropriate to the phase shift between the original input signals A and B. In other words, an external hardware should provide a time interval between edges of the clock DA and the direction of counting DB, more than one period of the clock CLK, in order to affect the counting. In most cases, this is a completely natural request, in view of the fact, that on the contrary, the content of the pulse counter 800 can be incremented or decremented, depending on a small difference in delays inside an external hardware. The relations (4) for the signal decoder mode II can be obtained from FIG. 26. The relation for the output ENP is the same as for the signal decoder mode I, while the output U/$\overline{D}$ follows input signal DB.

$$ENP = DA \cdot \overline{QA} \cdot \overline{DB} \cdot \overline{QB} + \overline{DA} \cdot QA \cdot DB \cdot QB \cdot \quad (4)$$
$$\text{MULT} + DA \cdot \overline{QA} \cdot DB \cdot QB + \overline{DA} \cdot QA \cdot$$
$$\overline{DB} \cdot \overline{QB} \cdot \text{MULT}$$

$$U/\overline{D} = DB$$

Figure 24:
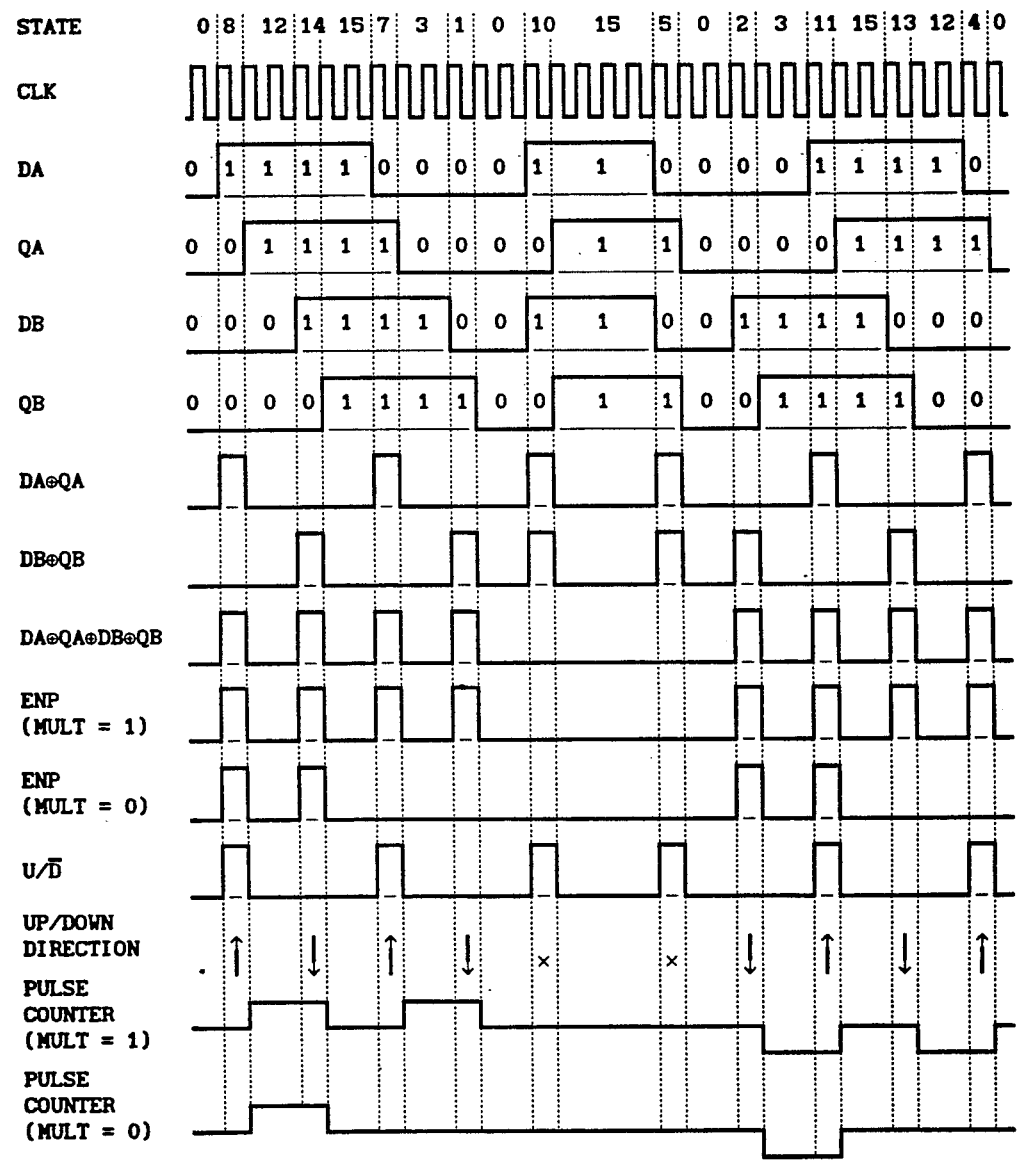
FIG. 24 shows the timing diagrams of a signal decoder mode III, where the input A is an up clock signal, while the input B is a down clock signal.

FIG. 24 shows the timing diagrams of a signal decoder mode III, where the input signal DA is an up clock signal, while the input signal DB is a down clock signal. If the control input MULT is low (multiplication is off), each rising edge of the input signal DA generates the high level of the output U/$\overline{D}$ and the high level of the output ENP, which duration is one period of the clock CLK. If the control input MULT is high (multiplication is on), each rising and falling edges of the input signal DA generates the high level of the output U/$\overline{D}$ and the high level of the output ENP, which duration is one period of the clock CLK. If the control input MULT is low (multiplication is off), each rising edge of the input signal DB generates the low level of the output U/$\overline{D}$ and the high level of the output ENP, which duration is one period of the clock CLK. If the control input MULT is high (multiplication is on), each rising and falling edges of the input signal DB generates the low level of the output U/$\overline{D}$ and the high level of the output ENP, which duration is one period of the clock CLK. In case of a simultaneous change in both DA and DB signals, output ENP is low, so a content of the pulse counter 800 remains the same, disregarding the output U/$\overline{D}$. The relations (5) for the signal decoder mode III can be obtained from FIG. 26.

$$ENP = DA \cdot \overline{QA} \cdot \overline{DB} \cdot \overline{QB} + \overline{DA} \cdot QA \cdot DB \cdot \quad (5)$$
$$QB \cdot \text{MULT} + DA \cdot \overline{QA} \cdot DB \cdot QB +$$
$$\overline{DA} \cdot QA \cdot \overline{DB} \cdot \overline{QB} \cdot \text{MULT} + \overline{DA} \cdot$$
$$\overline{QA} \cdot DB \cdot \overline{QB} + DA \cdot QA \cdot \overline{DB} \cdot QB \cdot$$
$$\text{MULT} + DA \cdot QA \cdot DB \cdot \overline{QB} + \overline{DA} \cdot$$
$$\overline{QA} \cdot \overline{DB} \cdot QB \cdot \text{MULT}$$

$$U/\overline{D} = \overline{DA} \cdot QA + DA \cdot \overline{QA} = DA \oplus QA$$

Figure 25:
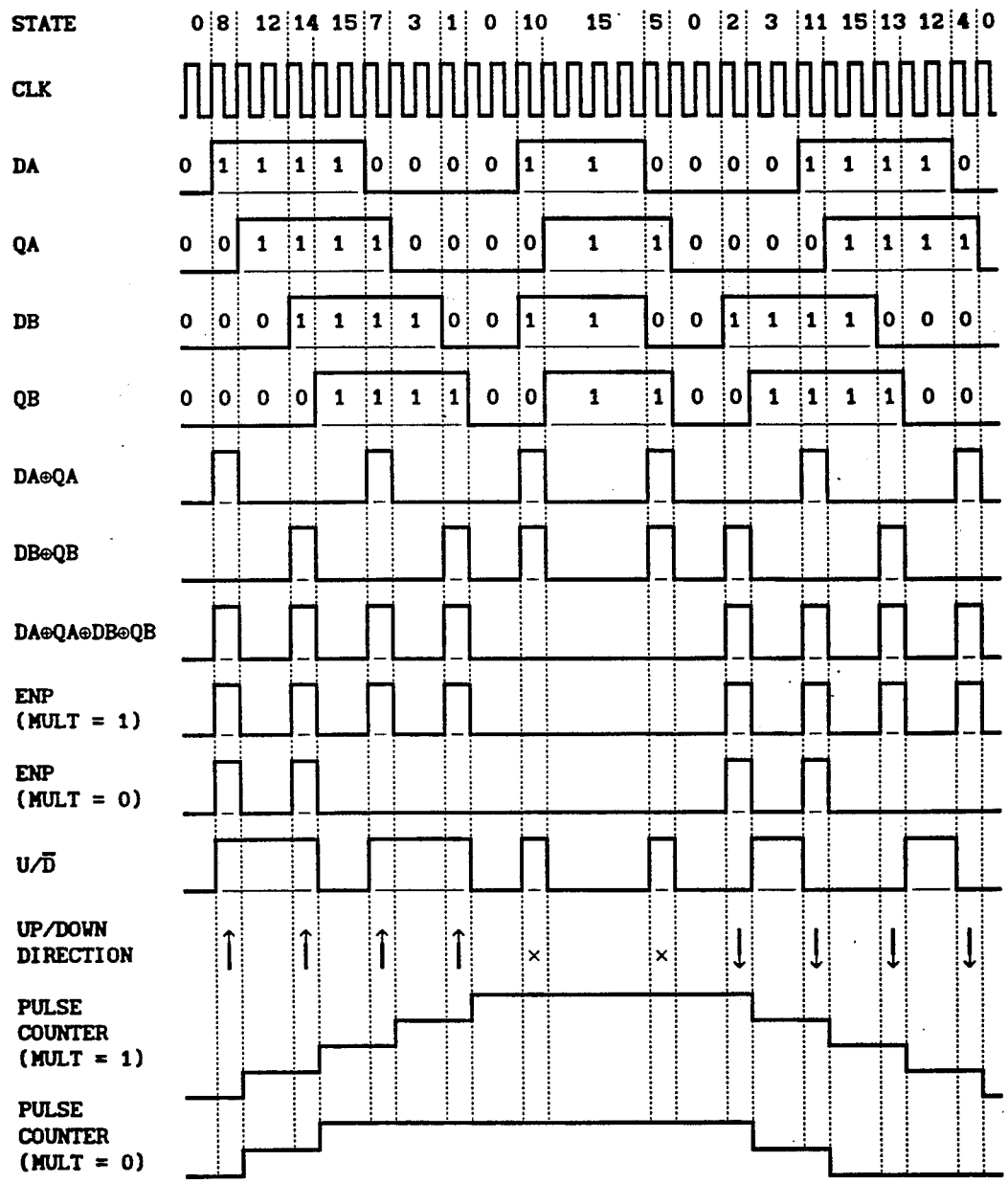
FIG. 25 shows the timing diagrams of a signal decoder mode IV, where the input A is connected to a first encoder channel output, while the input B is connected to a second encoder channel output.

FIG. 25 shows the timing diagrams of a signal decoder mode IV, where the input signal DA is the synchronized and filtered first encoder channel, while the input signal DB is the synchronized and filtered second encoder channel. The presented case shows the change in direction of the shaft rotation, which is coupled to the encoder. If the control input MULT is low (multiplication is off), each rising edge of the input signal DA generates the high level of the output ENP, which duration is one period of the clock CLK, and also generates the high level of the output U/$\overline{D}$ if DB is low, or low level of the output U/$\overline{D}$ if DB is high. If the control input MULT is high (multiplication is on), each rising and falling edges of the input signal DA generates the high level of the output ENP, which duration is one period of the clock CLK, and also generates the high level of the output U/$\overline{D}$ if DB is low for the rising edge of the input signal DA, or if DB is high for the falling edge of the input signal DA, and also generates the low level of the output U/$\overline{D}$ if DB is high for the rising edge of the input signal DA, or if DB is low for the falling edge of the input signal DA. If the control input MULT is low (multiplication is off), each rising edge of the input signal DB generates the high level of the output ENP, which duration is one period of the clock CLK, and also generates the high level of the output U/$\overline{\text{D}}$ if DA is high, or low level of the of the output U/$\overline{\text{D}}$ if DA is low. If the control input MULT is high (multiplication is on), each rising and falling edges of the input signal DB generates the high level of the output ENP, which duration is one period of the clock CLK, and also generates the high level of the output U/$\overline{\text{D}}$ if DA is high for the rising edge of the input signal DB, or if DA is low for the falling edge of the input signal DB, and also generates the low level of the output U/$\overline{\text{D}}$ if DA is low for the rising edge of the input signal DB, or if DA is high for the falling edge of the input signal DB. In case of a simultaneous change in both DA and DB signals, output ENP is low, so the content of the pulse counter 800 is unaffected, disregarding the output U/$\overline{\text{D}}$. The relations (6) for the signal decoder mode IV can be obtained from the FIG. 26.

$$ENP = DA \cdot \overline{QA} \cdot \overline{DB} \cdot \overline{QB} + \overline{DA} \cdot QA \cdot DB \cdot \qquad (6)$$
$$QB \cdot MULT + DA \cdot \overline{QA} \cdot DB \cdot QB +$$
$$\overline{DA} \cdot QA \cdot \overline{DB} \cdot \overline{QB} \cdot MULT + \overline{DA} \cdot$$
$$\overline{QA} \cdot DB \cdot \overline{QB} + DA \cdot QA \cdot \overline{DB} \cdot QB \cdot$$
$$MULT + DA \cdot QA \cdot DB \cdot \overline{QB} + \overline{DA} \cdot$$
$$\overline{QA} \cdot \overline{DB} \cdot QB \cdot MULT$$

$$U/\overline{D} = \overline{DA} \cdot QB + DA \cdot \overline{QB} = DA \oplus QB$$

Using two control signals CTRL and DUAL, it is possible to design all four decoder modes, in a general signal decoder, on the basis of the FIG. 27.

$$ENP = DA \cdot \overline{QA} \cdot \overline{DB} \cdot \overline{QB} + \overline{DA} \cdot QA \cdot DB \cdot QB \cdot \qquad (7)$$
$$MULT + DA \cdot \overline{QA} \cdot DB \cdot QB + \overline{DA} \cdot QA \cdot \overline{DB} \cdot$$
$$\overline{QB} \cdot MULT + \overline{DA} \cdot \overline{QA} \cdot DB \cdot \overline{QB} \cdot DUAL +$$
$$DA \cdot QA \cdot \overline{DB} \cdot QB \cdot MULT \cdot DUAL + DA \cdot$$
$$QA \cdot DB \cdot \overline{QB} \cdot DUAL + \overline{DA} \cdot \overline{QA} \cdot \overline{DB} \cdot$$
$$QB \cdot MULT \cdot DUAL$$

$$U/\overline{D} = DB \cdot \overline{DUAL} \cdot CTRL + (\overline{DA} \cdot QA + DA \cdot \qquad (8)$$
$$\overline{QA}) \cdot DUAL \cdot \overline{CTRL} + (\overline{DA} \cdot QB + DA \cdot$$
$$\overline{QB}) \cdot DUAL \cdot CTRL$$

Figure 28A:
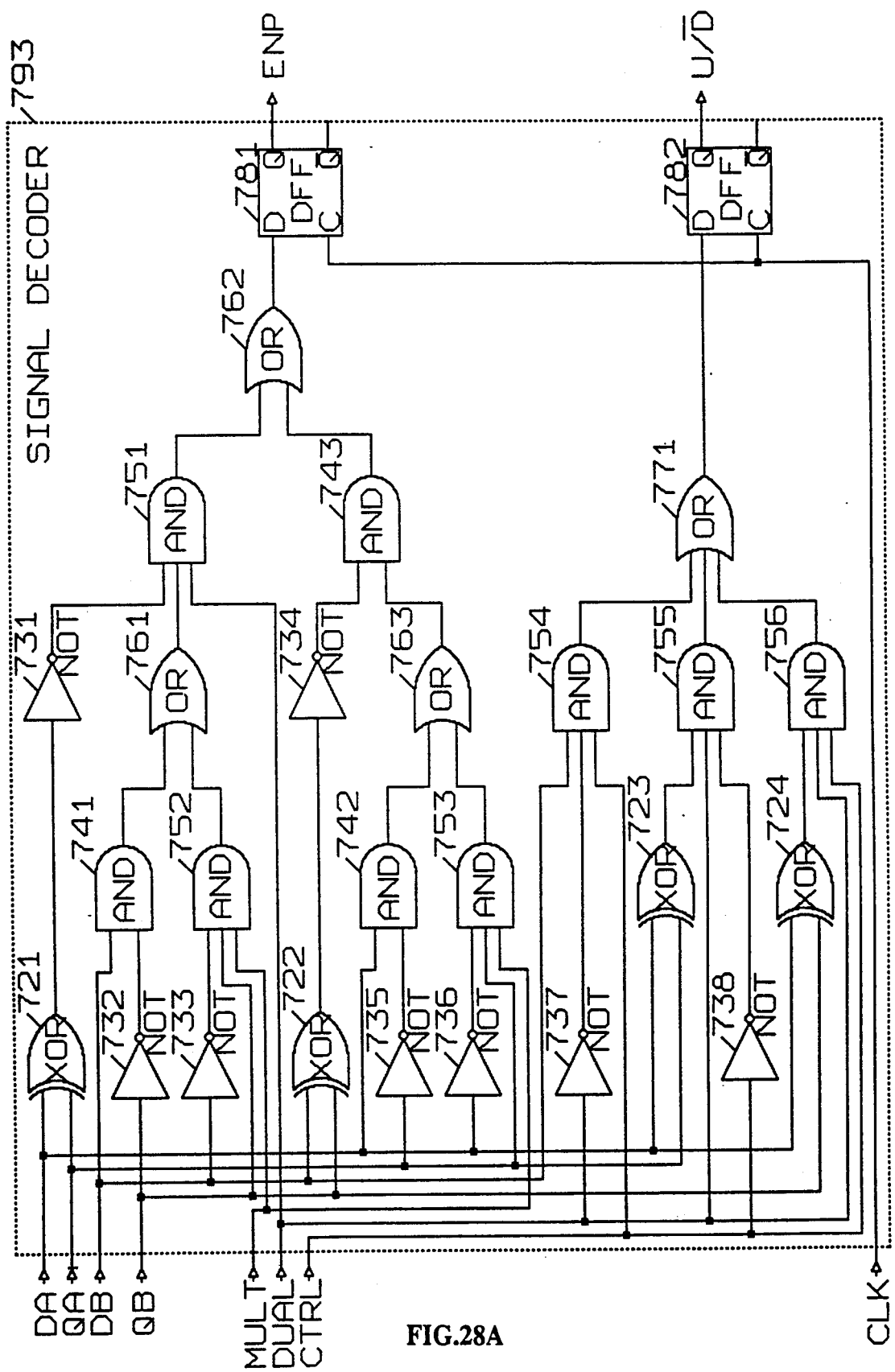
Figure 28B:
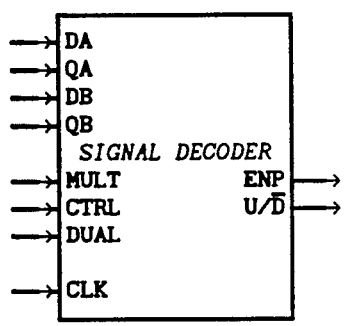
FIG. 28B shows the appropriate symbol, which is used in schematic diagrams.

FIG. 28A shows the internal configuration of the preferred signal decoder, while FIG. 28B shows the appropriate symbol, used in schematic diagrams.

FIG. 28A shows the internal configuration of the preferred signal decoder for the output ENP, where XOR-gate 721, NOT-gates 731, 732 and 733, AND-gates 741, 751 and 752, and OR-gate 761 provide fifth, sixth, seventh and eighth product term (third and fourth row) of the sum in the equation (7), and where XOR-gate 722, NOT-gates 734, 735 and 736, AND-gates 742, 743 and 753, and OR-gate 763 provide first, second, third and fourth product term (first and second row) of the sum in the equation (7), while OR-gate 762 combine all eight product terms and pass them to the DFF 781.

FIG. 28A also shows the internal configuration of the preferred signal decoder for the output U/$\overline{\text{D}}$, where NOT-gate 737 and AND-gate 754 provide first product term (first row) of the sum in the equation (8), XOR-gate 723, NOT-gate 738 and AND-gate 755 provide second product term (second row) of the sum in the equation (8), and XOR-gate 724 and AND-gate 756 provide third product term (third row) of the sum in the equation (8), while OR-gate 771 combine all three product terms and pass them to the DFF 782. Therefore, AND-gates 754, 755 and 756 together with the OR-gate 771, works as the 4 inputs to 1 output multiplexer, where the first input, appropriate to low level of both DUAL and CTRL, is always low and is omitted from the logic.

The outputs ENP and U/$\overline{\text{D}}$ can be realized as registered or combinatorial outputs. In this case, it is suitable to use registered outputs, in order to avoid "glitches" during decoding. All timings of the enable counting ENP and the direction of counting U/$\overline{\text{D}}$ signals, presented in FIGS. 22,23,24 and 25, should be delayed for one period of the reference clock, which does not change the functions of the signal decoder.

Figure 29B:
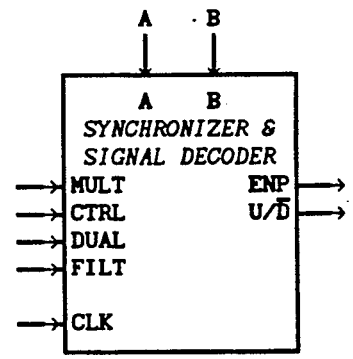
FIG. 29B shows the appropriate symbol, which is used in schematic diagrams.
Figure 29A:
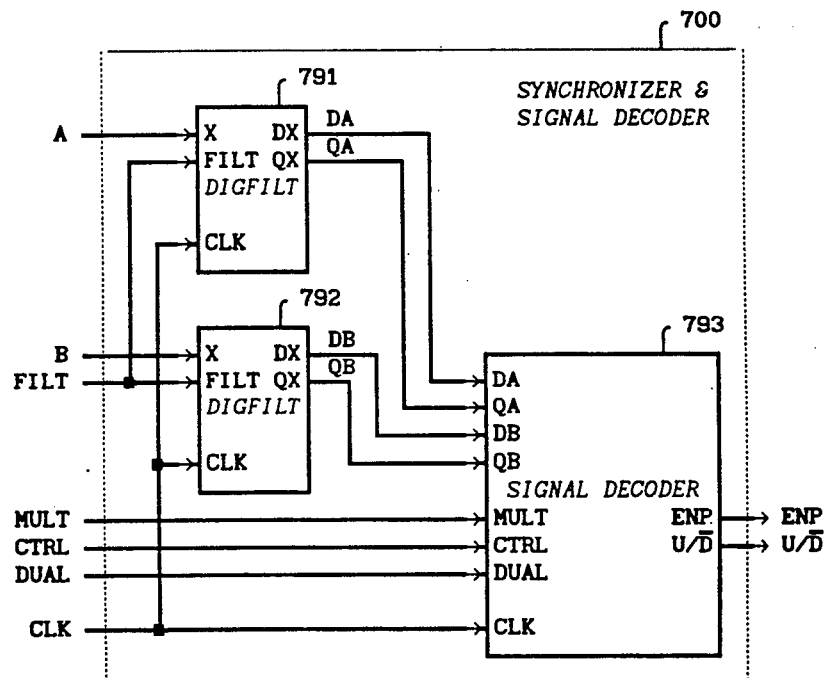

FIG. 29A shows the internal configuration of the preferred synchronizer and signal decoder 700, while FIG. 29B shows the appropriate symbol, which is used in schematic digrams. The output signal A is filtered inside the DIGFILT 791, while the input signal B is filtered inside the DIGFILT 792, depending on the control input FILT. Filtered signals DA, QA, DB and QB are passed directly to the SIGNAL DECODER 793, in order to generate outputs ENP and U/$\overline{\text{D}}$.

Figure 30:
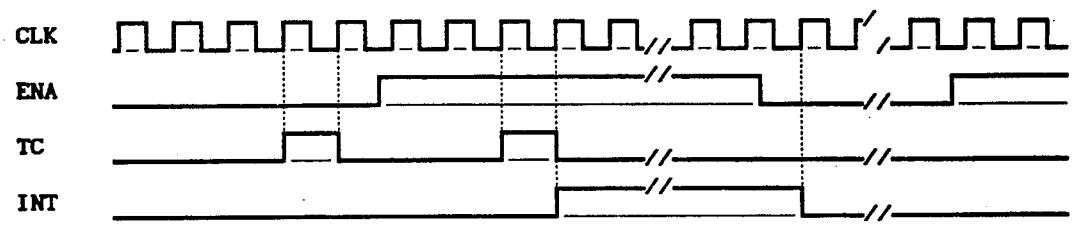
FIG. 30 shows the timing diagrams for the generation of an interrupt request according to the control input signal and the terminal count signal.

FIG. 30 shows the timing diagrams for the generation of an interrupt request INT according to the control input signal ENA, and the terminal count signal TC.

Figure 31:
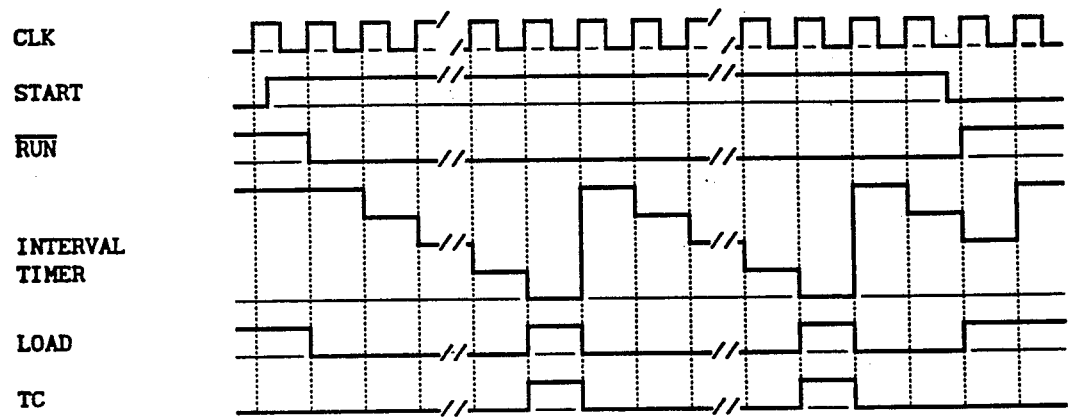
FIG. 31 shows the timing diagrams for the generation of a signal for loading the interval timer by the content of the modulus storage device.

FIG. 31 shows the timing diagrams for the generation of a signal LOAD for loading the interval timer 2 by the content of the modulus storage device 1.

Figure 32A:
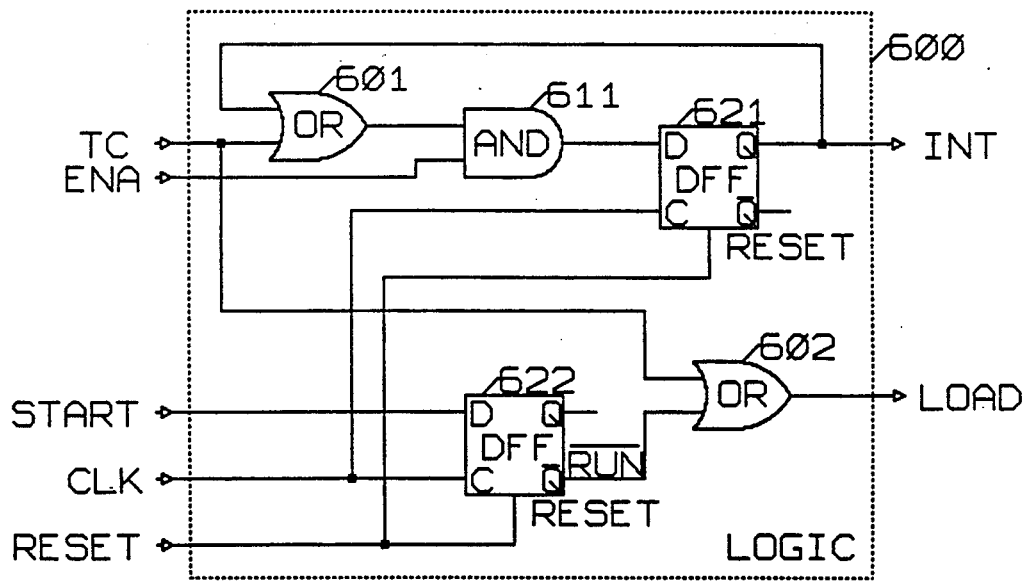
Figure 32B:
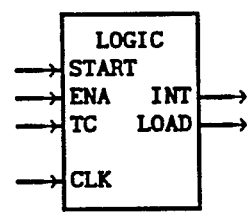
FIG. 32B shows the appropriate symbol, which is used in schematic diagrams.

FIG. 32A shows the internal configuration of the logic 6, while FIG. 32B shows the appropriate symbol which is used in schematic diagrams.

Figure 33:
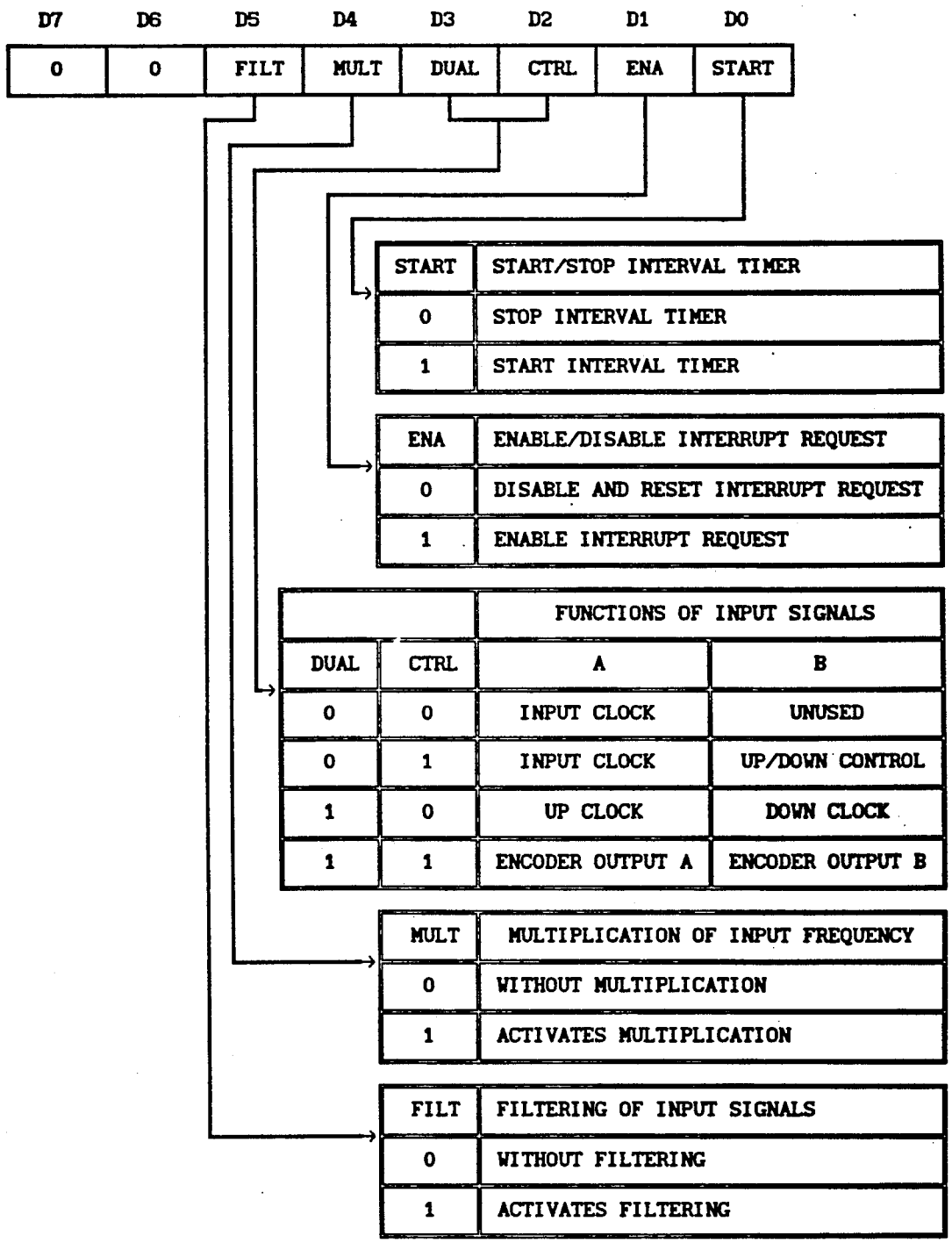
FIG. 33 shows the digital control byte which has to be written into the control storage device for the control of the embodiment of this invention.

FIG. 33 shows the digital control byte with the detailed summary of all control input signals (FILT, MULT, DUAL, CTRL, ENA and START). This byte should be written into the control storage device 5, in order to establish control of the embodiment of this invention.

Before start of a frequency measurement, the content $N_c$ is stored into the modulus storage device 1. This content is determined by the desired constant sampling time $T_s$, according to the formula $N_c = f_c \cdot T_s - 1$. The content $N_c$ of the modulus storage device 1 is also stored into the interval timer 2 before start of the frequency measurement.

The measurement is performed after writing the appropriate control information (see FIG. 33) into the control storage device 5 with the high level of the control input START. However, in general case, the reference clock RCLK is not synchronized with write signal $\overline{\text{WR}}$ on the computer bus 11. The control signal START from the control storage device 5 is synchronized in DFF 622 in order to obtain signal $\overline{\text{RUN}}$ (FIG. 32A). The output LOAD is generated before the start of the measurement, and each time when terminal count TC is generated. According to this description of signal LOAD operation, this signal is generated using OR-gate 602.

If the control input START is low, the content of DFF 622 is low, and its complementary output $\overline{\text{RUN}}$ is high, so the output LOAD is high, disregarding the terminal count TC. In this case, a content of the modulus storage device 1 is permanently stored into the interval timer 2 at each rising edge of CLK. Therefore, the counting of the interval timer 2 is disabled while START is low. If the control input START is high, the content of DFF 622 is high, and its complementary output $\overline{\text{RUN}}$ is low, so the output signal LOAD is identical to the terminal count TC. Therefore, LOAD is high, while the terminal count TC is high.

The computers (microprocessors, microcontrollers etc.) recognize the interrupt request INT either as a signal edge (rising or falling) or as a signal level (high or low). The interrupt request INT interrupts the execution of the computer current program and activates interrupt service routine. An interrupt request INT is generated as a response of a terminal count pulse TC, which duration is one period of the clock CLK. In order to provide the proper detection of each interrupt request INT, a duration of an interrupt request INT has to be long enough. The appropriate logic additionally enables or disables the generation of an interrupt request INT according to the control input ENA. The low level of the control input ENA is passed to the DFF 621 through the AND-gate 611, performing the synchronous reset of the DFF 621 at next rising edge of the clock CLK. Therefore, if ENA is low, no interrupt request INT can be generated and even already existing INT is reset. The high level of the control input ENA will pass the output of OR-gate 601 to the DFF 621. In this case, the low level of the output INT remains low, if the input TC is low. However, the high level of the input TC will set the DFF 621 at next rising edge of clock CLK, so INT will be high. After that, the DFF 621 retains its high level of the output INT, due to feedback through the OR-gate 601 and the AND-gate 611, while ENA is high. The interrupt request is reset using procedure already described above, by low level of the control input ENA. Next interrupt request is possible only if the control input ENA is high. Therefore, the high level of the control input ENA is enabling interrupt request, and low level of ENA is reset and disabling interrupt request.

Principle operation of the embodiment of this invention will be discussed using the general block schematic from FIG. 1.

The reference clock RCLK, which frequency $f_c$ is known and predetermined:
decrements the interval timer 2.

The measured clock LOAD1, which frequency $f_M$ is measured, is used to:
enable counting in up or down direction of the pulse counter 8, depending on the up/down direction of counting control U/$\overline{D}$; and
store a content of the interval timer 2 into the timer storage device 3.

Therefore, the effects of the measured clock LOAD1 are: the content of the timer storage device 3 is the content of the interval timer 2 at the same moment, when the content of the pulse counter 8 is changed. The period of the measured clock LOAD1 is a time interval between two successive pulses of the same clock, and can be calculated as a difference between two successive contents of the timer storage device 3.

The load signal LOAD0 is used to:
load a content $N_c$ of the modulus storage device 1 into the interval timer 2;

Therefore, the effect of the load signal LOAD0 is the constant sampling time $T_s=(N_c+1)/f_c$, determined by the content $N_c$ of the modulus storage device 1, and the frequency $f_c$ of the reference clock RCLK.

The sampling clock LOAD2 is used to:
store a content of the timer storage device 3 into the additional storage device 4; and
store a content of the pulse counter 8 into the counter storage device 9.

Therefore, the effects of the sampling clock LOAD2 are: the content of the additional storage device 4 is the content of the timer storage device 3, while the content of the counter storage device 9 is the content of the pulse counter 8. Both mentioned contents are corresponding to the same moment, determined by the last pulse of measured clock LOAD1, before the terminal count TC has been activated at the end of the sampling time.

The interrupt request INT is initiated also by the terminal count TC. The approach used in this invention eliminates all problems associated with the readings of the timer/counter during counting. Suppose, for a discussion purposes, that the additional storage device 4 and the counter storage device 9 are not used in the DB system in FIG. 1, and that computer 10 directly reads contents of the timer storage device 3 and the pulse counter 8 in an interrupt service routine. The contents of the timer storage device 3 and the pulse counter 8 are changing in the same moment, and very fast if frequency $f_M$ of measured clock LOAD1 is comparable with frequency $f_c$ of the reference clock RCLK.

This makes serious problems for read operation by the computer 10:

1. Generally speaking, the reference clock RCLK is not synchronized with the read signal $\overline{RD}$ on the computer bus 11. This makes well known synchronization problem during read operation, if the read signal from the computer 10 is applied during change of a content of the timer storage device 3 or during change of a content of the pulse counter 8. This problem can be solved using ready (acknowledge) signal to the computer 10, which is well known and wide used solution.

2. The other problem appears due to separate read operation of the timer storage device 3 and read operation of pulse counter 8. For example, let the timer storage device 3 is read first, and the pulse counter 8 is read after that. If at least one pulse of the measured clock LOAD1 is obtained between these two readings, a content of the pulse counter 8 is changed and is not anymore appropriate to the content of the timer storage device 3 which has been already read. This problem can be solved with another read operation and software comparison with previous content, which is well known and wide used solution. However, this solution strongly decreases maximum frequency of measured clock LOAD1, which can be measured, due to requirements for absence of pulses of the measured clock LOAD1 during several computer instructions used for the read and comparison.

Both presented problems are inherently solved using the additional storage device 4 and counter storage device 9.

The several embodiments are investigated for the same block schematic from FIG. 1. Those embodiments have been realized in two technologies:

A) SEVERAL INTEGRATEDE CIRCUITS (counters, registers, programmable logic)

The complete hardware of this invention is currently available on the printed circuit board (PCB) for PC/AT computers. The complex software package (around 30,000 lines) in C++ programming language is developed for demonstration of all features of this invention, providing menu system for setup, frequency measurement, file and memory operations and display of measured data versus time.

B) SINGLE INTEGRATED CIRCUIT (SINGLE CHIP)

Such dedicated single chip is usually called ASIC ("Application Specific Integrated Circuit") and can be made in the form of FPGA ("Field Programmable Gate Arrays"), EPLD ("Erasable Programmable Logic Devices"), Gate Arrays, Standard Cells or Custom Integrated Circuits. The complete hardware of this invention is currently available in EPM5128J (EPLD product of ALTERA), which is also mounted on the PCB for PC/AT.

Those embodiments are based on different realizations of storage devices, described in FIG. 34. Several preferred embodiments have been built inside the ALTERA EPLD EPM5128J, according to FIG. 35, FIG. 36, FIG. 38, FIG. 40, FIG. 42 and FIG. 44. The number of bits of the modulus storage device 1, interval timer 2, timer storage device 3 and additional storage device 4 is M, while in further text a general number N is used, due to simplicity. The number of bits of the pulse counter 8 and counter storage device 9 is P, while in further text a general number N is used, due to simplicity. The number of bits of the control storage device 5 is K, while in further text general number N is used, due to simplicity. The appropriate global timing diagrams illustrating the difference between those embodiments are given in FIG. 37 (for FIG. 36), FIG. 39 (for FIG. 38), FIG. 41 (for FIG. 40), FIG. 43 (for FIG. 42) and FIG. 45 (for FIG. 44).

It can be noticed that the content $N_C=6$ of the modulus storage device 1 in these timing diagrams shows the case of no practical value, which is used only to present the timings of all significant signals. Any application of this invention will be characterized by the content $N_C$ of the modulus storage device 1 much greater than used in this example, due to the requirements of desired sampling time $T_S=(N_C+1)/f_C$, and minimizing a relative measurement error, which will be discussed further. In this example, the frequency $f_M$ of the measured clock LOAD1 is $f_M=f_C \cdot N_P/N_T=f_C/4$. This frequency is proportional to the frequency f of external signals A and B according to $f_M=H \cdot f$, where H is a multiplication factor, which is 1, 2 or 4, depending on the signal decoder mode used. It can be also noticed that in this example, the up/down pulse counter 8 is always counting down. The duration of the interrupt request INT is arbitrary, and depends on the moment at which the control input ENA reset the DFF 621 inside the logic 6.

The first reason for presenting those embodiments is to show the universality of the basic configuration of this invention, which makes it applicable to all technologies, mentioned above. The second reason is the complexity of used storage devices. For example, anyone who is skilled in the art knows, that the complexity of the DFF (FIG. 4A) in CMOS technology is twice the complexity of the LATCH (FIG. 6) in the same technology. It is also obvious from FIG. 9A that the complexity of the SYNC DFF is greater than the complexity of DFF, due to the presence of the MUX (FIG. 8). It is also obvious from FIG. 11A that the complexity of the SYNC LATCH is greater than the complexity of the LATCH, due to the presence of the MUX (FIG. 8). Therefore, it can be concluded that, the complexities of those storage devices in CMOS technology, can be shown in an increasing order, as follows:

, LATCH < SYNC LATCH < DFF < SYNC DFF

The write access is used for both modulus storage device 1 and control storage device 5. The read access is used for both additional storage device 4 and counter storage device 9. This read access is performed either in an initialization procedure before the measurement, or in an interrupt service routine when contents of these devices are stable. Therefore, any acknowledge or inhibit logic for the inhibition of read and write operations during the change of the contents, is unnecessary. In the preferred embodiment, all read and write signals for the M=16 bits of the internal timer 2, P=16 bits of the pulse counter 8 and K=8 bits of the control storage device 5 are derived from the signals:

$\overline{CS}$ = measurement system selection derived from the range of the addresses from the computer address bus 1200

$\overline{WR}$ = write signal from the computer 10
$\overline{RD}$ = read signal from the computer 10
A1 = latched address A1 from the computer 10

The access signals are:
$\overline{WR0}=\overline{CS}+\overline{WR}+A1$ write to the modulus storage device 1
$\overline{WR1}=\overline{CS}+\overline{WR}+\overline{A1}$ write to the control storage device 5
$\overline{RD0}=\overline{CS}+\overline{RD}+A1$ read from the additional storage device 4
$\overline{RD1}=\overline{CS}+\overline{RD}+\overline{A1}$ read from the counter storage device 9

Figure 36:
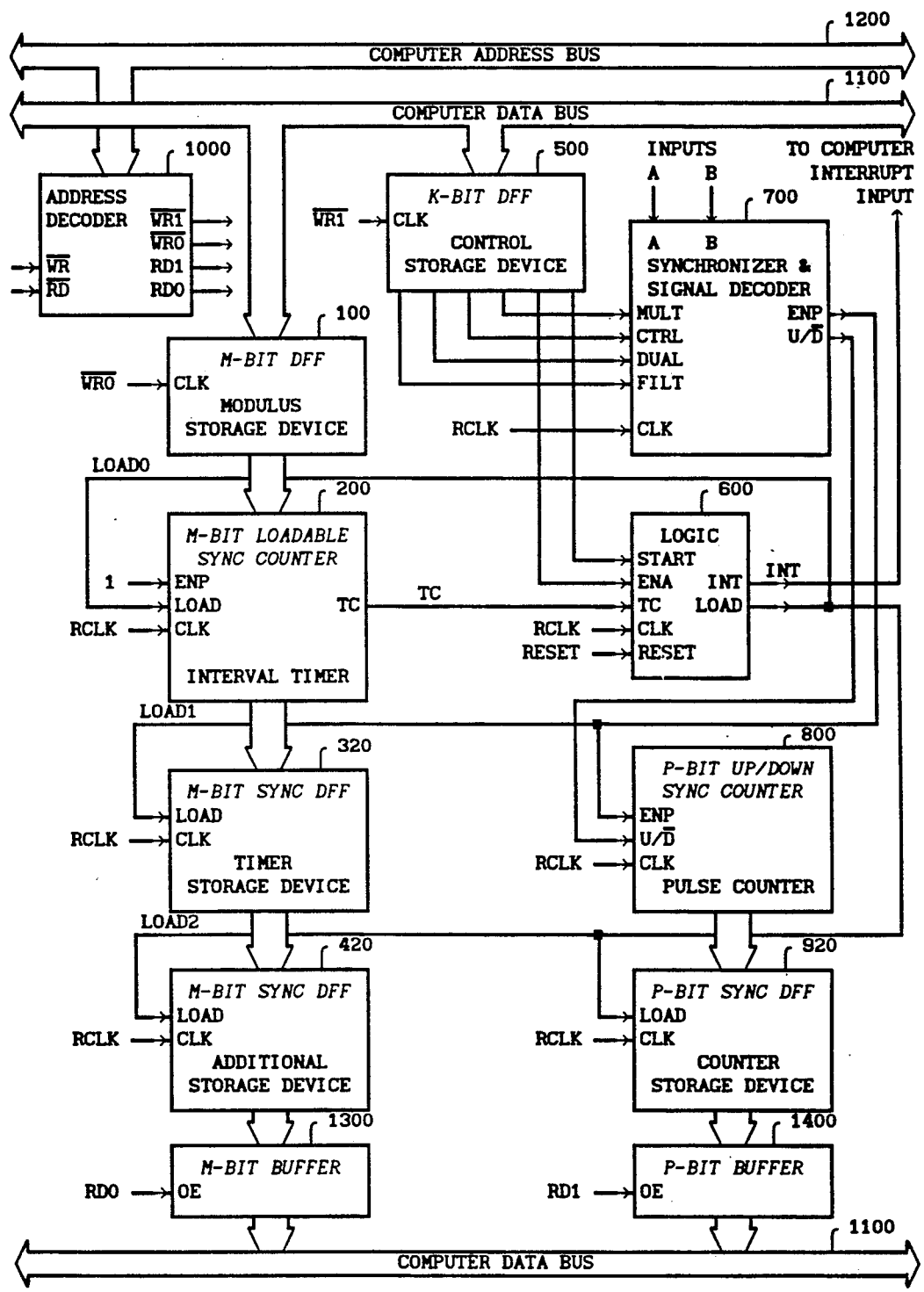
FIG. 36 shows the first preferred embodiment, which is specially suitable for the integration into an EPLD ("Erasable Programmable Logic Devices") or FPGA ("Field Programmable Gate Arrays") with enough macrocells for the whole hardware of this invention.

FIG. 36 shows the first preferred embodiment, which is specially suitable for the integration into an EPLD or FPGA with enough macrocells for the whole hardware of this invention. The modulus storage device 100 and the control storage device 500 are made of N-BIT DFFs, while the timer storage device 320, additional storage device 420 and the counter storage device 920 are made of N-BIT SYNC DFFs. The address decoder 1000 generates write signals $\overline{WR0}$ for the modulus storage device 100 and $\overline{WR1}$ for the control storage device 500 on the basis of the addresses from the computer address bus 1200 and the computer write signal $\overline{WR}$. Since data on the computer data bus 1100 are valid at rising edge of $\overline{WR}$, all DFFs with appropriate CLK signal will load this data at rising edge of CLK. The address decoder 1000 also generates read signals RD0 for the N-BIT BUFFER 1300 and RD1 for the N-BIT BUFFER 1400, on the basis of the addresses from the computer address bus 1200 and the computer read signal $\overline{RD}$.

The measured clock LOAD1 (which frequency $f_M$ is measured) is used for both the enable counting control ENP of the pulse counter 800, which is made as N-BIT UP/DOWN SYNC COUNTER and the load LOAD of the timer storage device 320, which is made as N-BIT SYNC DFF. The sampling clock LOAD2 is applied to the load control LOAD of the additional storage device 420 and the counter storage device 920, which are also made as N-BIT SYNC DFF. The signal LOAD0 equal to LOAD2 is used for the LOAD of the interval timer 200, which is made as N-BIT LOADABLE SYNC COUNTER.

All critical parts of the first preferred embodiment of this invention are completely synchronous with the reference clock RCLK, which eliminate any synchronization problem during all required store operations.

Therefore, this is at same time the best performance and the most complex solution for the hardware of this invention. Each macrocell in an EPLD consists of a flip-flop (of appropriate type) and some logic between the outside of a macrocell and this flip-flop. Therefore, the SYNC DFF do not require any additional logic, except already existing logic inside the macrocell. This will also increase the performances, specially at high frequencies $f_C$ of the reference clock RCLK, because it does not produce no additional propagation delays.

Figure 37:
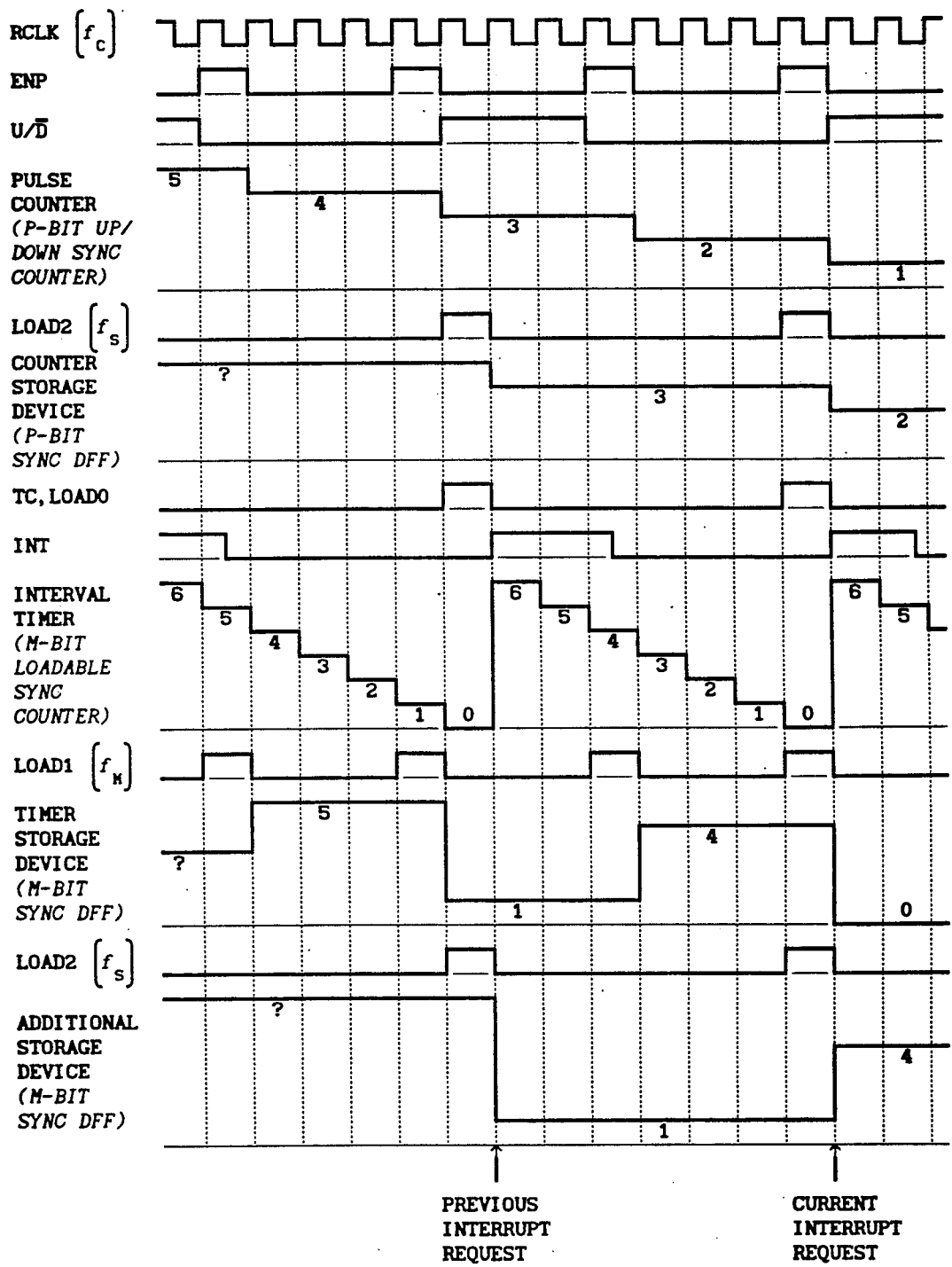
FIG. 37 shows the timing diagrams of the operation of the first preferred embodiment from FIG. 36.

FIG. 37 shows the timing diagrams of the operation of the first preferred embodiment from FIG. 36. When a content of the pulse counter 800 is changed from (5) to (4), a content (5) of the interval timer 200 is stored into the timer storage device 320. When a content of the pulse counter 800 is changed from (4) to (3), a content (1) of the interval timer 200 is stored into the timer storage device 320. When a content of the pulse counter 800 is changed from (3) to (2), a content (4) of the interval timer 200 is stored into the timer storage device 320. When a content of the pulse counter 800 is changed from (2) to (1), a content (0) of the interval timer 200 is stored into the timer storage device 320. For example, difference between contents (5) and (1) of the timer storage device 320 gives period of measured clock LOAD1 equal to (4) periods of the reference clock RCLK.

The pulse difference $N_P$ is a number of pulses of the reference clock RCLK, during the high level of the measured clock LOAD1, determined according to the formula (9), as a difference between a content $C_1$ of the counter storage device 920, which has been read in the previous interrupt routine and a content $C_2$ of the counter storage device 920, which has been read in the current interrupt routine. Since $C_1=3$ and $C_2=2$, the pulse difference is $N_P=1$.

$$, N_P = C_1 - C_2 \tag{9}$$

The time difference $N_T$ is a number of reference clock RCLK periods, determined according to the formula (10), as a difference between a content $A_1$ of the additional storage device 420, which has been read in the previous interrupt routine and a content $A_2$ of the additional storage device 420, which has been read in the current interrupt routine. Since $A_1=1$ and $A_2=4$, the time difference is $N_T=4$.

$$, N_T = N_C - A_2 + A_1 + 1 \tag{10}$$

The frequency $f_M$ of the measured clock LOAD1 is calculated according to the formula (11):

$$, f_M = f_C \cdot N_P / N_T \tag{11}$$

Figure 38:
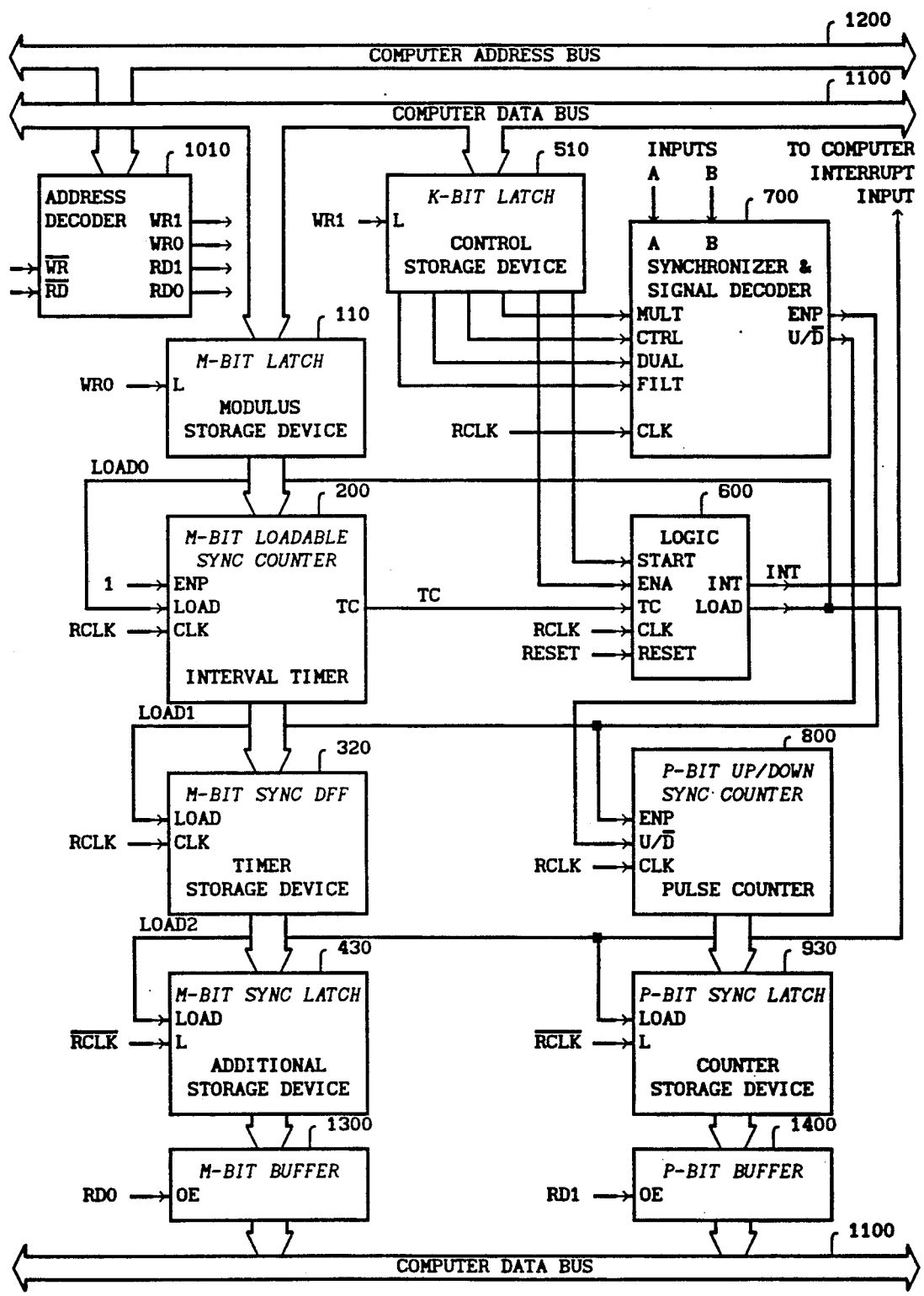
FIG. 38 shows the second preferred embodiment, which is suitable for the integration into an EPLD or FPGA, with less available macrocells than required to cover the whole hardware of this invention.

FIG. 38 shows the second preferred embodiment, which is suitable for the integration into an EPLD or FPGA, with less available macrocells than required to cover the whole hardware of this invention. The modulus storage device 110 and the control storage device 510 are made of N-BIT LATCHes, the timer storage device 320 is made as N-BIT SYNC DFF, while both additional storage device 430 and the counter storage device 930 are made of N-BIT SYNC LATCHes. The address decoder 1010 generates write signals WR0 for the modulus storage device 110 and WR1 for the control storage device 510 on the basis of the addresses from the computer address bus 1200 and the computer write $\overline{WR}$. Since data on the computer data bus 1100 are valid at rising edge of $\overline{WR}$, all LATCHes with appropriate L signal will latch this data at falling edge of L. The address decoder 1010 also generates read signals RD0 for the N-BIT BUFFER 1300 and RD1 for the N-BIT BUFFER 1400, on the basis of the addresses from the computer address bus 1200 and the computer read signal $\overline{RD}$.

The modulus storage device 110 and the control storage device 510 can be also realized using the logic separated from the macrocells inside the EPLD or FPGA (first example are latches associated with I/O pins in a FPGA from XILINX, and second example are expander product terms associated with the macrocells in an EPLD from ALTERA). The SYNC LATCHes in the additional storage device 430 and the counter storage device 930 will latch the data present on their inputs at the falling edge of the control input L. Since the inverted reference clock $\overline{RCLK}$ is feeding this control input, the appropriate data will be latched at rising edge of the reference clock RCLK, which provides practically the same results and same performances as first preferred embodiment.

All critical parts of second preferred embodiment of this invention are completely synchronous with the reference clock RCLK, which eliminate any synchronization problem during all required store operations. Therefore, this embodiment is also preferably in any other technology, where the performances are imperative, due to equal performances with less complexity.

Figure 39:
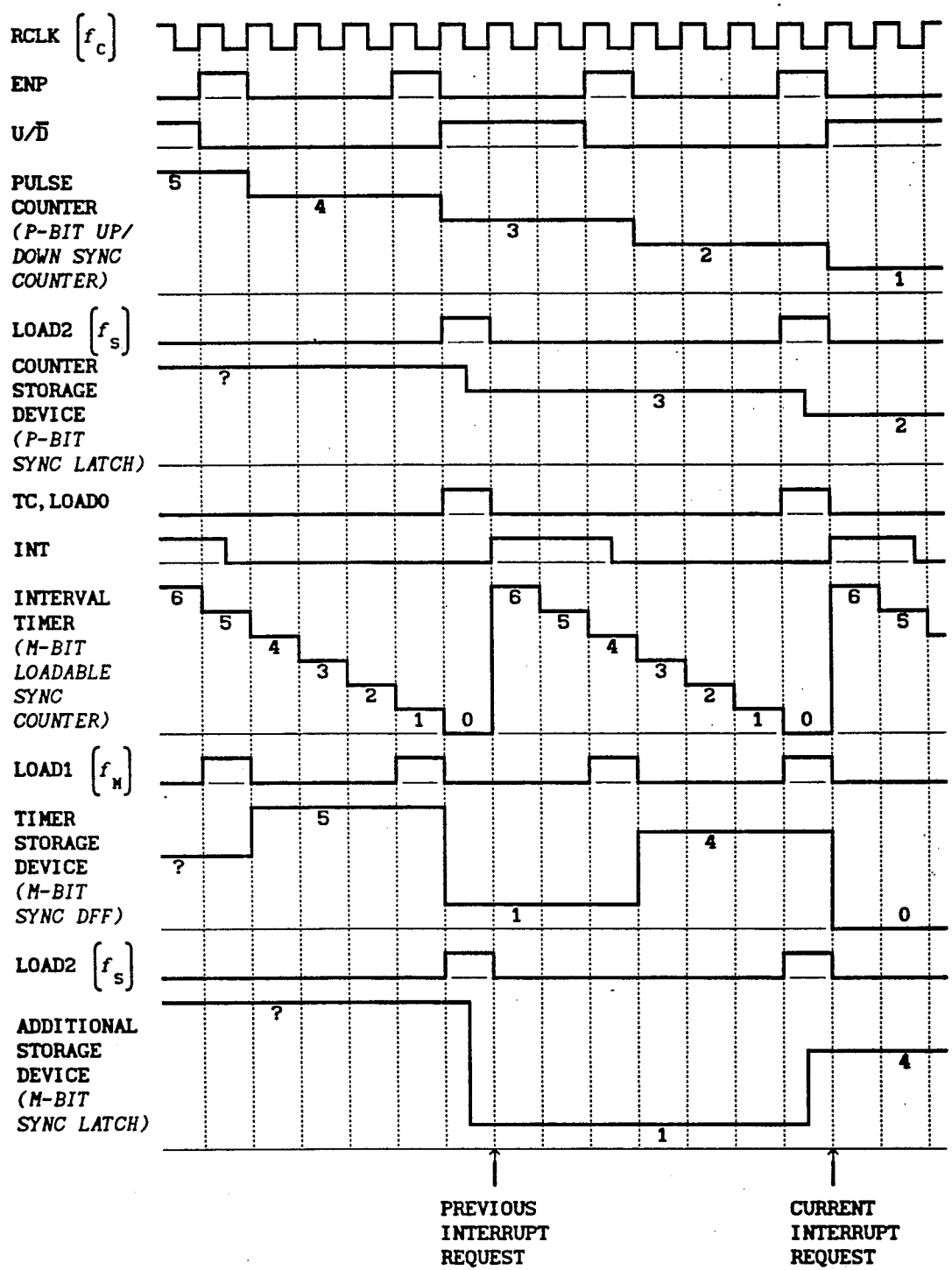
FIG. 39 shows the timing diagrams of the operation of the second preferred embodiment from FIG. 38.

FIG. 39 shows the timing diagrams of the operation of the second preferred embodiment from FIG. 38. Since the timer storage device 320 is the same as for the first preferred embodiment, the result of the measured clock LOAD1 is the same. Since the N-BIT SYNC LATCHes controlled by the inverted reference clock $\overline{RCLK}$ are used as the additional storage device 430 and the counter storage device 930, the appropriate contents of these storage devices are present on their outputs one half of the reference clock RCLK period before, than in the timings of first preferred embodiment. However, the latching operations are performed at the same time than in the first preferred embodiment, so the pulse difference, time difference and calculated frequency of the measured clock are the same as in the timings for the first preferred embodiment.

Figure 40:
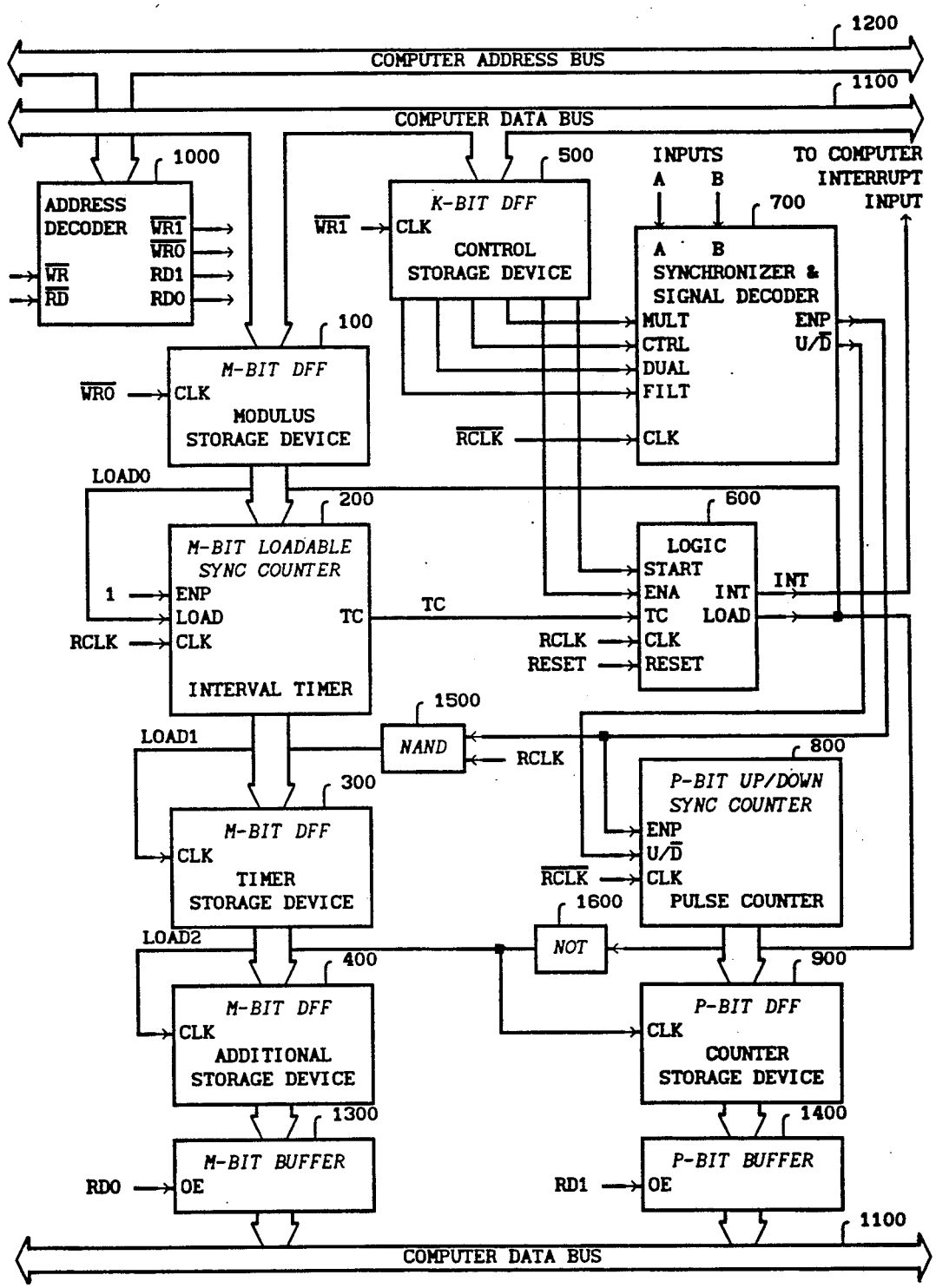
FIG. 40 shows the third preferred embodiment, which is specially suitable for the integration into the standard cells technology with enough area of silicon available for the whole hardware of this invention.

FIG. 40 shows the third preferred embodiment, which is specially suitable for the integration into the standard cells technology with enough area of silicon available for the whole hardware of this invention. The modulus storage device 100, control storage device 500, timer storage device 300, additional storage device 400 and counter storage device 900 are made of N-BIT DFFs. The access to storage devices is provided using the address decoder 1000, which is explained above for the first preferred embodiment.

The elimination of synchronization problems during all required store operations is provided by the synchronization with the reference clock RCLK and the inverted reference clock $\overline{RCLK}$.

The output ENP of the synchronizer and signal decoder 700 is used only for the enable counting control ENP of the pulse counter 800, which is made as N-BIT UP/DOWN SYNC COUNTER. During the measurement of maximum input frequency, if frequency multiplication is on, the pulse counter 800 can count each rising edge of the inverted reference clock $\overline{RCLK}$. However, in this case, the frequency of the enable counting signal control ENP is zero. Therefore, this signal can not be used directly as LOAD for the timer storage device 3, because it will decrease the available frequency range. Instead of that, ENP is used as a gate signal for the reference clock RCLK in NAND-gate 1500, in order to derive the measured clock LOAD1 applied to the LOAD of the timer storage device 300. A content of the interval timer 2 is changed at the rising edge of the reference clock RCLK. A content of the interval timer 2 is stored into the timer storage device 3 at each rising edge of the signal LOAD1, which is synchronized with the falling edge of the reference clock RCLK. Therefore, the content of the interval timer 2 is stable and can be stored without any problems.

The signal LOAD0 applied to the LOAD of the interval timer 200.

A content of the timer storage device 300 is stored into the additional storage device 400, and a content of the pulse counter 800 is stored into the counter storage device 900, at the rising edge of the signal LOAD2, which is synchronized with the rising edge of the reference clock RCLK. Since both contents of the timer storage device 300 and the pulse counter 800 are changed at the falling edge of the reference clock RCLK, they are both stable at the rising edge of the reference clock RCLK, and store operations can be performed without synchronization problems. The signal LOAD2 is the inverted signal LOAD0, after passing through the NOT-gate 1600. The only purpose of this gate is to provide these store operations during the start of the measurement.

The third preferred embodiment of this type has been also realized in technology of separate integrated circuits. However, this embodiment is also preferable in technology of standard cells, where large number of N-BIT DFFs is available, due to less complexity comparing with the first preferred embodiment.

Figure 41:
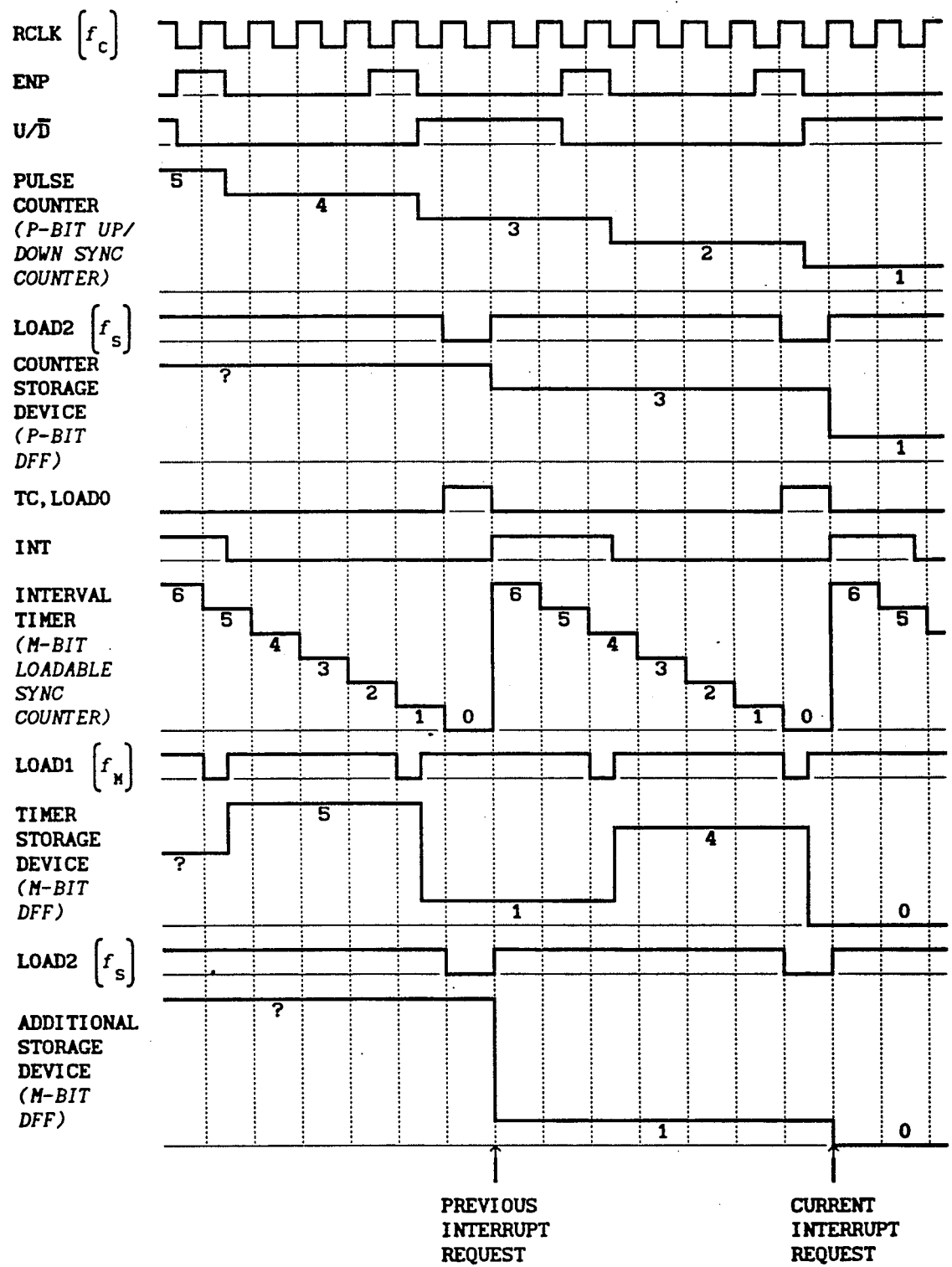
FIG. 41 shows the timing diagrams of the operation of the third preferred embodiment from FIG. 40.

FIG. 41 shows the timing diagrams of the operation of the third preferred embodiment from FIG. 40. Since $C_1=3$ and $C_2=1$, the pulse difference is $N_P=2$. Since $A_1=1$ and $A_2=0$, the time difference $N_T=8$. Therefore, the frequency $f_M$ of the measured clock LOAD1 is $f_M=f_C/4$.

Figure 42:
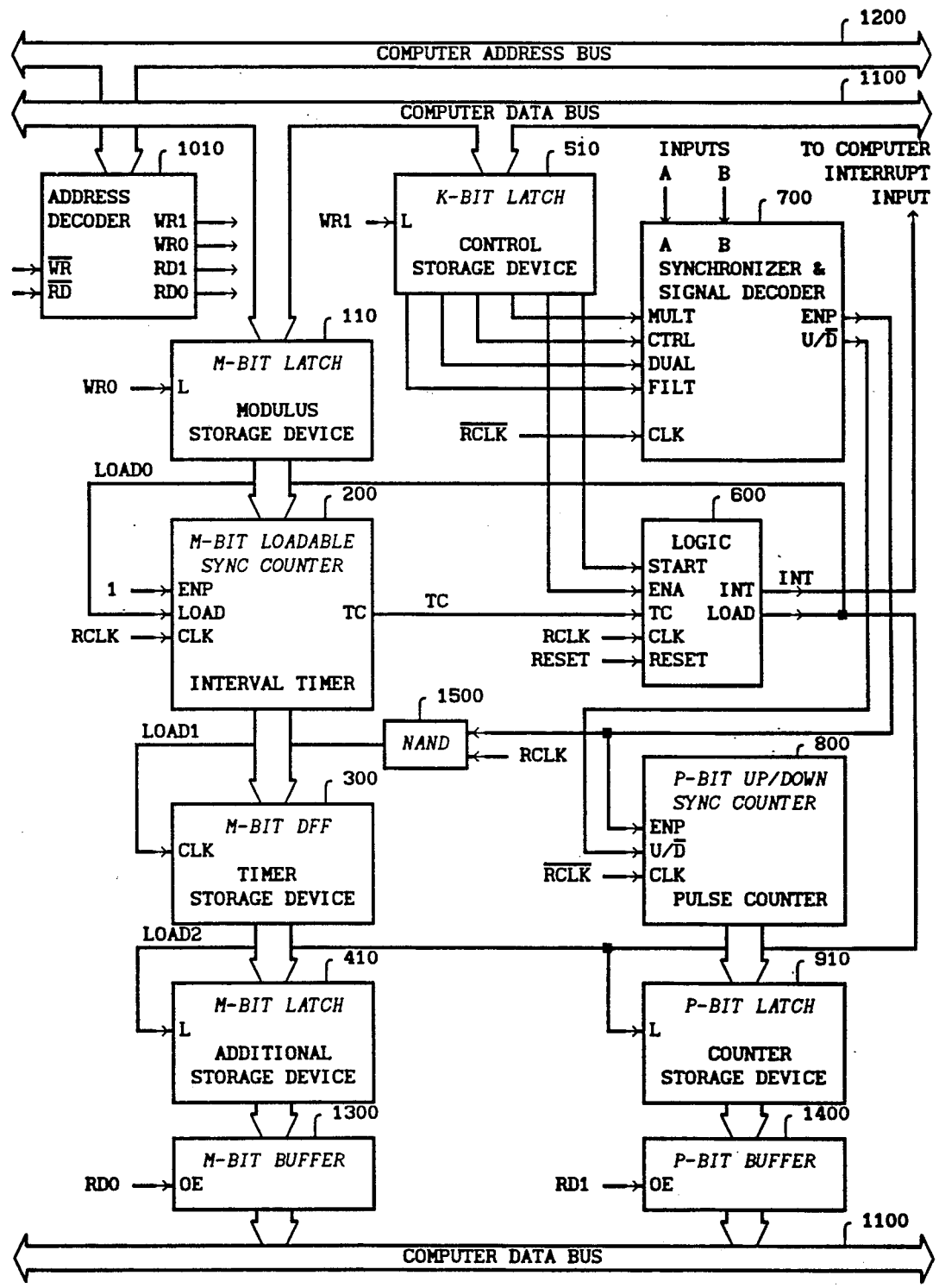
FIG. 42 shows the fourth preferred embodiment, which is suitable for the integration into a design with small area of silicon provided for the hardware based on this invention.

FIG. 42 shows the fourth preferred embodiment, which is suitable for the integration into a design with small area of silicon provided for the hardware based on this invention. The modulus storage device 110 and the control storage device 510 are made of N-BIT LATCHes, the timer storage device 300 is made of N-BIT DFF, while both additional storage device 410 and the counter storage device 910 are also made of N-BIT LATCHes. The access to storage devices is provided using the address decoder 1010, which is explained above for the second preferred embodiment.

The elimination of synchronization problems during all required store operations is provided by the synchronization with the reference clock RCLK and the inverted reference clock $\overline{RCLK}$.

The generation of the signal LOAD1 is the same as for the third preferred embodiment. However, the signal LOAD2 is equal to the signal LOAD0, due to N-BIT LATCHes. Therefore, at the moment of the measurement start, the high-to-low transitions of the signal LOAD2 provide latching of a content of the timer storage device 300 into the additional storage device 410, and a content of the pulse counter 800 into the counter storage device 910. During the measurement, the signal LOAD 2 is equal to the signal LOAD0, synchronized with the reference clock RCLK, which provides latching of above contents after the rising edge of the reference clock RCLK.

Figure 43:
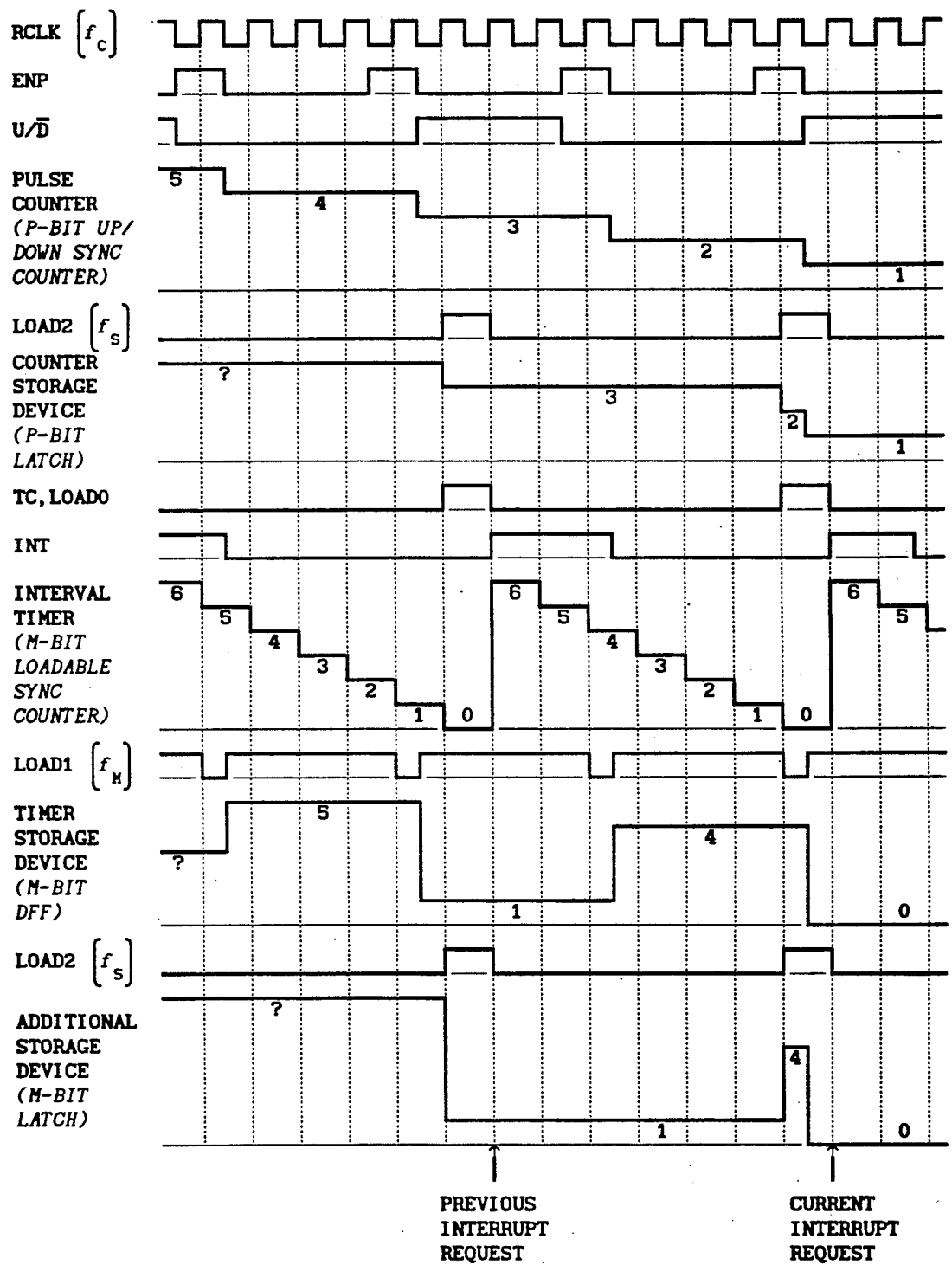
FIG. 43 shows the timing diagrams of the operation of the fourth preferred embodiment from FIG. 42.

FIG. 43 shows the timing diagrams of the operation of the fourth preferred embodiment from FIG. 42. Since the timer storage device 300 is the same as for the third preferred embodiments, the effects of the measured clock LOAD1 are the same. Since the B-BIT LATCHes are used for the additional storage device 410 and the counter storage device 910, the appropriate contents of these storage devices are present on their outputs one period of the reference clock RCLK before, than in the timings of third preferred embodiment. However, the latching operations are performed at the same time than in the third preferred embodiment, so the pulse difference, time difference and calculated frequency of the measured clock are the same as in the timings for the third preferred embodiment.

Figure 44:
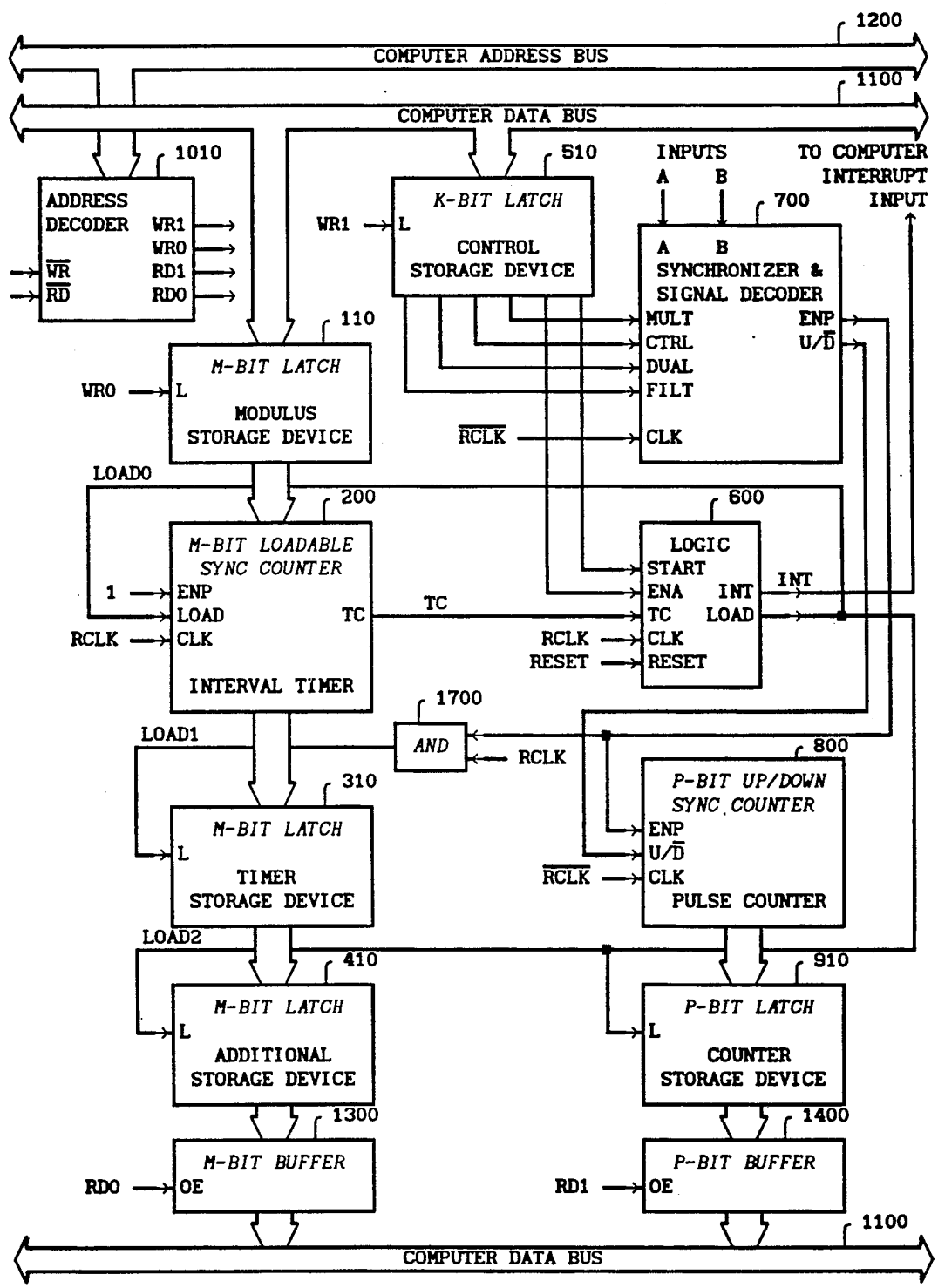
FIG. 44 shows the fifth simplest preferred embodiment, which is suitable for the integration into a design with very small area of silicon available for the hardware based on this invention.

FIG. 44 shows the fifth simplest preferred embodiment, which is suitable for the integration into a design with very small area of silicon available for the hardware based on this invention. The modulus storage device 110, control storage device 510, timer storage device 310, additional storage device 410 and counter storage device 910 are made of N-BIT LATCHes. The access to storage devices is provided using the address decoder 1010, which is explained above for the second preferred embodiment.

The elimination of synchronization problems during all required store operations is provided by the synchronization with the reference clock RCLK and the inverted reference clock $\overline{RCLK}$.

Since latching occurs at the falling edge of the control input LOAD of the timer storage device 310, which must be synchronized with the falling edge of the reference clock RCLK, an AND-gate 1700 is provided for this purpose. The signal LOAD2 is the same as for the fourth preferred embodiment.

Figure 45:
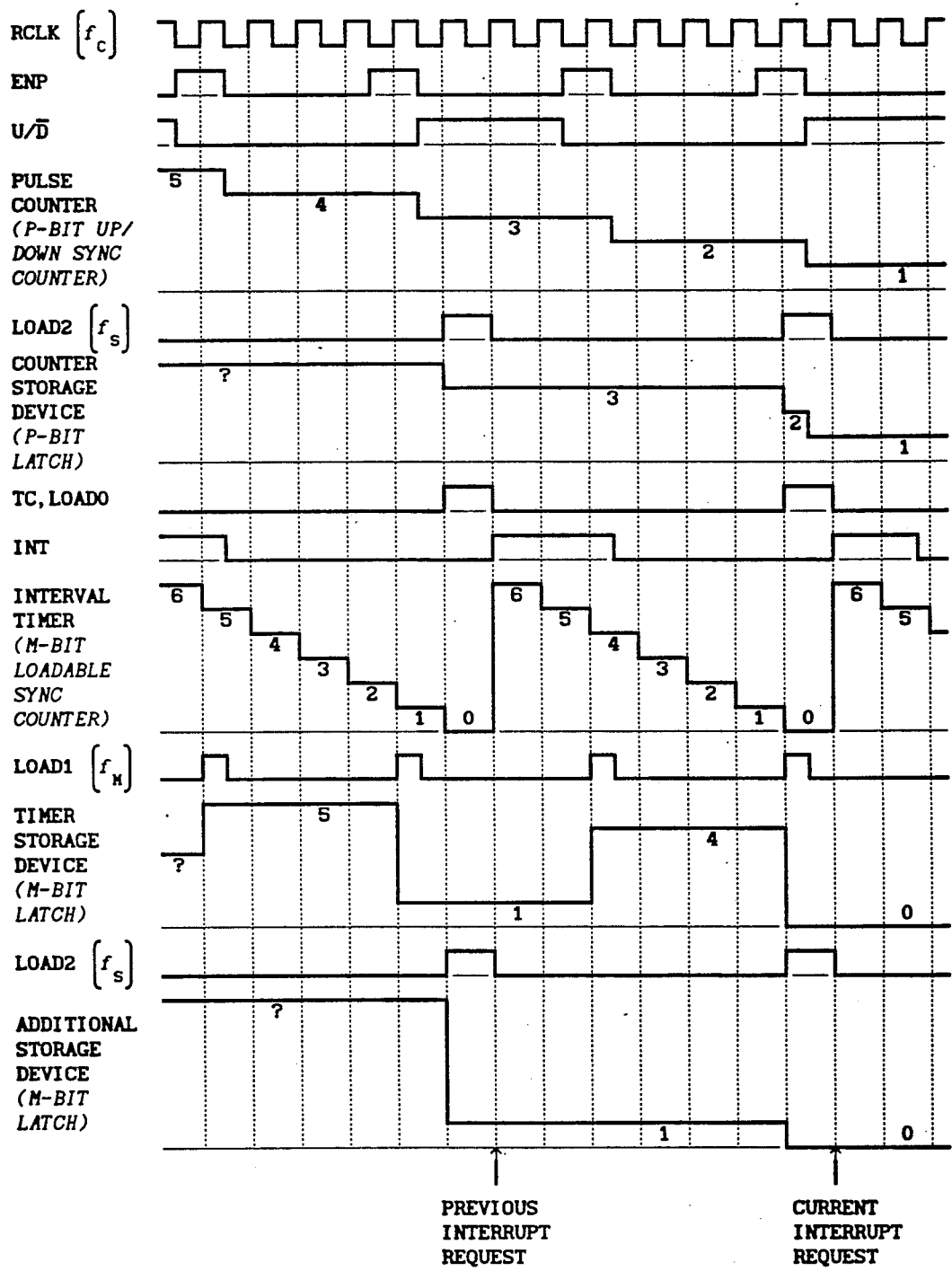
FIG. 45 shows the timing diagrams of the operation of the fifth preferred embodiment from FIG. 44.

FIG. 45 shows the timing diagrams of the operation of the fifth preferred embodiment from FIG. 44. Since the N-BIT LATCH is used for the timer storage device 310, the appropriate content of this storage device is present on its output one period of the reference clock RCLK before, than in the timings of fourth preferred embodiment. However, the latching operation is performed at the same time than in fourth preferred embodiment, so the latched contents are the same as for the timings of the fourth preferred embodiment, which makes the effects of the measured clock LOAD1 the same. Since the additional storage device 410 and the counter storage device 910, are the same as for the fourth preferred embodiment, the pulse difference, time difference and calculated frequency of the measured clock are the same as in the timing for the fourth preferred embodiment.

Figure 46:
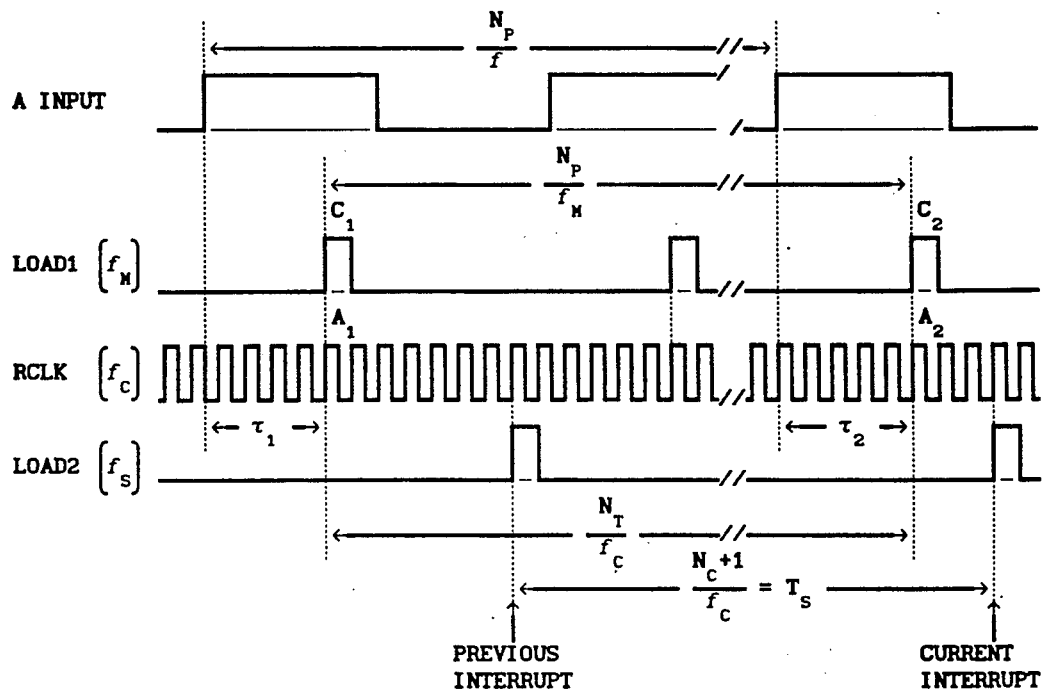
FIG. 46 shows the timing diagrams for the calculation of an error during the measurement performed according to the DB method.

FIG. 46 shows the timing diagrams for the calculation of an error during the measurement, where the delay in the synchronizer and signal decoder 7 is constant and equal to 4 periods of the reference clock RCLK. A difference between contents $A_1$ and $A_2$ of the additional storage device 4 in the previous and the current interrupt routine is used to obtain a time difference $N_T$. A difference between contents $C_1$ and $C_2$ of the counter storage device 9 in the previous and the current interrupt routine is used to obtain a pulse difference $N_P$. If input frequency is less than the half of the frequency $f_C$ of the reference clock RCLK, no pulses are missing due to the synchronization.

An average frequency f of input signals A and B before the synchronization can be determined using unknown synchronization times $\tau_1$ and $\tau_2$ according to the relation (12). The synchronization time $\tau_1$ is a sum of a fixed delay of 4 reference clock periods $4/f_C$ caused by the synchronizer and signal decoder 7 and an unknown fraction $\tau_1'$ of the period $1/f_C$ of the reference clock, caused by the synchronization process (13). The synchronization time $\tau_2$ is a sum of a fixed delay of 4 reference clock periods $4/f_C$ caused by the synchronizer and signal decoder 7 and an unknown fraction $\tau_2'$ of the period $1/f_C$ of the reference clock, caused by the synchronization process (13). Considering $\tau_1-\tau_2=\tau_1'-\tau_2'$ negligible comparing with $N_T$, and H·f almost equal to frequency $f_M$ of the measured clock LOAD1, where H is a frequency multiplication factor (1, 2 or 4), it is possible to derive a relation (14). If both inputs A and B are coupled with an encoder, attached to a shaft, an angular speed n in rpm (revolutions per minute) is derived using a number of encoder marks per turn E (15). Therefore, the measured frequency $f_M$ should be calculated at first place, because the frequency f of input signals, or an angular speed n of a shaft are directly proportional to $f_M$. Therefore, all flowcharts in further text are devoted to the calculation of $f_M$.

$$\tau_1 + \frac{N_T}{f_C} = \tau_2 + \frac{N_P}{H \cdot f} \quad (12)$$

$$\begin{cases} \tau_1 = \tau'_1 + \frac{4}{f_C}, & \tau'_1 \leq \frac{1}{f_C} \\ \tau_2 = \tau'_2 + \frac{4}{f_C}, & \tau'_2 \leq \frac{1}{f_C} \end{cases} \quad (13)$$

$$H \cdot f = f_C \frac{N_P}{N_T + f_C \cdot (\tau_1 - \tau_2)} \approx f_M = f_C \frac{N_P}{N_T} \quad (14)$$

$$n = \frac{60 \cdot f_C \cdot N_P}{E \cdot H \cdot N_T} \quad (15)$$

Figure 47:
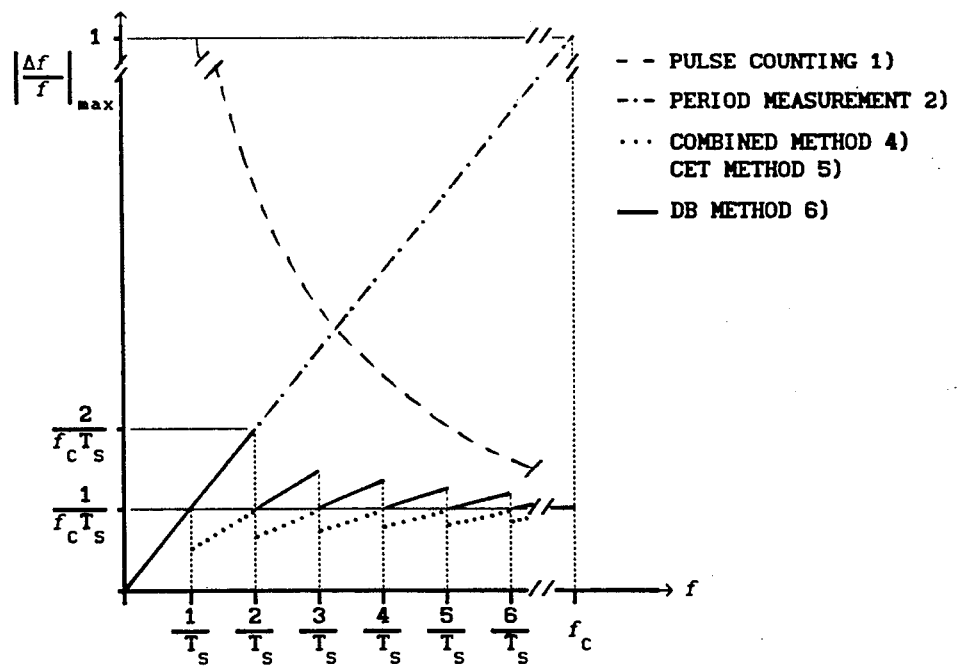
FIG. 47 is a diagram representing the relation between a maximum relative error and a measured frequency for several methods.

FIG. 47 is a diagram representing the relation between a maximum relative error and a measured frequency for several methods. The absolute (16) and relative (17) measurement errors are caused by the synchronization. The maximum relative error (18), caused by missing one count of the reference clock RCLK during each sampling time $T_S$, is within two error limits due to the unknown time shift between an input signal and the sampling clock LOAD 2. The lower error limit is identical to an error of methods 4) and 5), and is twice less than higher error limit in the worst case.

$$\Delta f = f - f_M = -f_C^2 \frac{N_P \cdot (\tau_1 - \tau_2)}{N_T + f_C \cdot (\tau_1 - \tau_2)} \quad (16)$$

$$\frac{\Delta n}{n} = \frac{\Delta f}{f} = -\frac{f_C \cdot (\tau_1 - \tau_2)}{N_T} \quad (17)$$

$$\frac{1}{f_C \cdot T_S \cdot \left(1 + \frac{1}{f \cdot T_S}\right)} \leq \left|\frac{\Delta f}{f}\right|_{max} = \quad (18)$$

$$\frac{1}{N_T} \leq \frac{1}{f_C \cdot T_S \cdot \left(1 - \frac{1}{f \cdot T_S}\right)}$$

Figure 48:
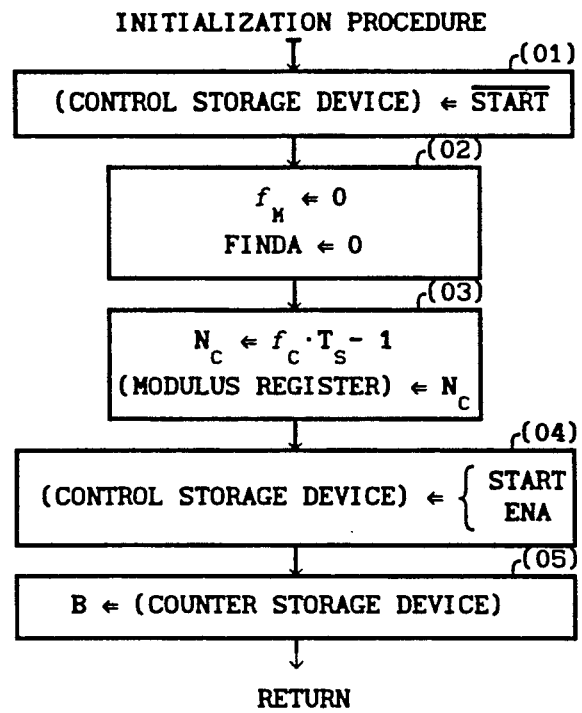
FIG. 48 shows a flowchart for explaining the initialization procedure of the DB system.

FIG. 48 shows a flowchart for explaining the initialization procedure of the DB system. In this as well as in further Figures, the numbers in the brackets denote the operational steps. In step (01), any existing measurement process is stopped by entering the proper data with bit START=0 into the control storage device 5 (see FIG. 33). In step (02) the frequency $f_M$ of the measured clock LOAD1 and the pulse existence flag FINDA (which will be explained later) are initialized to zero. In step (03), the prescribed value $N_C$ is determined on the basis of desired constant sampling time $T_S$, according to the formula $N_C=f_C \cdot T_S-1$, and is loaded into the modulus storage device 1. In step (04) the measurement process is started by entering the proper data with bits START=1 and ENA=1 into the control storage device 5 (see FIG. 33). During the start, the content $N_C$ of the modulus storage device 1 is loaded into the interval timer 2, a content of the timer storage device 3 is stored into the additional storage device 4, and a content of the pulse counter 8 is stored into the counter storage device 9. These storing operations are used to obtain the initial content of the pulse counter 8 in step (05), which is stored into the pregiven storage location B in the memory of the computer 10.

Figure 49:
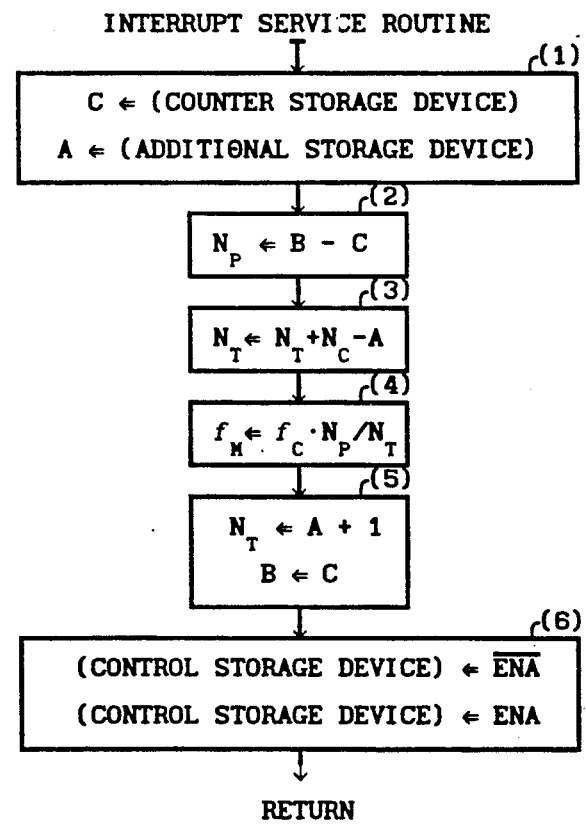
FIG. 49 shows a flowchart for explaining the basic operation of the wide range frequency measurement DB method according to this invention.

FIG. 49 shows a flowchart for explaining the basic operation of the wide range frequency measurement DB method according to this invention. After an interrupt request is generated, a program under execution is interrupted. In step (1), a content of the counter storage device 9 is stored into the third pregiven location (C) in the memory, and a content of the additional storage device 4 is stored into the first pregiven location (A) in the memory. Any pulse of the measured clock LOAD1, which is occurred between these two storing operations is unessential, because these contents were created using the sampling clock LOAD2, during the generation of the interrupt request signal. Both contents are stable during whole sampling time $T_S$, which eliminates synchronization problems during both read operations, as well as problems associated with pulses between reading of the additional storage device 4 and reading of the counter storage device 9.

In step (2), the pulse difference $N_P$ is calculated as a difference between contents of the second (B) and third (C) pregiven locations in the memory. In step (3), the time difference $N_T$ is calculated as a sum of previous time difference $N_T$ and a difference between the content $N_C$ of the modulus storage device 1 and a content of first pregiven location (A) in the memory. The frequency $f_M$ is calculated on the basis of the frequency $f_C$ of the reference clock RCLK, the pulse difference $N_P$ and the time difference $N_T$ in step (4). In step (5), the new time difference is calculated as the incremented content of the first pregiven location (A) in the memory, and also the content of the third pregiven location (C) in the memory is stored into the second pregiven location (B) in the memory. In step (6), the interrupt request INT is reset, by successive disabling and enabling by the bit ENA of the control storage device 5 (see FIG. 33).

Figures 50, 51:
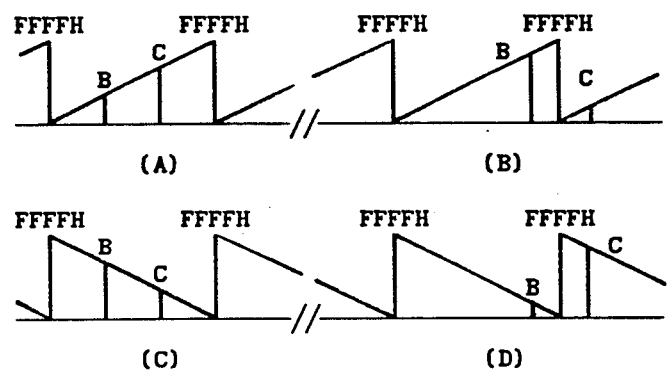
FIG. 50 shows the diagrams for explaining the calculation of the pulse difference during up counting, overflow, down counting and underflow of the pulse counter.
FIG. 51 is a table illustrating the calculation of the pulse difference during up-counting, overflow, down-counting and underflow conditions of the pulse counter.

FIG. 50 shows the diagrams for explaining the calculation of the pulse difference $N_P$ during up counting, overflow, down counting and underflow of the pulse counter 8, considering P=16 bits in the up/down counter.

The content of the 16-bit up/down pulse counter 8 is between 0 and FFFFH, where suffix H annotates a hexadecimal number. Suppose that an encoder is mounted on the shaft. The direction of the rotation of the shaft can be determined without separate overflow/underflow bit, if absolute value $|N_P|$ is less than 8000H. If 16-bit unsigned arithmetics is used, $|N_P|$ is equal to C−B during up counting, or B−C during down counting (FIG. 51). However, $N_P$ should be a signed integer in order to reflect the direction of the rotation. Considering up counting direction as negative, and down counting as positive, the formula for $N_P$ becomes simply:

$$N_P = (\text{signed int})((\text{unsigned int})B - (\text{unsigned int})C) \quad (19)$$

If multiplication is off, the frequency $f_M$ of the measured clock LOAD1, supplied to the pulse counter 8 is always less than $f_C/2$ (half of the frequency $f_C$ of the reference clock RCLK), so even during the maximum sampling time determined by the 16-bit interval timer 2, it is impossible to count more than 8000H pulses. If multiplication is on, the frequency $f_M$ can be equal to $f_C$ for input frequency of almost $f_C/2$, so the sampling time has to be less than half of the maximum sampling time. Available wide frequency range is $1/(N_C+1)$ when multiplication is on.

Figures 52, 53:
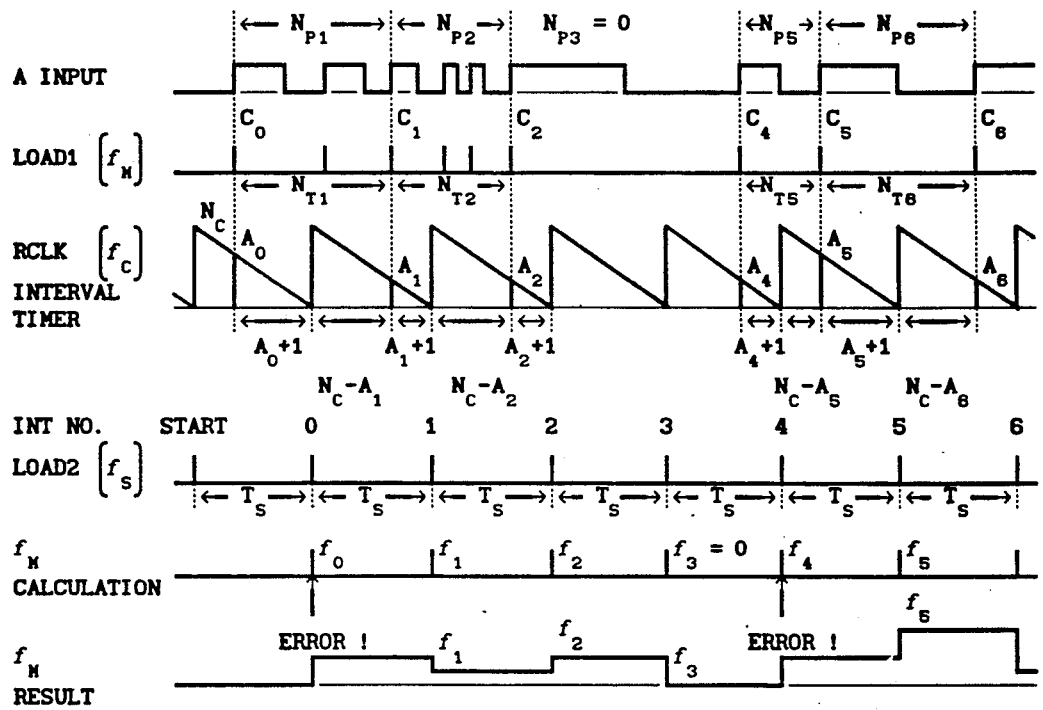
FIG. 52 shows the timing diagrams of the erroneous frequency measurement using the flowchart from FIG. 49.
FIG. 53 is a table illustrating the erroneous frequency measurement for the timing diagrams from FIG. 52.

FIG. 52 shows the timing diagrams of the erroneous frequency measurement using the flowchart from FIG. 49, while FIG. 53 shows several passes through this flowchart for the same timing diagram. First calculated frequency $f_O$ is erroneous, because the moment at which the last content of the interval time 2 has been stored into the timer storage device 3 depends on the measured clock LOAD1 in the past, before the measurement has been started. This problem can be easily avoided by ignoring the first calculated frequency. The time difference between last detected input pulse in the previous sampling time and the interrupt request (INT No. 0) is $A_o+1$, while the time difference between the same interrupt and the last detected input pulse in the current sampling time is $N_C-A_1$. Therefore, the total time difference $N_T$ is a sum of these two time differences (FIG. 53). This example also includes one sampling interval without any pulses of the measured clock, between the interrupt requests INT No. 2 and INT No. 3. This makes no problem for the calculation at INT No. 3, due to zero pulse difference $N_P$, which gives the zero frequency $f_M$. However, more serious problem occurs at the interrupt request INT No. 4. The formula in the step (3) for the calculation of the time difference $N_T$ according to the content (A) of the additional storage device 4, does not provide knowledge of the sampling time, when this content was stored. Therefore, even if this sampling time is far from the current moment, the formula in the step (3) assumes that the last content has been stored during the previous sampling time, which produces erroneous frequency $f_4$. It can be concluded, that this flowchart can be used only if at least one pulse of the measured clock LOAD1 occurs during each sampling time.

Figure 54:
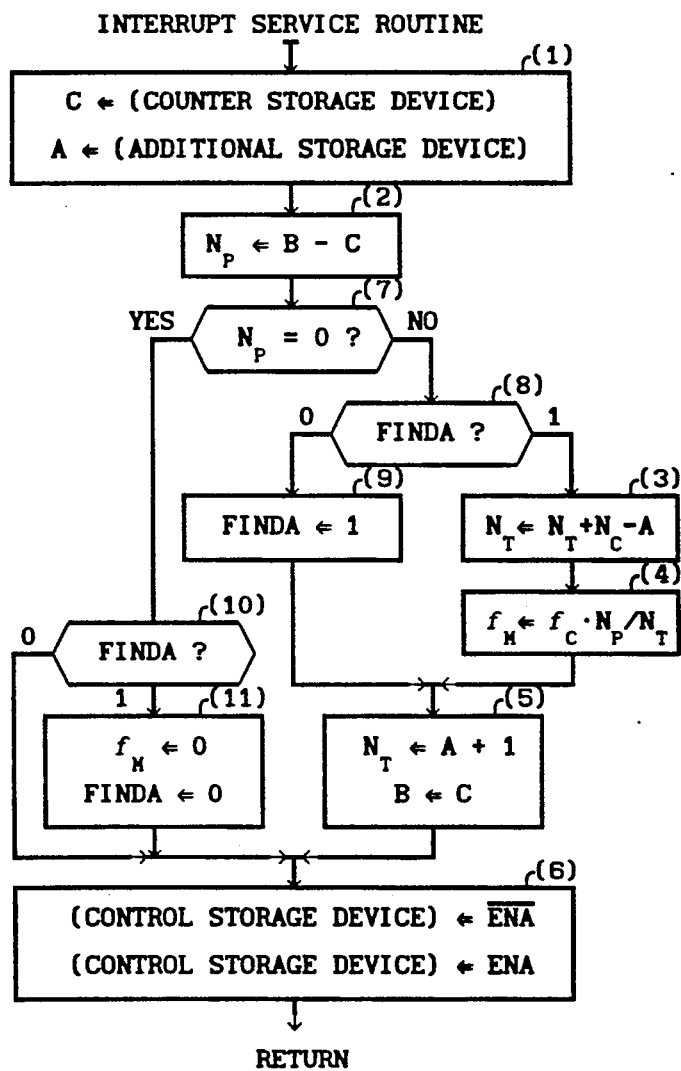
FIG. 54 shows a flowchart for explaining the correct operation of the wide range frequency measurement DB method according to this invention.

FIG. 54 shows a flowchart for explaining the correct operation of the wide range frequency measurement DB method according to this invention. After an interrupt request is generated, a program under execution is interrupted. In step (1), a content of the counter storage device 9 is stored into the third pregiven location (C) in the memory, and a content of the additional storage device 4 is stored into the first pregiven location (A) in the memory.

In step (2), the pulse difference $N_P$ is calculated as a difference between contents of the second (B) and third (C) pregiven locations in the memory. After the start of the measurement, zero pulse difference $N_P$ in step (7), means that no pulses of the measured clock LOAD1 have been arrived, so the flag FINDA remains zero in step (10). If the pulse difference $N_P$ is other than zero in step (7), the flag FINDA is set in step (9), because at least one LOAD1 pulse has been detected. In step (5), a content of third pregiven location (C) in the memory is stored into second pregiven location (B) in the memory, and first part of the time difference $N_T$ is calculated as incremented content of the first pregiven location (A) in the memory, which corresponds no the time difference between the last detected LOAD1 pulse and the current interrupt request. In step (6), the interrupt request INT is reset, by successive disabling and enabling by the bit ENA of the control storage device 5 (see FIG. 33).

During the measurement, while the pulse difference $N_P$ is other than zero in step (7), and the flag FINDA is other than zero in step (8), the time difference $N_T$ is calculated as a sum of the previous time difference $N_T$ and a difference between content $N_c$ of the modulus storage device 1 and a content of the first pregiven location (A) in the memory in step (3). In step (4) the frequency $f_M$ is calculated on the basis of the frequency $f_C$ of the reference clock RCLK, the pulse difference $N_P$ and the time difference $N_T$. The preparation for the next interrupt service routine is performed in step (5), which is described above. However, if no LOAD1 pulses have been detected during the previous sampling time, the pulse difference $N_P$ is zero in step (7), so the measurement process is initialized by zeroing the frequency $f_M$ and clearing the flag FINDA in steps (10) and (11).

It can be noticed that the flag FINDA is reset, when $N_P$ is zero. This flag is set, when $N_P$ is other than zero. Therefore, the flag FINDA directly reflects the value of the $N_P$ in the previous sampling time. This prevents erroneous calculation of $N_T$ when no LOAD1 pulses have been detected in the previous sampling time.

Figures 55, 56:
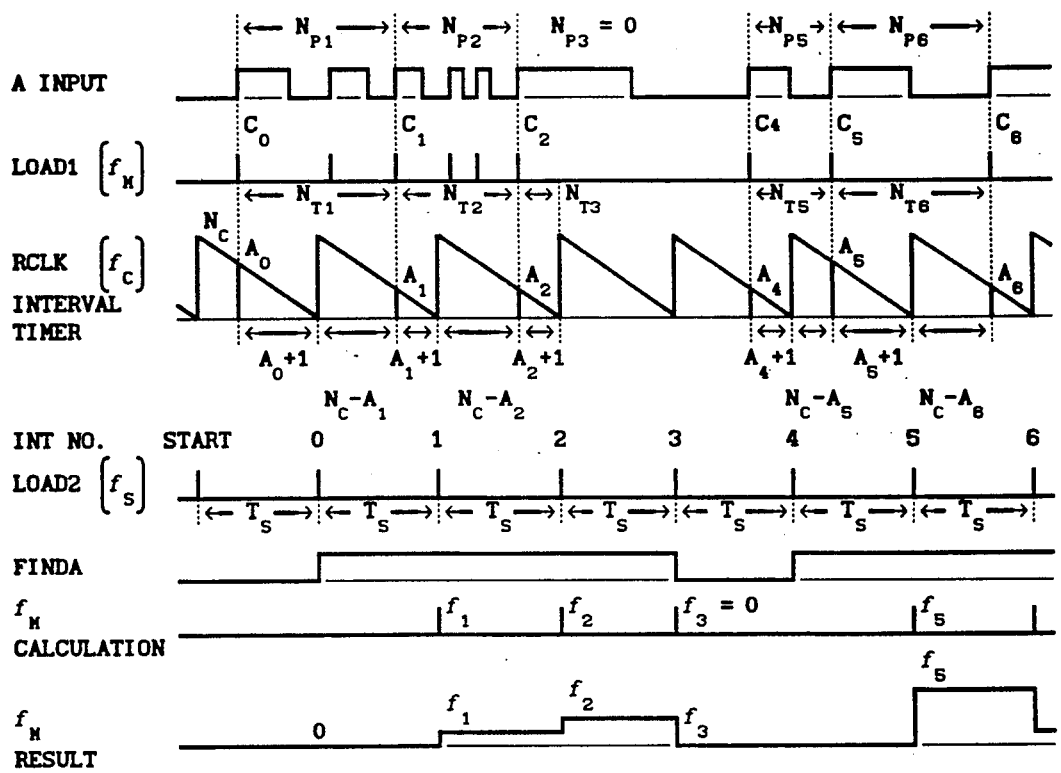
FIG. 55 shows the timing diagrams of the correct operation of this invention during wide range frequency measurement for the flowchart from FIG. 54.
FIG. 56 is a table illustrating the correct operation of the wide range frequency measurement for the timing diagrams from FIG. 55.

FIG. 55 shows the timing diagrams of the correct operation of this invention during wide range frequency measurement for the flowchart from FIG. 54, while FIG. 56 shows several passes through this flowchart for the same timing diagram. If neither one pulse of the measured clock LOAD1 has occurred between the measurement start and interrupt request No. 0, the pulse difference $N_P$ is zero in step (7). Due to that fact, the flag FINDA remains zero. If the pulse difference $N_P$ is other than zero, the flag FINDA is set in step (9) as shown for the interrupt No. 0. The next pass through the interrupt routine is redirected by the flag FINDA to the frequency calculation. Two pulses of measured clock LOAD1 are obtained before the interrupt No. 1 is activated. Therefore, the frequency $f_1$ is calculated as $f_1 = f_C \cdot N_P/N_T$ in step (4). The similar situation is valid for the interrupt No. 2, where 3 LOAD1 pulses have been arrived. If neither one LOAD1 pulse has occurred during the sampling time, the pulse difference $N_P$ would be zero in step (7), so the calculated frequency $f_3$ will be considered zero in step (11), for the interrupt No. 3. The flag FINDA is also initialized to zero in the same step, to prevent erroneous calculation of a time difference, when a last LOAD1 pulse has been obtained before more than one sampling time. The interrupt No. 4 is similar to the interrupt No. 0 after the measurement start, because the flag FINDA is set, due to the pulse difference $N_P$ other than zero in step (7). Other two passes through the interrupt routine (the interrupts No. 5 and No. 6) are also given for the illustration purposes.

Therefore, according to above explanation, calculated frequency $f_M$ is other than zero, if at least one pulse of the measured clock LOAD1 is obtained during previous sample time $T_S$. The minimum frequency of measured clock LOAD1, which can be measured is $minf_M = 1/T_S$. The maximum frequency of measured clock LOAD1, which can be measured is equal to the frequency $f_C$ of the reference clock, using the multiplication of input frequency. Therefore, available wide frequency range is $maxf_M/minf_M = f_C \cdot T_S = N_C + 1$ and depends on the sampling time $T_S$.

Figure 57:
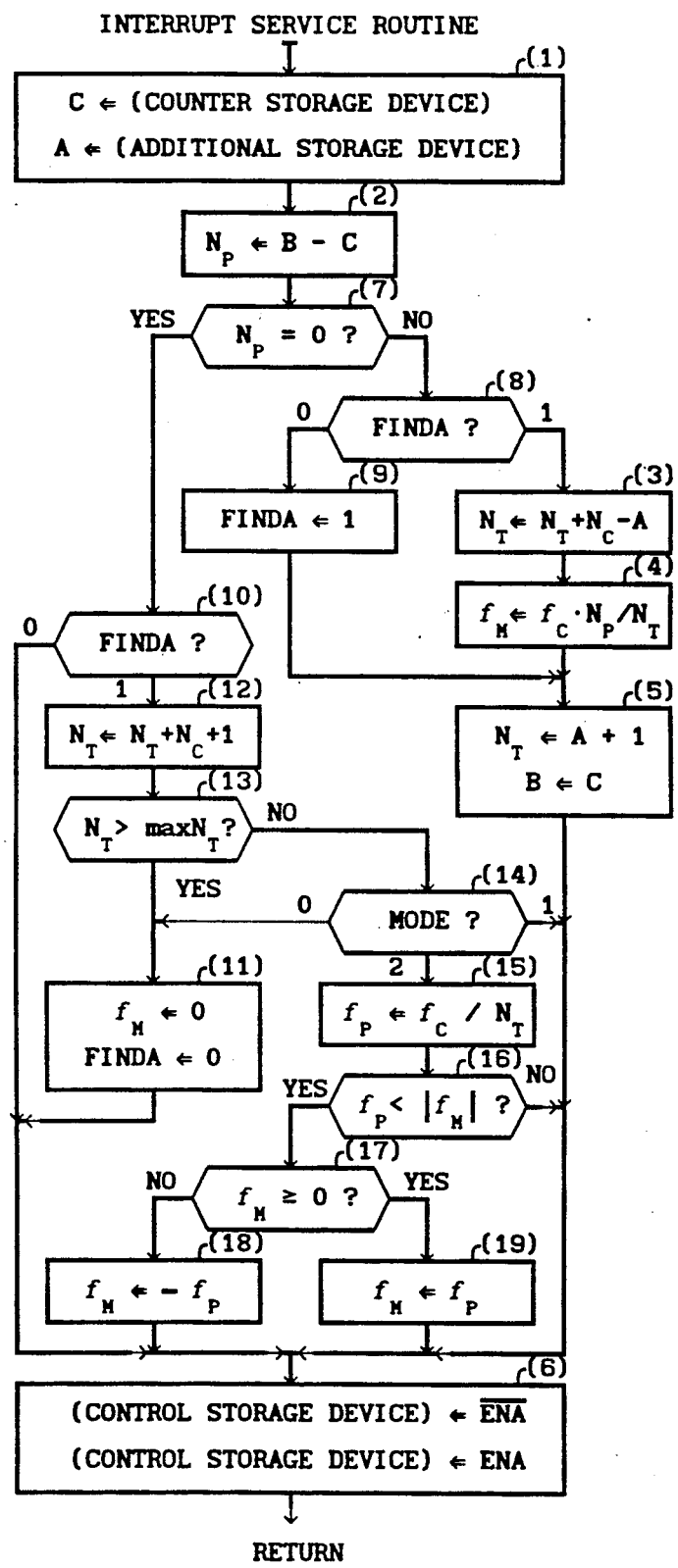
FIG. 57 shows a much better flowchart providing frequency measurement within an extremely wide range of frequencies.

FIG. 57 shows a much better flowchart providing frequency measurement within an extremely wide range of frequencies. The behavior of this flowchart is the same as for the flowchart from FIG. 54, except in case of the flag FINDA other than zero, and zero pulse difference $N_P$. Instead of zero frequency $f_M$, the flag FINDA initialization as it is performed in step (11) in FIG. 54, an extremely wide range flowchart utilizes a time difference $N_T$ as a sum of time intervals between an interrupt service routine in which the pulse difference $N_P$ first was equal to zero, to an interrupt service routine in which the pulse difference $N_P$ first was other than zero. Each time, the pulse difference $N_P$ is zero in step (7), and the flag FINDA is other than zero in step (10), a time difference $N_C + 1$ is added to the time difference $N_T$ in step (12). When neither one LOAD1 pulse has occurred before the time difference $N_T$ reaches $maxN_T$ in step (13), the measuring process is initialized using step (11) as in the previous flowchart in FIG. 54. However, if the time difference $N_T$ is less than $maxN_T$ in step (13), three calculation modes 0, 1 and 2 are provided depending on the flag MODE:

mode 0 emulates the pulse counting method 1);

mode 1 emulates the combined 4) and CET 5) methods; and mode 2 performs calculation specially developed for the DB method 6).

The question of choosing desired MODE can be redirected to the question: What will be the result of the measurement, when no input pulses are present during several sampling times? In other words, the question is: What will be the output information of the system, in absence of input information?

If the pulse difference $N_P$ is zero, mode 0 gives zero frequency $f_M$ and initializes the measurement using flag FINDA in step (11), which means that the behavior of the flowchart from FIG. 57 is the same as the already described flowchart from FIG. 54. At same condition, modes 1 and 2 accumulate time differences $N_T$ from an interrupt routine in which the pulse difference $N_P$ first was zero, to an interrupt routine in which the pulse difference $N_P$ first was other than zero. After that, an unknown frequency is calculated. This allows measurement of frequencies much lower than $1/T_S$.

The resulted frequency $f_M$ in modes 1 and 2 is the same, while input frequency is stable or is increasing. In absence of LOAD1 pulses, mode 1 holds last calculated frequency by the software, similar as combined and CET methods do by the hardware, until maximum time difference $maxN_T$ is reached. However, in absence of LOAD1 pulses, mode 2 calculates limit frequency $f_P = f_C/N_T$ in step (15) at each sampling time, using accumulated time difference $N_T$. This formula is derived by making the software consideration of virtual single pulse detected at the end of current sampling time. This virtual single pulse, obviously is not detected by the pulse counter 8 and has no influence on the counting process in the future. If an input frequency is stable or increases, the absolute value of last calculated frequency $|f_M|$ is always less than limit frequency $f_P$ in step (16), so $f_P$ has no effect on the measurement result.

However, if an input frequency decreases, the absolute value of last calculated frequency $|f_M|$ is always greater than the limit frequency $f_P$ in step (16), so $f_p$ is used as resulted frequency with the same sign as last calculated frequency $f_M$ according to steps (17), (18) and (19).

Therefore, in absence of an input information (without input pulses) in mode 2, an input frequency, is always less than the limit frequency, which is the best available information.

According to above explanation, calculated frequency $f_M$ is other than zero, if at least one pulse of the measured clock LOAD1 is obtained during maximum response time $T_{MAX} = maxN_T/f_C$ determined by the maximum time difference $maxN_T$. The minimum frequency $minf_M$ of the measured clock LOAD1 is $minf_M = 1/T_{MAX} = f_C/maxN_T$. The maximum frequency $maxf_M$ of the measured clock LOAD1 is $maxf_M = f_C$, if frequency multiplication is on, or $maxf_M = f_C/2$ if frequency multiplication is off. Therefore, available extremely wide frequency range $maxf_M/minf_M = maxN_T$ is independent on the sampling time $T_S$. It means, that any frequency within available extremely wide frequency range can be measured using any sampling time within available wide sampling time range. The extremely wide frequency range is practically limited only by the arithmetics used for the maximum time difference $maxN_T$. For example, if long integers are used, the available frequency range is around $4 \cdot 10^9$. This is a new principle of the operation, completely different from existing methods, where available frequency range depends on the sampling time or is limited by the number of bits in the counters in order to avoid the overflow problems.

Figures 58, 59:
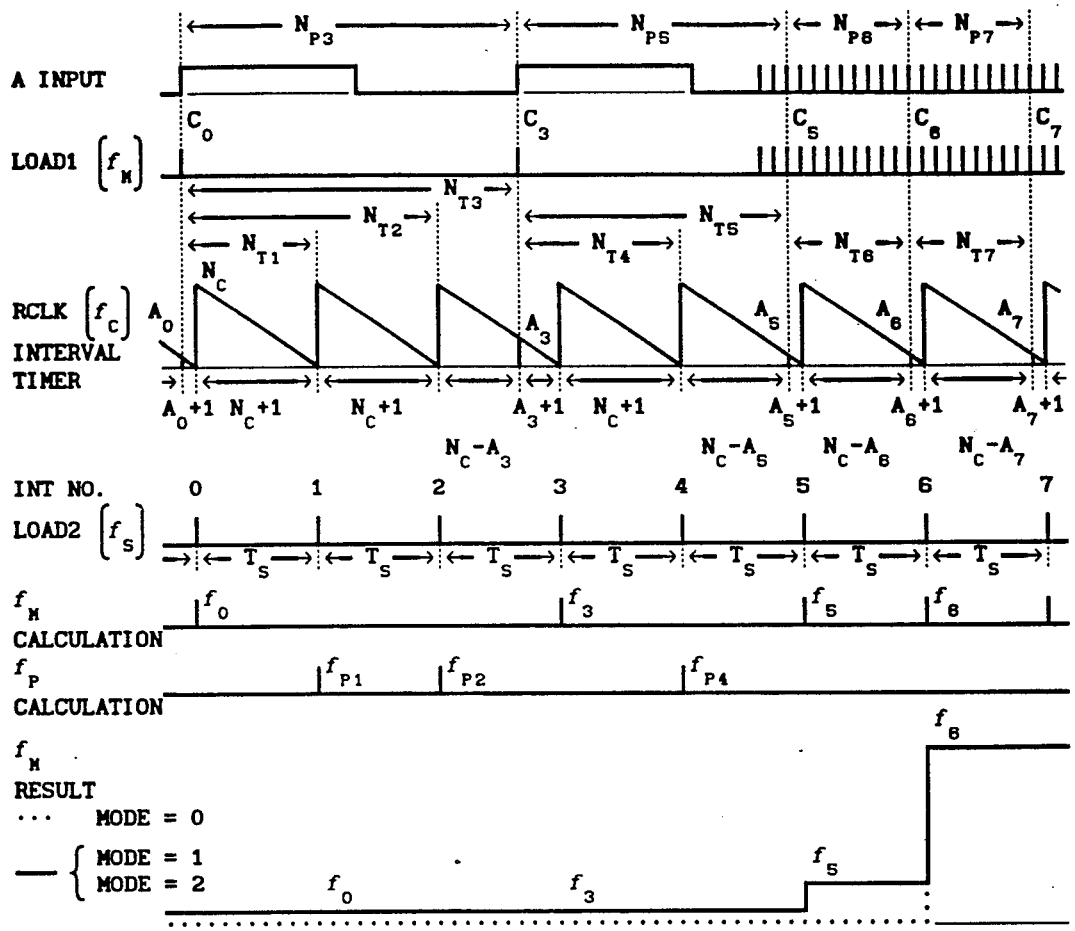
FIG. 58 shows the timing diagrams of the measurement of increasing frequency for the flowchart from FIG. 57, which provides an extremely wide range of measured frequencies.
FIG. 59 is a table illustrating the measurement of increasing frequency for the timing diagrams from FIG. 58.

FIG. 58 shows the timing diagrams of the measurement of increasing frequency for the flowchart from FIG. 57, which provides an extremely wide range of measured frequencies. The measurement of low frequency much below $1/T_S$ is shown on the left of FIG. 58. There are no difference between MODE=1 and MODE=2 if frequency is stable or increases over time. After interrupt No. 0, this low frequency is calculated using previous data (not shown). There are no LOAD1 pulses during two sampling intervals after interrupt No. 0.

Therefore, in mode 1 no frequency is calculated at interrupts No. 1 and No. 2, while a time interval $N_C + 1$ is added twice to the time difference in step (12) in two successive interrupt routines (FIG. 59). However, in mode 2, two limit frequencies $f_{P1}$ and $f_{P2}$ are calculated at interrupts No. 1 and No. 2. They have no influence on the resulted frequency $f_O$, because they are greater than $f_O$. Next LOAD1 pulse is obtained before the interrupt No. 3, so the time difference $N_T$ is calculated in step (3), and the frequency $f_3$ of the measured clock LOAD1 is calculated in step (4) for both modes 1 and 2. There are no LOAD1 pulses during single sampling time after interrupt No. 3, so a time interval $N_C + 1$ is added to the time difference $N_T$ in step (12) at interrupt No. 4. In mode 1, again no frequency is calculated at interrupt No. 4. However, in mode 2, the limit frequency $f_{P4}$ is calculated at interrupt No. 4. This again has no influence on the resulted frequency $f_3$. The moment of the instantaneous frequency increasing is asynchronous with both low and high frequency, so the presented situation is very realistic. The pulses of high frequency are obtained before the completion of last period of low frequency. Therefore, one intermediate frequency between low and high frequency is calculated at interrupt No. 5. Since high frequency is greater than $1/T_S$, this high frequency is calculated after each sampling time (interrupts No. 6 and No. 7).

Figures 60, 61:
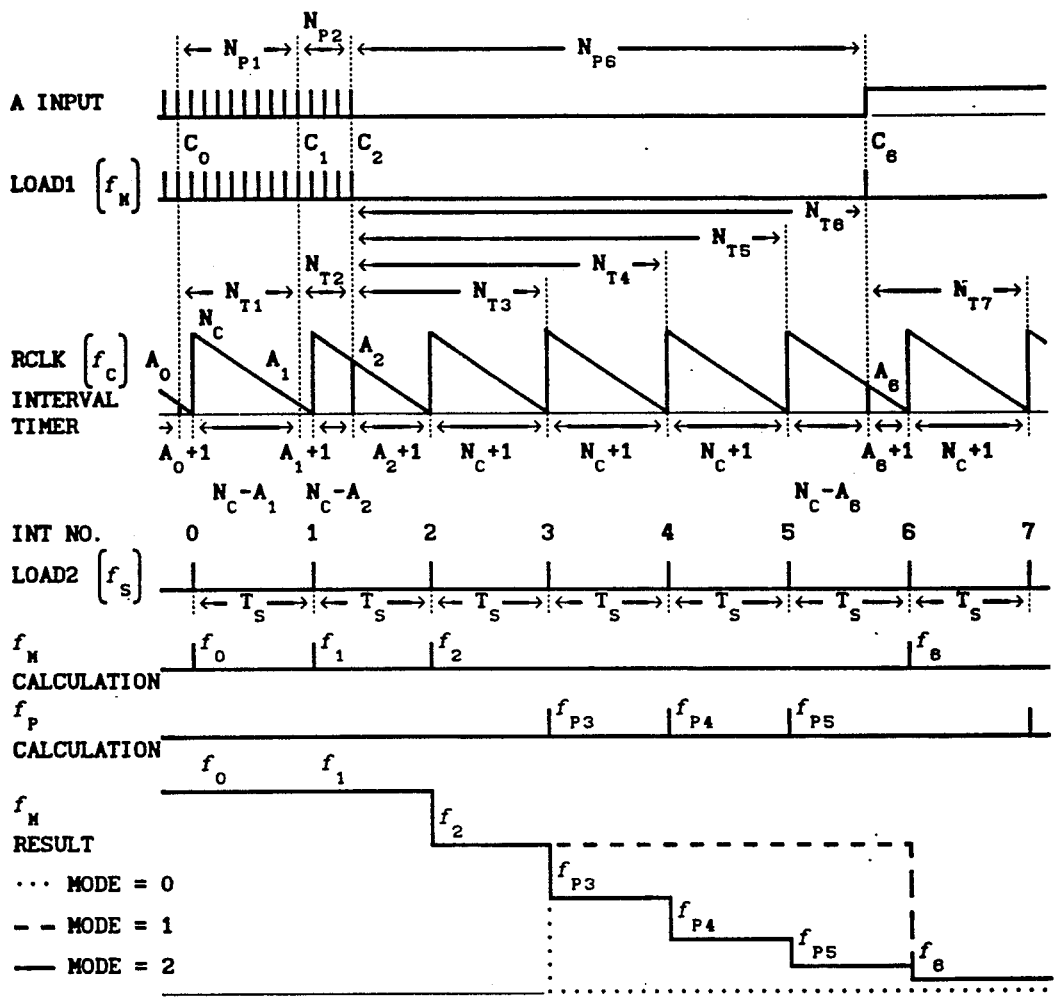
FIG. 60 shows the timing diagrams of the measurement of decreasing frequency for the flowchart from FIG. 57, which provides an extremely wide range of measured frequencies.
FIG. 61 is a table illustrating the measurement of decreasing frequency for the timing diagrams from FIG. 60.

FIG. 60 shows the timing diagrams of the measurement of decreasing frequency for the flowchart from FIG. 57, which provides an extremely wide range of measured frequencies. Since high frequency is greater than $1/T_S$, this high frequency $f_0 = f_1$ is calculated after each sampling time (interrupts No. 0 and No. 1). The moment of the instantaneous frequency decreasing is asynchronous with both high and low frequency, so the presented situation is very realistic. Practically, pulses of high frequency are suddenly vanished within single sampling time. Therefore, one intermediate frequency $f_2$ between high and low frequency is calculated at the interrupt No. 2 (FIG. 61). After that moment, there are no LOAD1 pulses during three sampling times, Significant difference between modes 1 and 2 arises, if frequency decreases. In mode 1 no frequency is calculated at interrupts No. 3, No. 4 and No. 5, while a time interval $N_C + 1$ is added three times to the time difference $N_T$ in step (12) at three successive interrupt service routines. In mode 2 three limit frequencies $f_{P3}$, $f_{P4}$ and $f_{P5}$ are calculated at interrupts No. 3, No. 4 and No. 5. Since all three limit frequencies are less than $f_2$, they are adopted to be a resulted frequencies. The final effect is that resulted frequency hyperbolically decreases in mode 2, while mode 1 holds last calculated frequency $f_2$. Therefore, in mode 2 the actual frequency is less than each limit frequency $f_{PK}$, which is the best possible information in absence of LOAD1 pulses (input information), Next pulse of the measured clock LOAD1 is obtained before the interrupt No. 6, so the time difference $N_T$ is calculated in step (3), and the frequency $f_6$ is calculated in step (4).

From this point of view, the DB system is analogous to the Digitizing Oscilloscopes, where the sampling time can be chosen as desired, disregarding the input signal. Therefore, a constant voltage can be measured with very small sampling time, which provides fast dynamic response of the digitizing oscilloscope, if input voltage is suddenly increased. In the DB system, very low frequency can be measured with very small sampling time, which provides fast dynamic response of the DB system, if an input frequency is increased at once.

In further text, it will be shown that this invention has less hardware complexity, than present methods, specially for the measurement of several input frequencies.

The combined method 4) requires 3 counters per input, because both start and stop of a measurement are synchronized with input pulses (FIG. 62).

The CET method 5) can be used only as digital tachometer due to two software timers in the main program loop. General purpose CET method (G.P.CET, which is not published in literature) requires minimum of 3 counters and 2 storage device for single input (same as CET method, plus an interval timer with a modulus storage device). Since the disable and enable of the storage function and a start of the interval are based on input pulses, each new input requires 2 counters and 2 storage devices (an interval timer with a modulus storage device, a pulse counter and a timer storage device).

Figure 63:
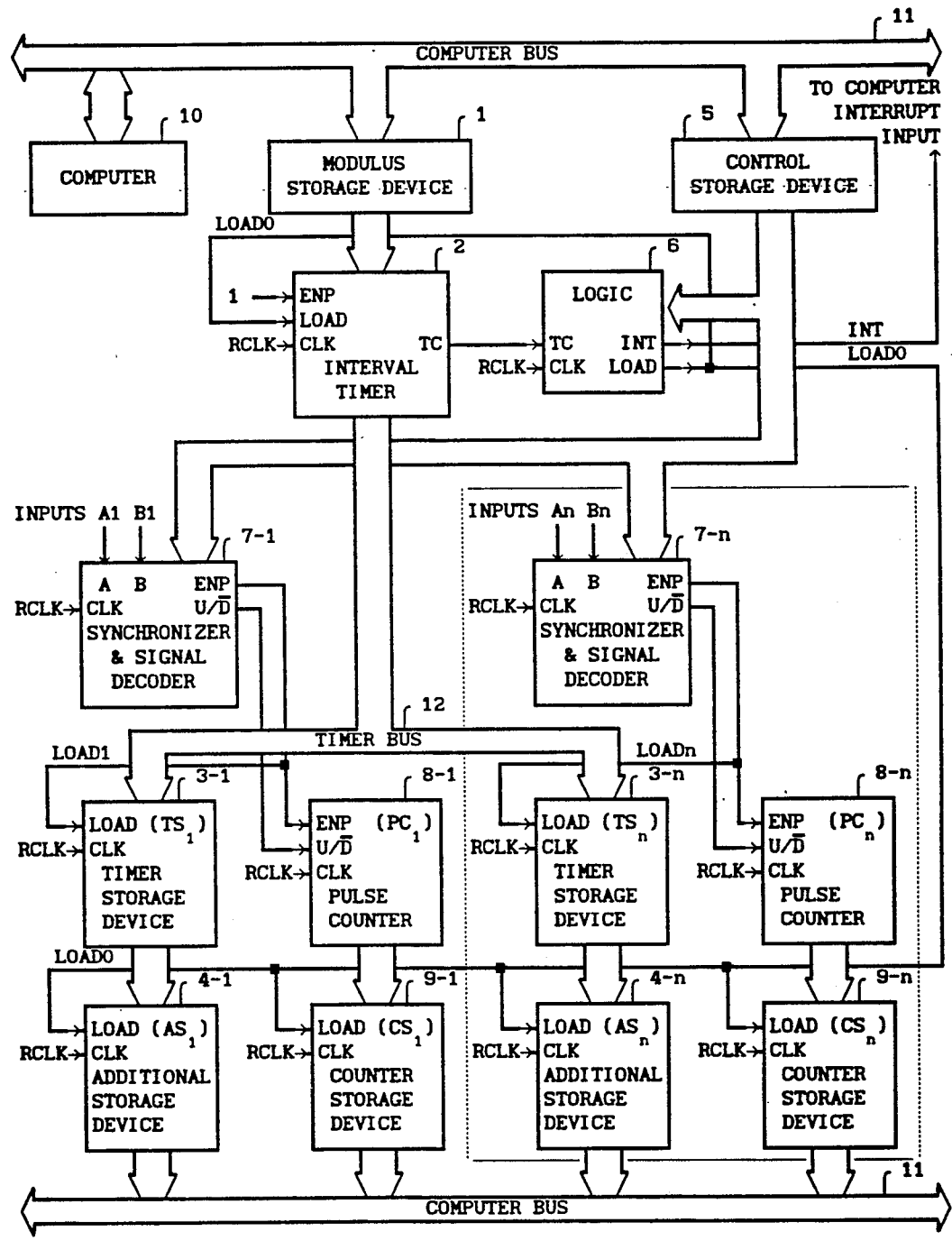
FIG. 63 shows that the DB system can be successfully modified for the measurement of n input frequencies.

FIG. 63 shows that the DB system can be successfully modified for the measurement of n input frequencies. A dashed line covers necessary components for each new input. The DB system requires 1 synchronizer, 2 counters and 4 storage devices for one input (synchronizer and signal decoder 7-1, interval timer 2, pulse counter 8-1, modulus storage device 1, timer storage device 3-1, additional storage device 4-1 and counter storage device 9-1). Since the content of the interval timer 2 is available on the local timer bus 12, and the sampling is independent on input pulses, each new input n requires 1 synchronizer, 1 counter and 3 storage devices (timer storage device 3-n, pulse counter 8-n and counter storage device 9-n).

The significance of the DB system will be apparent after reading the list of main applications:

I Frequency and Phase Measurement

1. Laboratory and industry (frequency and phase measuring instruments)
2. Telecommunication (measurement of following signals: spread-spectrum, frequency-agile, binary frequency-shift keying (BFSK), binary phase-shift keying (BPSK), frequency modulated (FM), etc.)
3. Interferometers (laser inertial navigation systems (LINS) in airplanes, laser interferometer for a displacement and distance measurement, etc.)
4. Doppler effect based instruments (sonars for the submarines, boats, fish finders, Doppler radars, laser detection of moving objects)
5. Physics (real-time frequency stability of lasers, radiation analysis)

II Angular Speed and Position Measurement of Rotating Shaft

1. Control of AC motor drives (numerically controlled machines, diversity of controlled industrial electric motors, elevators, etc.)
2. Control of DC electric motors (floppy and hard disc drive in computers, tape recorder, turntable, video recorder, etc.)
3. Robotics
4. Vehicles (speedometer, tachometer, automatic transmission, anti-block system (ABS) and anti-skid control (ASC), etc.)
5. Control of engines (Otto, Diesel, Turbine)
6. Displacement measurement (numerically controlled machines, etc.)

The features of the DB system will be presented for hardware implementation in PC/AT personal computers. The PC/AT card covers two 16-bit counters and four 16-bit storage devices. The instability of the PC/AT reference clock (14,31818 MHz) is considered negligible during measurement. The floating point arithmetics makes a calculation error negligible.

The earlier methods cannot cover the list of applications above due to lack of universality. However, the advantages of the DB system will be apparent after reading the general features, as well as the features of realized DB systems:

A) Suitable Hardware Realization

1. The DB system utilizes minimum number of counters, which require more space in an integrated circuit than storage devices. The DB method can measure one frequency with only 2 counters and 4 storage devices, comparing with 3 counters for the method 4), or 3 counters and 2 registers for the general purpose method 5). Two frequencies require only half of counters used by the method 4). Measurement of several frequencies require only third of counters used by the combined method, or only half of counters used by the G.P.CET method (FIG. 62). For example, a speed measurement in a 2-wheel ABS (anti-block system in vehicles) require only 3 counters, while 5 counters are enough in 4-wheel ABS. Therefore, the DB system requires less complex integrated circuits than other methods, even if special advantages, described in further text, are unused.

2. The DB system discloses an inherent solution for the readings of the interval timer 2 and the pulse counter 8 during counting ("on-the-fly"), which eliminates ready/inhibit logic [22,23], described in patents:
   [22] D. C. Chu and M. J. Ward. "Data capture in an uninterrupted counter," Hewlett-Packard Company, U.S. Pat. No. 4,519,091.
   [23] M. Korechika, "Counter circuit provided with means for reading out counted data by read-command signal applied asynchronously with clock signals to be counted," NEC Corporation, U.S. Pat. No. 4,881,248.
   Therefore, only standard read/write signals are used, disregarding applied microprocessor.

3. The DB system also eliminates the problem associated with input pulses within the time interval between the reading of the interval timer 2 and the reading of the pulse counter 8.

4. The extremely wide frequency range of $4 \cdot 10^9$ and the wide sampling time range are achieved using one 16-bit interval timer 2 and one 16-bit pulse counter 8, which eliminates requirements for 32-bit timers for measurement of low frequencies or long sampling time. This extremely wide frequency range is achieved without any manual or automatic selection of ranges and without programmable prescalers, required by existing methods.

Figure 64A:
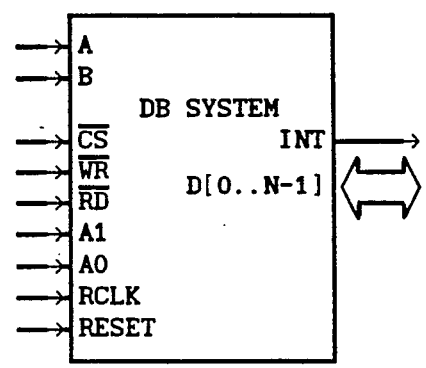
FIG. 64A shows the general preferred symbol of the DB system, designed with 16-bit counters and storage devices.

5. FIG. 64A shows the general preferred symbol of the DB system, designed with 16-bit counters and storage devices, requiring two inputs A and B, a reference clock RCLK, a chip select input $\overline{CS}$ from the external address decoder, a write control input $\overline{WR}$, a read control input $\overline{RD}$, an address A1 (for 16-bit access) and an optional address A0 (for 8-bit access), a reset control input RESET, an interrupt request output INT and the bidirectional data bus Q(0...N).

Figure 64B:
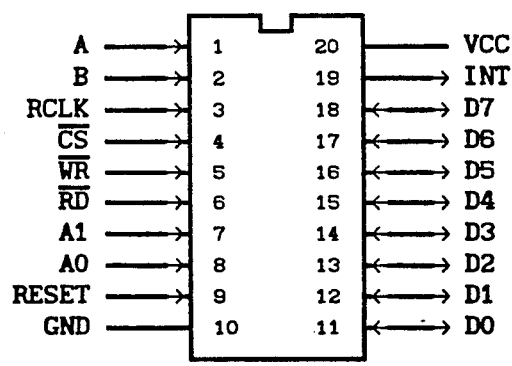
FIG. 64B shows the preferred pin-out of the DB system, designed with 16-bit internal and 8-bit bidirectional external data bus.

FIG. 64B shows the preferred pin-out of the DB system, designed with 16-bit internal and 8-bit bidirectional external data bus D(0...7), requiring only 20 pins in a single-chip solution.

B) Wide Range of Sampling Periods

1. The maximum sampling time $maxT_S$ is limited by the number of bits in the interval timer 2 and can be easily increased using the additional software counter.
2. The minimum sampling time $minT_S$ is software limited by the time available for an interrupt routine.
3. In realized system:
   $maxT_S$ = 4.6 milliseconds without the additional software counter;
   $maxT_S$ = 300 seconds using the additional software counter (not shown);
   $minT_S$ = 0.75 milliseconds for real-time frequency calculation (in each interrupt routine);
   $minT_S$ = 100 microseconds for off-line frequency calculation (after the end of the measurement);
   the wide sampling time range 46:1 is independent on input frequency; and
   the additional software counter (not shown) and more complex algorithm than presented make possible wide range of sampling periods of $3 \cdot 10^6 : 1$.

4. The constant sampling period, independent on measured frequency, is better for real-time control algorithms, instead of variable sampling period dependent on measured frequency, provided by earlier methods.

C) Extremely Wide Range of Frequencies

1. The maximum measured frequency maxf of input pulses is limited to half of the reference clock and can be increased up to the hardware limits.
2. The minimum measured frequency minf of input pulses is software limited by the arithmetics used for the time difference.
3. In realized system:
   maxf is around 7 MHz for the PC/AT reference clock of 14,31818 MHz;
   minf is limited to 1.67 mHz using input frequency doubling, or 3.34 mHz without multiplication of input frequency; and
   extremely wide frequency range $4 \cdot 10^9 : 1$ is independent on sampling time, which means that any frequency within this extremely wide range can be measured with any available sampling time within its wide range, which is unreachable with existing methods. This is very important feature, because the manual ranging of laboratory frequency measuring instruments in impossible in real-time control systems, which is used in [24]:
   [24] G. M. Yool, "Wide range frequency counter," Ma-West, U.S. Pat. No. 4,257,003.
   On the other hand, the frequency at which autoranging methods, have to change the period measurement to pulse counting depends on frequency, which is the object of patents [25,26]:
   [25] R. V. Miller, "Auto ranging of a frequency measuring instrument," Hewlett-Packard Company, U.S. Pat. No. 4,695,791.
   [26] J. C. Curtis, "Autoranging frequency sensor," U.S. Pat. No. 4,760,536.

FIG. 65 shows that such extraordinary performances provide universality of the DB system as tachogenerator, because it make possible independent choice of the number of marks per revolution of the encoder, sampling time and available speed range, which is practically always more than requirements of any who is skilled in the art.

D) Low Measurement Error

1. A maximum relative measurement error $\max|\Delta f/f|$ is caused by missing one count of the reference clock, during the synchronization of input signals A and B with the reference clock RCLK, and is:
   similar to an error of the period measurement method
   1) within frequency range from minf to $2/T_S$, and less than $2/(f_C \cdot T_S)$ within $1/T_S$ and $2/T_S$;
   almost fixed around $1/(f_C \cdot T_S)$ within frequency range from $2/T_S$ to maxf.
2. A net relative error over time is zero due to the continuously running interval timer 2, which eliminates the accumulation of the truncation error in a period.
3. In realized system:
   the maximum relative error $\max|\Delta f/f|$ within frequency range from 1.67 mHz to 7 MHz is mostly $1.5 \cdot 10^{-5}$ and is less than $3 \cdot 10^{-5}$ in the worst case for sampling time of 4.6 milliseconds, while $\max|\Delta f/f|$ is mostly $7 \cdot 10^{-4}$ and is less than $1.4 \cdot 10^{-3}$ in the worst case for sampling time of 100 microseconds). However, if an incremental shaft encoder is coupled to the inputs, the total error is mainly caused by non-ideal encoder rise and fall times, asymmetric pulses (other than 180 electrical degrees) and non-ideal phase shift between pulses (other than 90 electrical degrees).

E) FAST DYNAMIC RESPONSE

1. The dynamic response is as fast as possible [20,21] and substantially different than in earlier methods. This feature can help real-time control system to act properly, which is better than an absence of information manifested as zero frequency or holding last calculated frequency, while waiting to the next pulse in earlier methods.
2. The response time to an instantaneously increased frequency from any frequency $f_1$ to any other frequency $f_2$ above $1T_s$ is between $T_s$ and $2 \cdot T_s$. A moment of change in input frequency is within one sampling period, so an intermediate frequency between $f_1$ and $f_2$ is calculated.
3. The response time to an instantaneously decreased frequency from $f_2$ above $1/T_s$ to $f_1$ above $1/T_s$ is between $T_s$ and $2 \cdot T_s$.
4. The response time to an instantaneously decreased frequency from $f_2$ above $1/T_s$ to $f_1$ below $1/T_s$ is: between $T_s$ and $2 \cdot T_s$ for decreasing to an intermediate frequency close to $1/T_s$, plus unknown time between $1/f_1$ and $2/f_1$ for hyperbolical decreasing to $f_1$.

FIG. 66A, FIG. 66B, FIG. 66C and FIG. 66D show the comparison between dynamic responses in modes 0, 1 and 2 at same conditions: same readings from storage devices. 16-bit counters, same internal reference clock, $T_s = 1$ ms, and instantaneously increased and decreased frequency between $f_1 = 5$ mHz and $f_2 = 5$ MHz. First intermediate frequency $f_{I1}$ during frequency increasing is close to 100 Hz, while second and third intermediate frequencies ($f_{I2}$, $f_{I3}$) during frequency decreasing are close to 800 Hz and 9 mHz, respectively.

Figure 66A:
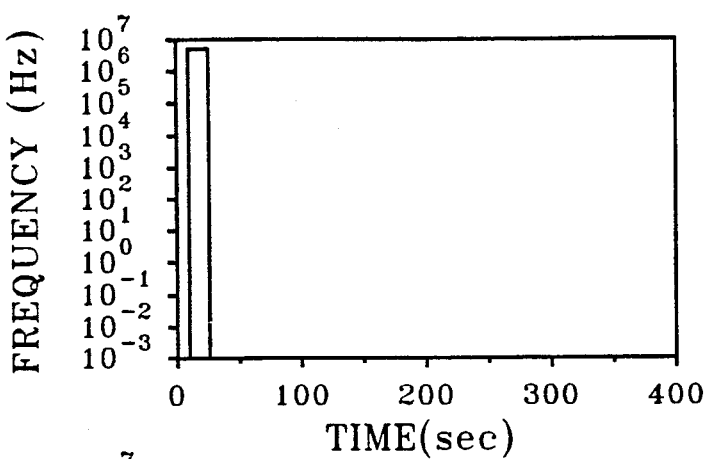
FIG. 66A, FIG. 66B, FJG. 66C and FIG. 66D show the comparison between dynamic responses of modes 0, 1 and 2 at the same conditions.

Methods 1), 4) and 5) cannot measure $f_1 = 5$ mHz, because of insufficient frequency range. These methods require 32-bit timer to do this. FIG. 66A shows that DB method in mode 0 also cannot measure $f_1 = 5$ mHz, so it increases frequency $f_M$ from zero to $f_2$, measures $f_2$ and returns to zero through $f_{I2}$.

Figure 66B:
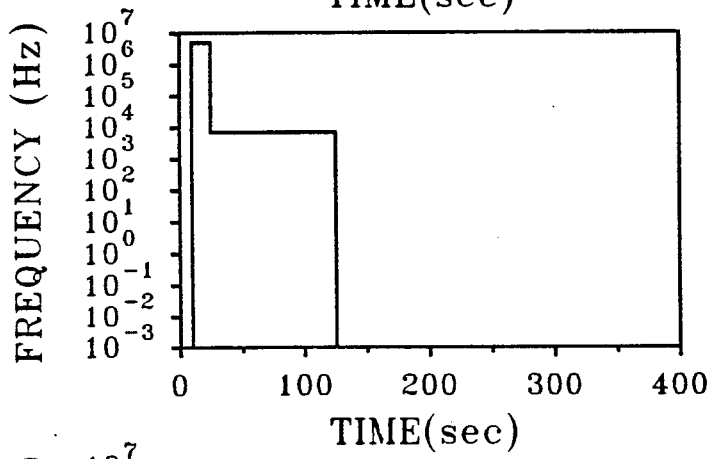

FIG. 66B shows that DB method in mode 1 with $T_{MAX} = 100$ s cannot measure $f_1 = 5$ mHz, so it increases $f_M$ from zero to $f_2$, measures $f_2$, decreases $f_M$, holds $f_{I2}$ for 100 s, and returns to zero.

Figure 66C:
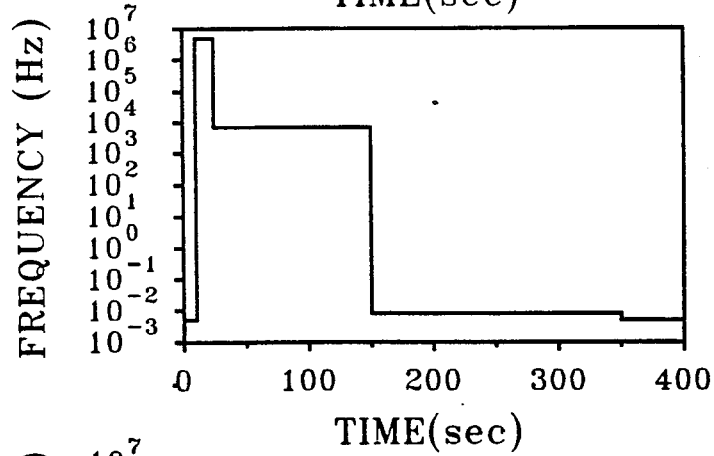

FIG. 66C shows that DB method in mode 1 with $T_{MAX} > 200$ s can measure $f_1$, so it increases $f_M$ from $f_1$ to $f_2$ through $f_{I1}$, measures $f_2$, decreases $f_M$, holds $f_{I2}$ until the first pulse of $f_1$ is detected, decreases $f_M$, holds $f_{I3}$ until second pulse of $f_1$ is detected, and returns to $f_1$.

Figure 66D:
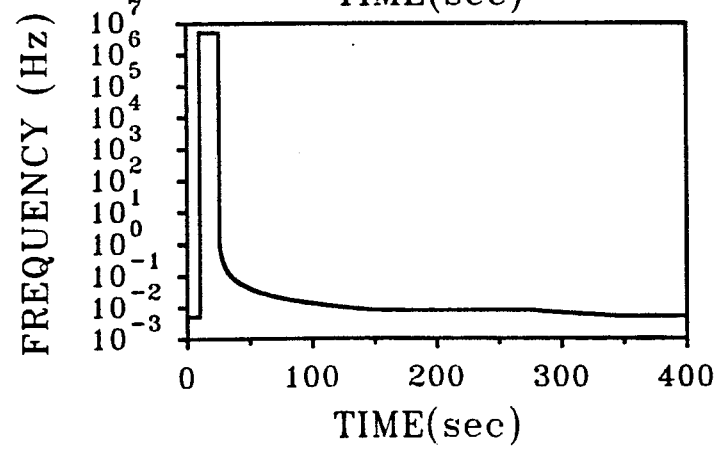

FIG. 66D shows that DB method in mode 2 with $T_{MAX} > 200$ s can measure $f_1$, so it increases $f_M$ from $f_1$ to $f_2$ through $f_{I1}$, measures $f_2$, decreases to $f_{I2}$, hyperbolically decreases $f_M$ until first pulse of $f_1$ is detected, holds $f_{I3}$ for the time equal to $1/f_{I3}$, hyperbolically decreases $f_M$ and "smoothly" approaches $f_1$, after second pulse of $f_1$ is obtained.

Figure 67A:
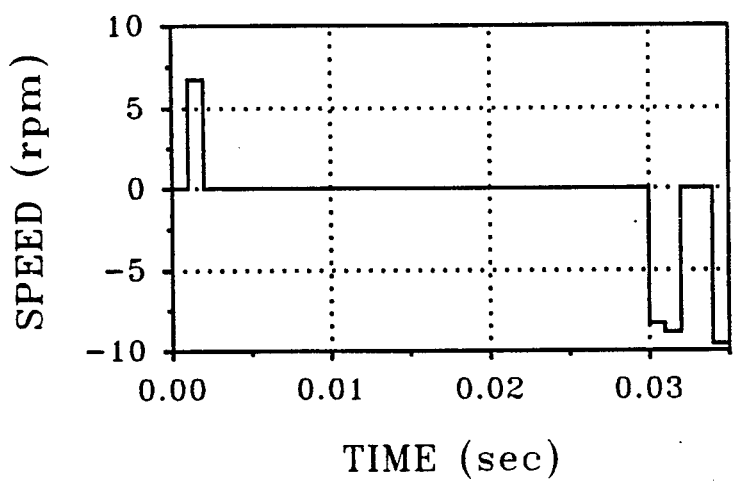
FIG. 67A, FIG. 67B and FIG. 67C show the comparison between speed responses of modes 0, 1 and 2 during the reverse of the speed sign.
Figure 67B:
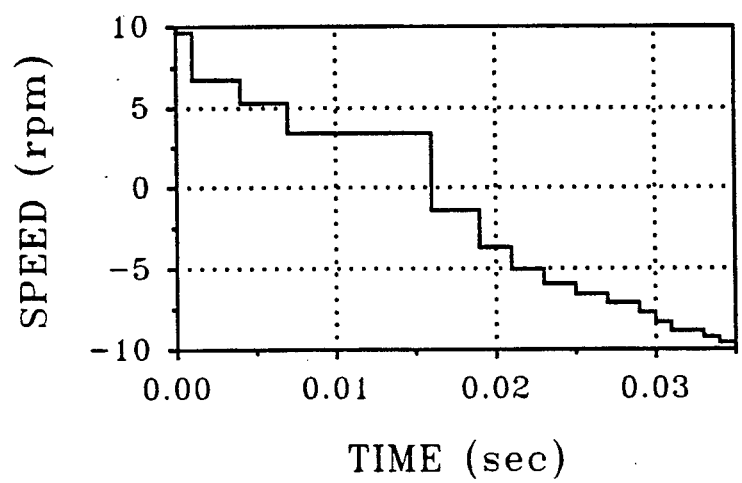
Figure 67C:
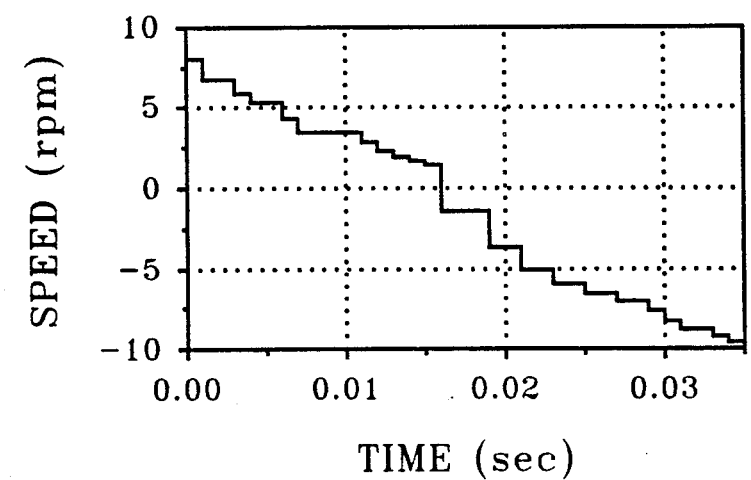

FIG. 67A, FIG. 67B and FIG. 67C show the comparison between speed responses in modes 0, 1 and 2 during the reverse of the speed sign. Since DB method is based on the calculation of an average speed during constant sampling time, the speed depends on the sum of incrementing and decrementing pulses. The average speed in sampling interval with speed zero-crossing can be greater, equal or less than zero, depending on a time shaft between the sampling interval and a zero-crossing moment.

FIG. 67A shows that the method 1) (emulated by mode 0) gives zero speed, when no pulses are detected during the sampling time.

if the actual speed goes to zero, a response time of method 4) (emulated by mode 1) goes to infinity. FIG. 67B shows that the speed is considered to be zero, when a response time become greater than the maximum response time $T_{MAX}$, determined by the maximum time difference $\text{maxN}_T$, which should be chosen using a compomise as in the method 5), in order to accurately track the actual speed. Small $\text{maxN}_T$ decreases speed range in mode 1, while long $\text{maxN}_T$ increases speed range, but also increases dynamic error in speed.

FIG. 67C shows that the mode 2 most accurately represents speed variation, giving useful information even without any pulses on input. This can help real-time control system to act properly, which is better than absence of information caused by the zero speed, for the method 1), or using last calculated speed until next pulse occurs, for methods 4) and 5).

Although the present invention has thus been described in its preferred form, the invention is not particularly limited thereto. Following examples will serve as illustrations for this:

The number of bits of the modulus storage device 1, interval timer 2, timer storage device 3 and additional storage device 4 is M. The number of bits of the pulse counter 8 and counter storage device 9 is P. The number of bits of the control storage device 5 is K. Although the present invention in its preferred form have $M = P = 16$ and $K = 8$ bits, the invention is not particularly limited thereto, because M and N can be different and more or less of that.

Although the present invention in its preferred form has N-BIT LOADABLE SYNC COUNTER as down counting interval timer 2, the invention is not particularly limited thereto. For example, the interval timer 2 can be realized as up counting timer, an up/down counting timer, or even a fee running counter, which does not affects the basic operation of this invention.

Although the present invention in its preferred form has N-BIT UP/DOWN SYNC COUNTER as up/down counting pulse counter 8, the invention is not particularly limited thereto. For example, the pulse counter 8 can be realized as only up counting, or only down counting, which does not affects the basic operation of this invention.

Although the present invention in its preferred form has specially designed synchronizer and signal decoder 7, the invention is not particularly limited thereto. For example, any standard synchronizer (FIG. 19 or FIG. 20) can be used, which does not affects the basic operation of this invention.

Although the present invention in its preferred form has specially designed logic 6, the invention is not particularly limited thereto. Any logic which generates interrupt request INT and the output LOAD on the basis of the terminal count TC, can be used, which does not affects the basic operation of this invention. For example, terminal count TC can set S-R flip-flop (set-reset flip-flop), which output is the interrupt request INT, while separate control input ENA can reset the same S-R flip-flop.

Although the calculation of frequency in the preferred form of this invention is performed in an interrupt service routine, the invention is not particularly limited thereto. Instead of using the signal INT as an interrupt request to the computer 10, the signal INT can be used as Direct Memory Access ("DMA") Request signal, in order to transfer data from the additional storage device 4 and the counter storage device 9, directly into the pairs of pregiven locations $A_i$ and $C_i$, respectively, within the memory of the computer 10.

Before the start of the measurement, the desired number of measurement samples is loaded into the DMA Transfer Counter (now shown). Each signal INT initiates the DMA transfer of a content of the additional storage device 4 into the pregiven location $A_1$ within the area of successive pregiven locations $A_{1-n}$ inside the memory, and the DMA transfer of a content of the counter storage device 9 into the pregiven location $C_1$ within the area of successive pregiven locations $C_{1-n}$ inside the memory. After that, the DMA Acknowledge signal will reset signal INT, and DMA Transfer Counter is decremented. The DMA transfers are performed, until the DMA Transfer Counter reaches zero. After that, any of the flowcharts described above can be used for "off-line" calculation of the frequency based on this stored contents into pairs of pregiven locations $A_i$ and $C_i$. Since described application of this invention is not working in the real-time, it can be used as laboratory instrumentation, or frequency recorders.

Although the calculation of frequency in the preferred form of this invention is performed in an interrupt service routine, the invention is not particularly limited thereto. Instead of using the signal INT as an interrupt request to the computer 10, the signal INT can be used as write signal for the memory of the computer 10, in order to transfer data from the additional storage device 4 and the counter storage device 9, directly into the pairs of pregiven locations $A_i$ and $C_i$, respectively, in the memory of the computer 10.

Before the start of the measurement, the desired number of measurement samples is loaded into the Address Counter (not shown). Each signal INT initiates the transfer of a content of the additional storage device 4 into the pregiven location $A_i$ within the area of successive pregiven locations $A_{1-n}$ inside the memory, and the transfer of a content of the counter storage device 9 into the pregiven location $C_i$ within the area of successive pregiven locations $C_{1-n}$ inside the memory. After that, the signal INT is reset, and the Address Counter is decremented. The memory transfers are performed, until the Address Counter reaches zero. After that, any of the flowcharts described above can be used for "off-line" calculation of the frequency based on this stored contents into pairs of pregiven locations $A_i$ and $C_i$. Since described application of this invention is not working in the real-time, it can be used as laboratory instrumentation, or frequency recorders.

It is believed that the extremely wide range frequency measurement method and system of this invention, its structure and operation, will be clearly understood from the preceeding description, and the scope of the invention will be defined in the claims.

What I claim as new is:

1. A frequency measurement apparatus comprising:
 a computer having at least an interrupt input;
 a memory having a plurality of pregiven storage locations;
 a reference clock of predetermined constant frequency ($f_c$);
 an interval timer for counting, in response to said reference clock, and providing a terminal count signal thereto, in response to a content of said interval timer equal to a predetermined content;
 means for the start and stop of said interval timer;
 means for providing a load signal, in response to said terminal count signal;
 means for providing a sampling clock, in response to said terminal count signal;
 means for providing an interrupt request signal, in response to said terminal count signal, wherein said interrupt request signal is coupled to said interrupt input of said computer;
 a synchronizer and signal decoder for receiving at least an input signal of unknown frequency (f), synchronizing input signals with said reference clock, and providing a measured clock of measured frequency ($f_M$), proportional to said unknown frequency (f), according to $f_M = H \cdot f$;
 a pulse counter for counting, in response to said measured clock;
 means for calculating a modulus value ($N_c$) on the basis of a desired sampling time ($T_s$) and said frequency ($f_c$) of the reference clock;
 means for loading said modulus value ($N_c$) into a modulus storage device, before the start of said interval timer;
 said modulus storage device coupled to said interval timer, for storing said modulus value ($N_c$), and reloading said interval timer by said modulus value ($N_c$), in response to said load signal;
 a timer storage device coupled to said interval timer, for capturing the content of said interval timer, in response to said measured clock;
 an additional storage device coupled to said timer storage device, for capturing the content of said timer storage device, in response to said sampling clock;
 a counter storage device coupled to said pulse counter, for capturing the content of said pulse counter, in response to said sampling clock;
 means for reading and storing the content of said counter storage device, into a second pregiven storage location (B) in said memory after the start of said interval timer, and before first interrupt request signal is activated;
 means for reading and storing the content of said additional storage device, into a first pregiven storage location (A) in said memory, in response to said interrupt request signal;
 means for reading and storing the content of said counter storage device, into a third pregiven storage location (C) in said memory, in response to said interrupt request signal;
 means for calculating a pulse difference ($N_P$) as a difference between the content of said second pregiven storage location (B) and the content of said third pregiven storage location (C) in said memory;
 means for calculating a time difference ($N_T$) as a sum of already existing value of time difference ($N_T$), and a difference between said modulus value ($N_C$) and the content of said first pregiven storage location (A) in said memory;
 means for calculating said measured frequency ($f_M$) of the measured clock by determining the quotient of said pulse difference ($N_P$) and said time difference ($N_T$), multiplied with said frequency ($f_C$) of the reference clock;
 means for reading and storing the content of said third pregiven storage location (C) into second pregiven storage location (B) in said memory, after the calculation of said pulse difference ($N_P$); and means for calculating said time difference ($N_T$) as incremented content of said first pregiven storage location (A) in said memory, after the calculation of measured frequency ($f_M$).

2. A wide-range frequency measurement apparatus comprising:

a computer having at least an interrupt input;

a memory having a plurality of pregiven storage locations;

a reference clock of predetermined constant frequency ($f_C$);

an interval timer for counting, in response to said reference clock, and providing a terminal count signal thereto, in response to the content of said interval timer equal to a predetermined content;

means for the start and stop of said interval timer;

means for providing a load signal, in response to said terminal count signal;

means for providing a sampling clock, in response to said terminal count signal;

means for providing an interrupt request signal, in response to said terminal count signal, wherein said interrupt request signal is coupled to said interrupt input of said computer;

a synchronizer and signal decoder for receiving at least an input signal of unknown frequency (f), synchronizing input signals with said reference clock, and providing the measured clock of measured frequency ($f_M$), proportional to said unknown frequency (f), according to $f_M = H \cdot f$;

a pulse counter for counting, in response to said measured clock;

means for calculating a modulus value ($N_C$) on the basis of a desired sampling time ($T_S$) and said frequency ($f_C$) of the reference clock;

means for loading said modulus value ($N_C$) into a modulus storage device, before the start of said interval timer;

said modulus storage device coupled to said interval timer, for storing said modulus value ($N_C$), and reloading said interval timer by said modulus value ($N_C$), in response to said load signal;

a timer storage device coupled to said interval timer, for capturing the content of said interval timer, in response to said measured clock;

an additional storage device coupled to said timer storage device, for capturing the content of said timer storage device, in response to said sampling clock;

a counter storage device coupled to said pulse counter, for capturing the content of said pulse counter, in response to said sampling clock;

means for inializing measured frequency ($f_M$) to zero, before the start of said interval timer;

means for initializing a flag (FINDA) to first predetermined value, before the start of said interval timer;

means for reading and storing the content of said counter storage device, into a second pregiven storage location (B) in said memory, after the start of said interval timer, and before first interrupt request signal is activated;

means for reading and storing the content of said additional storage device, into a first pregiven storage location (A) in said memory, in response to said interrupt request signal;

means for reading and storing the content of said counter storage device, into a third pregiven storage location (C) in said memory, in response to said interrupt request signal;

means for calculating a pulse difference ($N_P$) as a difference between the content of said second pregiven storage location (B) and the content of said third pregiven storage location (C) in said memory;

means for comparing said pulse difference ($N_P$) with zero;

means for comparing said flag (FINDA) with said first predetermined value;

means for calculating a time difference ($N_T$), in response to said pulse difference ($N_P$) other than zero, and said flag (FINDA) equal to the second predetermined value, wherein said time difference ($N_T$) is calculated as a sum of already existing value of time difference ($N_T$), and a difference between said modulus value ($N_C$) and the content of said first pregiven storage location (A) in said memory;

means for calculating said measured frequency ($f_M$) of the measured clock, in response to said pulse difference ($N_P$) other than zero, and said flag (FINDA) equal to said second predetermined value, wherein said measured frequency ($f_M$) of the measured clock is calculated as the quotient of said pulse difference ($N_P$) and said time difference ($N_T$), multiplied with said frequency ($f_C$) of the reference clock;

means for reading and storing the content of said third pregiven storage location (C) and into said second pregiven storage location (B) in said memory, in response to said pulse difference ($N_P$) other than zero;

means for calculating said time difference ($N_T$), in response to said pulse difference ($N_P$) other than zero, after the calculation of measured frequency ($f_M$), wherein said time difference ($N_T$) is calculated as incremented content of said first pregiven storage location (A) in said memory;

means for initializing said flag (FINDA) to said second predetermined value, in response to said pulse difference ($N_P$) other than zero, and said flag (FINDA) equal to said first predetermined value; and means for initializing measured frequency ($f_M$) to zero, and initializing said flag (FINDA) to said first predetermined value, in response to said pulse difference ($N_P$) equal to zero and said flag (FINDA) equal to said second predetermined value.

3. An extremely wide range frequency measurement apparatus comprising:

a computer having at least an interrupt input;

a memory having a plurality of pregiven storage locations;

a reference clock of predetermined constant frequency ($f_C$);

an interval timer for counting, in response to said reference clock, and providing a terminal count signal thereto, in response to the content of said interval timer equal to a predetermined content;

means for the start and stop of said interval timer;

means for providing a load signal, in response to said terminal count signal;

means for providing a sampling clock, in response to said terminal count signal;

means for providing an interrupt request signal, in response to said terminal count signal, wherein said interrupt request signal is coupled to said interrupt input of said computer;

a synchronizer and signal decoder for receiving at least an input signal of unknown frequency (f), synchronizing input signals with said reference clock, and providing a measured clock of measured frequency ($f_M$), proportional to said unknown frequency (f), according to $f_M = H \cdot f$;

a pulse counter for counting, in response to said measured clock;

means for calculating a modulus value ($N_C$) on the basis of a desired sampling time ($T_S$) and said frequency ($f_C$) of the reference clock;

means for loading said modulus value ($N_C$) into a modulus storage device, before the start of said interval timer;

said modulus storage device coupled to said interval timer, for storing said modulus value ($N_C$), and reloading said interval timer by said modulus value ($N_C$), in response to said load signal;

a timer storage device coupled to said interval timer, for capturing the content of said interval timer, in response to said measured clock;

an additional storage device coupled to said timer storage device, for capturing the content of said timer storage device, in response to said sampling clock;

a counter storage device coupled to said pulse counter, for capturing the content of said pulse counter, in response to said sampling clock;

means for initializing measured frequency ($f_M$) to zero, before the start of said interval timer;

means for initializing a flag (FINDA) to first predetermined value, before the start of said interval timer;

means for reading and storing the content of said counter storage device, into a second pregiven storage location (B) in said memory, after the start of said interval timer, and before first interrupt request signal is activated;

means for reading and storing the content of said additional storage device, into a first pregiven storage location (A) in said memory, in response to said interrupt request signal;

means for reading and storing the content of said counter storage device, into a third pregiven storage location (C) in said memory, in response to said interrupt request signal;

means for calculating a pulse difference ($N_P$) as a difference between the content of said second pregiven storage location (B) and the content of said third pregiven storage location (C) in said memory;

means for comparing said pulse difference ($N_P$) with zero;

means for comparing said flag (FINDA) with said first predetermined value;

means for calculating a time difference ($N_T$), in response to said pulse difference ($N_P$) other than zero, and said flag (FINDA) equal to a second predetermined value, wherein said time difference ($N_T$) is calculated as a sum of already existing value of time difference ($N_T$), and a difference between said modulus value ($N_C$) and the content of said first pregiven storage location (A) in said memory;

means for calculating said measured frequency ($f_M$) of the measured clock, in response to said pulse difference ($N_P$) other than zero, and said flag (FINDA) equal to said second predetermined value, wherein said measured frequency ($f_M$) of the measured clock is calculated as te quotient of said pulse difference ($N_P$) and said time difference ($N_T$), multiplied with said frequency ($f_C$) of the reference clock;

means for reading and storing the content of said third pregiven storage location (C) and into said second pregiven storage location (B) in said memory, in response to said pulse difference ($N_P$) other than zero;

means for calculating said time difference ($N_T$), in response to said pulse difference ($N_P$) other than zero, after the calculation of measured frequency ($f_M$), wherein said time difference ($N_T$) is calculated as incremented content of said first pregiven storage location (A) in said memory;

means for initializing said flag (FINDA) to said second predetermined value, in response to said pulse difference ($N_P$) other than zero, and said flag (FINDA) equal to said first predetermined value;

means for calculating said time difference ($N_T$), in response to said pulse difference ($N_P$) equal to zero, and said flag (FINDA) equal to said second predetermined value, wherein said time difference ($N_T$) is calculated as a sum of already existing value of time difference ($N_T$) and an incremented modulus value ($N_C$);

means for comparing said time difference ($N_T$) with predetermined maximum time difference (max$N_T$), in response to said pulse difference ($N_P$) equal to zero, and said flag (FINDA) equal to said second predetermined value; and means for initializing measured frequency ($f_M$) to zero, and initializing said flag (FINDA) to said first predetermined value, in response to said pulse difference ($N_P$) equal to zero, said flag (FINDA) equal to said second predetermined value, and said time difference ($N_T$) exceeding said predetermined maximum time difference (max$N_T$).

4. The extremely wide range frequency measurement apparatus according to claim 3, further comprising means for calculating a limit frequency ($f_P$), in response to said pulse difference ($N_P$) equal to zero, said flag (FINDA) equal to said second predetermined value, and said time difference ($N_T$) less than said predetermined maximum time difference (max$N_T$), wherein said limit frequency ($f_P$) is calculated as the quotient of said frequency ($f_C$) of said reference clock, and said time difference ($N_T$);

means for comparing said limit frequency ($f_P$) with absolute value of measured frequency ($f_M$); and means for storing value of said limit frequency ($f_P$) into said measured frequency ($f_M$) into said memory, keeping previous sign of said measured frequency ($f_M$), in response to said limit frequency ($f_P$) less than said absolute value of measured frequency ($f_M$).

5. The frequency measurement apparatus according to claim 11, wherein said synchronizer and signal decoder further comprises another input for second input signal, and means for providing an up/down control signal, in response to first and second input signals; and said pulse counter is an up/down counter, wherein up/down direction of counting is controlled by said up/down control signal.

6. The wide-range frequency measurement apparatus according to claim 2, wherein said synchronizer and signal decoder further comprises another input for second input signal, and means for providing an up/down control signal, in response to first and second input signals; and said pulse counter is an up/down counter, wherein up/down direction of counting is controlled by said up/down control signal.

7. The extremely wide-range frequency measurement apparatus according to claim 3, wherein said synchronizer and signal decoder further comprises another input for second input signal, and means for providing the up/down control signal, in response to first and second input signals; and said pulse counter is an up/down counter, wherein up/down direction of counting is controlled by said up/down control signal.

8. The extremely wide-range frequency measurement apparatus according to claim 4, wherein said synchronizer and signal decoder further comprises another input for second input signal, and means for providing the up/down control signal, in response to first and second input signals; and said pulse counter is an up/down counter, wherein up/down direction of counting is controlled by said up/down control signal.

9. N-frequencies measurement apparatus comprising:

a computer having at least an interrupt input;

a memory having a plurality of pregiven storage locations;

a reference clock of predetermined constant frequency ($f_C$);

an interval timer for counting, in response to said reference clock, and providing a terminal count signal thereto, in response to the content of said interval timer equal to the predetermined content;

means for the start and stop of said interval timer;

means for providing a load signal in response to said terminal count signal;

means for providing a sampling clock, in response to said terminal count signal;

means for providing an interrupt request signal, in response to said terminal count signal, wherein said interrupt request signal is coupled to said interrupt input of said computer;

N synchronizers and signal decoders, wherein each synchronizer and signal decoder is receiving at least an input signal of unknown frequency ($f_i$), synchronizing its input signals with said reference clock, and providing measured clock of measured frequency ($f_{Mi}$), proportional to said unknown frequency ($f_i$), according to $f_{Mi} = H_i \cdot f_i$;

N pulse counters ($PC_1, \ldots, PC_N$) for counting, wherein each pulse counter ($PC_i$) is counting in response to said measured clock of measured frequency ($f_{Mi}$);

means for calculating a modulus value ($N_C$) on the basis of a desired sampling time ($T_S$) and said frequency ($f_C$ of the reference clock;

means for loading said modulus value ($N_C$) into a modulus storage device, before the start of said interval timer;

said modulus storage device coupled to said interval timer, for storing said modulus value ($N_C$), and reloading said interval timer by said modulus value ($N_C$), in response to said load signal;

N timer storage devices ($TS_1, \ldots, TS_N$) coupled to said interval timer, wherein each timer storage device $TS_i$) is capturing the content of said interval timer, in response to said measured clock of measured frequency ($f_{Mi}$);

N additional storage devices ($AS_1, \ldots, AS_N$) wherein each additional storage device ($AS_i$) is coupled to said timer storage device ($TS_i$), for capturing the content of said timer storage device ($TS_i$), in response to said sampling clock;

N counter storage devices ($CS_1, \ldots, CS_N$), wherein each counter storage device ($CS_i$) is coupled to said pulse counter ($PC_i$), for capturing the content of said pulse counter ($PC_i$), in response to said sampling clock;

means for reading and storing the content of each said counter storage device ($CS_i$), into a second pregiven storage location ($B_i$) in group (i) of pregiven storage locations in said memory, after the start of said interval timer, and before first interrupt request signal is activated;

means for reading and storing the content of each said additional storage device ($AS_i$), into a first pregiven storage location ($A_i$) in group (i) of pregiven storage locations in said memory, in response to said interrupt request signal;

means for reading and storing the content of each said counter storage device $CS_i$), into a third pregiven storage location ($C_i$) in group (i) of pregiven storage locations in said memory, in response to said interrupt request signal;

means for calculating N pulse differences ($N_{P1}, \ldots, N_{PN}$), wherein each pulse difference ($N_{Pi}$) is calculated as a difference between the content of said second pregiven storage location ($B_i$) and the content of said third pregiven storage locations ($C_i$) in said memory;

means for calculating N time differences ($N_{T1}, \ldots, N_{TN}$), wherein each time difference ($N_{Ti}$) is calculated as a sum of already existing value of time difference ($N_{Ti}$), and a difference between said modulus value ($N_C$) and the content of said pregiven storage location ($A_i$) in said memory;

means for calculating N measured frequencies ($f_{M1}, \ldots, f_{MN}$) of measured clocks, wherein each measured frequency ($f_{Mi}$) of measured clock is calculated by determining the quotient of said pulse difference ($N_{Pi}$) of said time difference ($N_{Ti}$), multiplied with said frequency ($f_C$) of the reference clock;

means for reading and storing N contents of said third pregiven storage locations ($C_1, \ldots, C_N$) into said second pregiven storage locations ($B_1, \ldots, B_N$), wherein the content of each said third pregiven storage location ($C_i$) is stored into said second pregiven storage location ($B_i$) in said memory, after the calculation of pulse difference ($N_{Pi}$); and means for calculating N time differences ($N_{T1}, \ldots, N_{TN}$), wherein each time difference ($N_{Ti}$) is calculated as incremented content of said first pregiven storage location ($A_i$) in said memory, after the calculation of said measured frequency ($f_{Mi}$).

10. A wide-range measurement apparatus for N-frequencies comprising:

a computer having at least an interrupt input;

a memory having a plurality of pregiven storage locations;

a reference clock of predetermined constant frequency ($f_C$);

an interval timer for counting, in response to said reference clock, and providing a terminal count signal thereto, in response to the content of said interval timer equal to a predetermined content;

means for the start and stop of said interval timer;

means for providing a load signal, in response to said terminal count signal;

means for providing a sampling clock, in response to said terminal count signal;

means for providing an interrupt request signal, in response to said terminal count signal, wherein said interrupt request signal is coupled to said interrupt input of said computer;

N synchronizers and signal decoders, wherein each synchronizer and signal decoder receiving at least an input signal of unknown frequency ($f_i$), synchronizing its input signals with said reference clock, and providing measured clock of measured frequency ($f_{Mi}$), proportional to said unknown frequency ($f_i$), according to $f_{Mi}=H_i \cdot f_i$;

N pulse counters ($PC_1, \ldots, PC_N$) for counting, wherein each pulse counter ($PC_i$) is counting in response to said measured clock of measured frequency ($f_{Mi}$);

means for calculating a modulus value ($N_C$) on the basis of a desired sampling time ($T_S$) and said frequency ($f_C$) of the reference clock;

means for loading said modulus value ($N_C$) into a modulus storage device, before the start of said interval timer;

said modulus storage device coupled to said interval timer, for storing said modulus value ($N_C$), and reloading said interval timer by said modulus value ($N_C$), in response to said load signal;

N timer storage devices ($TS_1, \ldots, TS_N$) coupled to said interval timer, wherein each timer storage device ($TS_i$) is capturing the content of said interval timer, in response to said measured clock of measured frequency ($f_{Mi}$);

N additional storage devices ($AS_1, \ldots, AS_N$), wherein each additional storage device ($AS_i$) is coupled to said timer storage device ($TS_i$), for capturing the content of said timer storage device ($TS_i$), in response to said sampling clock;

N counter storage devices ($CS_1, \ldots, CS_N$), wherein each counter storage device ($CS_i$) is coupled to said pulse counter ($PC_i$), for capturing the content of said pulse counter ($PC_i$), in response to said sampling clock;

means for initializing N measured frequencies ($f_{M1}, \ldots, f_{MN}$) to zero, before the start of said interval timer;

means for initializing N flags ($FINDA_1, \ldots, FINDA_N$) to first predetermined value, before the start of said interval timer;

means for reading and storing the content of each said counter storage device ($CS_1$), into a second pregiven storage location ($B_i$) in group (i) of pregiven storage locations in said memory, after the start of said interval timer, and before first interrupt request signal is activated;

means for reading and storing the content of each said additional storage device ($AS_i$), into a first pregiven storage location ($A_i$) in group (i) of pregiven storage locations in said memory, in response to said interrupt request signal;

means for reading and storing the content of each said counter storage device ($CS_1$), into a third pregiven storage location ($C_i$) in group (i) of pregiven storage locations in said memory, in response to said interrupt request signal;

means for calculating N pulse differences ($N_{P1}, \ldots, N_{PN}$), wherein each pulse difference ($N_{Pi}$) is calculated as a difference between the content of said second pregiven storage location ($B_i$) and the content of said third pregiven storage location ($C_i$) in said memory;

means for comparing each pulse difference ($N_{Pi}$) with zero;

means for comparing each flag ($FINDA_i$) with said first predetermined value;

means for calculating N time differences ($N_{T1}, \ldots, N_{TN}$), wherein each time difference ($N_{Ti}$) is calculated in response to said pulse difference ($N_{Pi}$) other than zero, and said flag ($FINDA_i$) equal to a second predetermined value, wherein each time difference ($N_{Ti}$) is calculated as a sum of already existing value of time difference ($N_{Ti}$), and a difference between said modulus value ($N_C$) and the content of said first pregiven storage location ($A_i$) in said memory;

means for calculating N measured frequencies ($f_{M1}, \ldots, f_{MN}$) of measured clocks, wherein each measured frequency ($f_{Mi}$) of measured clock is calculated in response to said pulse difference ($N_{Pi}$) other than zero, and said flag ($FINDA_i$) equal to said second predetermined value, wherein each frequency ($f_{Mi}$) of measured clock is calculated by determining the quotient of said pulse difference ($N_{Pi}$) and said time difference ($N_{Ti}$), multiplied with said frequency ($f_C$) of the reference clock;

means for reading and storing N contents of said third pregiven storage locations ($C_1, \ldots, C_N$) into said second pregiven storage locations ($B_1, \ldots, B_N$), wherein the content of each said third pregiven storage location ($C_i$) is stored into said second pregiven storage location ($B_i$) in said memory, in response to said pulse difference ($N_{Pi}$) other than zero;

means for calculating N time differences ($N_{T1}, \ldots, N_{TN}$), wherein each time difference ($N_{Ti}$) is calculated as incremented content of said first pregiven storage location ($A_i$) in said memory, in response to said pulse difference ($N_{Pi}$) other than zero, after the calculation of frequency ($f_{Mi}$);

means for initializing each flag ($FINDA_i$) to said second predetermined value, in response to said pulse difference ($N_{Pi}$) other than zero, and said flag ($FINDA_i$) equal to said first predetermined value; and means for initializing each measured frequency ($f_{Mi}$) to zero, and initializing said flag ($FINDA_i$) to said first predetermined value, in response to said pulse difference ($N_{Pi}$) equal to zero and said flag ($FINDA_i$) equal to said second predetermined value.

11. An extremely wide range measurement apparatus for N-frequencies comprising:

a computer having at least an interrupt input;

a memory having a plurality of pregiven storage locations;

a reference clock of predetermined constant frequency ($f_C$);

an interval timer for counting, in response to said reference clock, and providing a terminal count signal thereto, in response to the content of said interval timer equal to a predetermined content;

means for the start and stop of said interval timer;

means for providing a load signal, in response to said terminal count signal;

means for providing a sampling clock, in response to said terminal count signal;

means for providing an interrupt request signal, in response to said terminal count signal, wherein said interrupt request signal is coupled to said interrupt input of said computer;

N synchronizers and signal decoders, each synchronizer and signal decoder receiving at least an input signal of unknown frequency ($f_i$), synchronizing its input signals with said reference clock, and providing measured clock of measured frequency ($f_{Mi}$), proportional to said unknown frequency ($f_i$), according to $f_{Mi} = H_i \cdot f_i$;

N pulse counters ($PC_1, \ldots, PC_N$) for counting, wherein each pulse counter ($PC_i$) is counting in response to said measured clock of measured frequency ($f_{Mi}$);

means for calculating a modulus value ($N_C$) on the basis of a desired sampling time ($T_s$) and said frequency ($f_C$) of the reference clock;

means for loading said modulus value ($N_C$) into a modulus storage device, before the start of said interval timer;

said modulus storage device coupled to said interval timer, for storing said modulus value ($N_C$), and reloading said interval timer by said modulus value ($N_C$), in response to said load signal;

N timer storage devices ($TS_1, \ldots, TS_N$) coupled to said interval timer, wherein each timer storage device ($TS_i$) is capturing the content of said interval timer, in response to said measured clock of measured frequency ($f_{Mi}$);

N additional storage devices ($AS_1, \ldots, AS_N$), wherein each additional storage device ($AS_i$) is coupled to said timer storage device ($TS_i$), for capturing the content of said timer storage device ($TS_i$), in response to said sampling clock;

N counter storage devices ($CS_1, \ldots, CS_N$), wherein each counter storage device ($CS_i$) is coupled to said pulse counter ($PC_i$), for capturing the content of said pulse counter ($PC_i$), in response to said sampling clock;

means for initializing N measured frequencies ($f_{M1}, \ldots, f_{MN}$) to zero, before the start of said interval timer;

means for initializing N flags ($FINDA_1, \ldots, FINDA_N$) to first predetermined value, before the start of said interval timer;

means for reading and storing the content of each said counter storage device ($CS_i$), into a second pregiven storage location ($B_i$) in group (i) of pregiven storage locations in said memory, after the start of said interval timer, and before first interrupt request signal is activated;

means for reading and storing the content of each said additional storage device ($AS_i$), into a first pregiven storage location ($A_i$) in group (i) of pregiven storage locations in said memory, in response to said interrupt request signal;

means for reading and storing the content of each said counter storage device ($CS_i$), into a third pregiven storage location ($C_i$) in group (i) of pregiven storage locations in said memory, in response to said interrupt request signal;

means for calculating N pulse differences ($N_{P1}, \ldots, N_{PN}$), wherein each pulse difference ($N_{Pi}$) is calculated as a difference between the content of said second pregiven storage location ($B_i$) and the content of said third pregiven storage location ($C_i$) in said memory;

means for comparing each pulse difference ($N_{Pi}$) with zero;

means for comparing each flag ($FINDA_i$) with said first predetermined value;

means for calculating N time differences ($N_{T1}, \ldots, N_{TN}$), wherein each time difference ($N_{Ti}$) is calculated in response to said pulse difference ($N_{Pi}$) other than zero, and said flag ($FINDA_1$) equal to a second predetermined value, wherein each time difference ($N_{Ti}$) is calculated as a sum of already existing value of time difference ($N_{Ti}$), and a difference between said modulus value ($N_C$) and the content of said first pregiven storage location ($A_i$) in said memory;

means for calculating N measured frequencies ($f_{M1}, \ldots, f_{MN}$) of measured clocks wherein each measured frequency ($f_{Mi}$) of measured clock is calculated in response to said pulse difference ($N_{Pi}$) other than zero, and said flag ($FINDA_i$) equal to said second predetermined value, wherein each frequency ($f_{Mi}$) of measured clock is calculated by determining the quotient of said pulse difference ($N_{Pi}$) and said time difference ($N_{Ti}$), multiplied with said frequency ($f_C$) of the reference clock;

means for reading and storing N contents of said third pregiven storage locations ($C_1, \ldots, C_N$) into said second pregiven storage locations ($B_1, \ldots, B_N$), wherein the content of each said third pregiven storage location ($C_i$) is stored into said second pregiven storage location ($B_i$) in said memory, in response to said pulse difference ($N_{Pi}$) other than zero;

means for calculating N time differences ($N_{T1}, \ldots, N_{TN}$), wherein each time difference ($N_{Ti}$) is calculated as incremented content of said first pregiven storage location ($A_i$) in said memory, in response to said pulse difference ($N_{Pi}$) other than zero, after the calculation of frequency ($f_{Mi}$);

means for initializing each flag ($FINDA_i$) to said second predetermined value, in response to said pulse difference $N_{Pi}$ other than zero, and said flag ($FINDA_i$) equal to said first predetermined value;

means for calculating N time differences ($N_{T1}, \ldots, N_{TN}$) wherein each time difference ($N_{Ti}$), is calculated in response to said pulse difference ($N_{Pi}$) equal to zero, and said flag ($FINDA_i$) equal to said second predetermined value, wherein said time difference ($N_{Ti}$) is calculated as a sum of already existing value of time difference ($N_{Ti}$) and an incremented modulus value ($N_C$);

means for comparing each time difference ($N_{Ti}$) with predetermined maximum time difference ($maxN_{Ti}$), in response to said pulse difference ($N_{Pi}$) equal to zero, and said flag ($FINDA_1$) equal to said second predetermined value; and means for initializing each measured frequency ($f_{Mi}$) to zero, and initializing said flag ($FINDA_i$) to said first predetermined value, in response to said pulse difference ($N_{Pi}$) equal to zero, said flag ($FINDA_i$) equal to said second predetermined value, and said time difference ($N_{Ti}$) exceeding said predetermined maximum time difference ($maxN_{Ti}$).

12. The extremely wide range frequency measurement apparatus according to claim 11, further comprising means for calculating a limit frequency ($f_{Pi}$), in response to said pulse difference ($N_{Pi}$) equal to zero, said flag ($FINDA_i$) equal to said second predetermined value, and said time difference ($N_{Ti}$) less than said predetermined maximum time difference ($maxN_{Ti}$), wherein said limit frequency ($f_{Pi}$) is calculated as the quotient of said frequency ($f_C$) of said reference clock, and said time difference ($N_{Ti}$);

means for comparing said limit frequency ($f_{Pi}$) with absolute value of measured frequency ($f_{Mi}$); and means for storing value of said limit frequency ($f_{Pi}$) into said measured frequency ($f_{Mi}$) in said memory, keeping the previous sign of said measured frequency ($f_{Mi}$), in response to said limit frequency ($f_{Pi}$) less than said absolute value of measured frequency ($f_{Mi}$).

13. N-frequency measurement apparatus according to claim 9, wherein each said synchronizer and signal decoder further comprises another input for second input signal, and means for providing the up/down control signal, in response to first and second input signals; and each said pulse counter ($PC_i$) is an up/down counter, wherein up/down direction of counting is controlled by said up/down control signal.

14. The wide-range measurement apparatus for N-frequencies, according to claim 10, wherein each said synchronizer and signal decoder further comprises another input for second input signal, and means for providing the up/down control signal, in response to first and second input signals; and 'each said pulse counter ($PC_i$) is an up/down counter, wherein up/down direction of counting is controlled by said up/down control signal.

15. The extremely wide-range measurement apparatus for N-frequencies, according to claim 11, wherein each said synchronizer and signal decoder further comprises another input for second input signal, and means for providing the up/down control signal, in response to first and second input signals; and each said pulse counter ($PC_i$) is an up/down counter, wherein up/down direction of counting is controlled by said up/down control signal.

16. The extremely wide-range measurement apparatus for N-frequencies, according to claim 12, wherein each said synchronizer and signal decoder further comprises another input for second input signal, and means for providing the up/down control signal, in response to first and second input signals; and each said pulse counter ($PC_i$) is an up/down counter, wherein up/down direction of counting is controlled by said up/down control signal.

* * * * *